(12) United States Patent
Lin

(10) Patent No.: US 7,087,466 B1
(45) Date of Patent: *Aug. 8, 2006

(54) METHOD OF MAKING A SEMICONDUCTOR CHIP ASSEMBLY WITH A SOLDER-ATTACHED GROUND PLANE

(75) Inventor: Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/896,617

(22) Filed: Jul. 22, 2004

Related U.S. Application Data

(63) Continuation of application No. 10/894,593, filed on Jul. 20, 2004, which is a continuation-in-part of application No. 10/866,393, filed on Jun. 11, 2004.

(51) Int. Cl.
*H10L 21/00* (2006.01)
(52) U.S. Cl. ...................................... 438/118
(58) Field of Classification Search ............... 438/615; 257/691
See application file for complete search history.

(56) References Cited

U.S. PATENT DOCUMENTS

| | | | |
|---|---|---|---|
| 4,020,430 A | 4/1977 | Vander Heyden ............ 333/79 |
| 5,040,999 A | 8/1991 | Collier ...................... 439/108 |
| 5,089,929 A | 2/1992 | Hilland ....................... 361/111 |
| 5,172,301 A | 12/1992 | Schneider ................... 361/386 |
| 5,559,369 A | 9/1996 | Newman ..................... 257/668 |
| 5,722,162 A | 3/1998 | Chou et al. .................. 29/852 |
| 5,751,556 A | 5/1998 | Butler et al. ................ 361/773 |
| 5,860,812 A | 1/1999 | Gugliotti ...................... 439/63 |
| 5,936,837 A | 8/1999 | Scribner et al. ............ 361/704 |
| 6,001,671 A | 12/1999 | Fjelstad ...................... 438/112 |
| 6,025,650 A | 2/2000 | Tsuji et al. ................. 257/786 |
| 6,159,770 A | 12/2000 | Tetaka et al. ............... 438/112 |
| 6,160,309 A | 12/2000 | Le ............................. 257/684 |
| 6,218,728 B1 | 4/2001 | Kimura ...................... 257/693 |
| 6,325,280 B1 | 12/2001 | Murphy ..................... 228/246 |
| 6,404,059 B1 | 6/2002 | Iwasaki et al. ............. 257/774 |
| 6,440,835 B1 | 8/2002 | Lin ............................ 438/611 |
| 6,450,250 B1 | 9/2002 | Guerrero ............... 165/104.33 |
| 6,462,423 B1 | 10/2002 | Akram et al. ............... 257/778 |
| 6,483,718 B1 | 11/2002 | Hashimoto .................. 361/803 |
| 6,492,252 B1 | 12/2002 | Lin et al. ..................... 438/612 |
| 6,504,241 B1 | 1/2003 | Yanagida .................... 257/686 |
| 6,554,643 B1 | 4/2003 | Whiting ...................... 439/571 |
| 6,559,529 B1 | 5/2003 | Torti et al. .................. 257/684 |
| 6,576,539 B1 | 6/2003 | Lin ............................. 438/611 |
| 6,608,259 B1 | 8/2003 | Norskov ...................... 174/261 |
| 6,630,373 B1 | 10/2003 | Punzalan et al. ........... 438/123 |
| 6,653,217 B1 | 11/2003 | Lin ............................ 438/612 |
| 6,670,703 B1 | 12/2003 | Ahn et al. ................... 257/691 |
| 6,687,133 B1 | 2/2004 | Liew et al. ................. 361/760 |
| 2002/0096789 A1 | 7/2002 | Bolken ....................... 257/787 |

OTHER PUBLICATIONS

U.S. Appl. No. 10/714,794, filed Nov. 17, 2003, entitled "Semiconductor Chip Assembly with Embedded Metal Pillar".

*Primary Examiner*—W. David Coleman
*Assistant Examiner*—Jarrett Stark
(74) *Attorney, Agent, or Firm*—David M. Sigmond

(57) ABSTRACT

A method of making a semiconductor chip assembly includes providing a semiconductor chip that includes a conductive pad, electrically connecting a conductive trace that includes a pillar and a routing line to the pad, then inserting the pillar into an opening in a ground plane, and then forming a solder joint that electrically connects the pillar and the ground plane, wherein the ground plane is electrically connected to the pad.

200 Claims, 48 Drawing Sheets

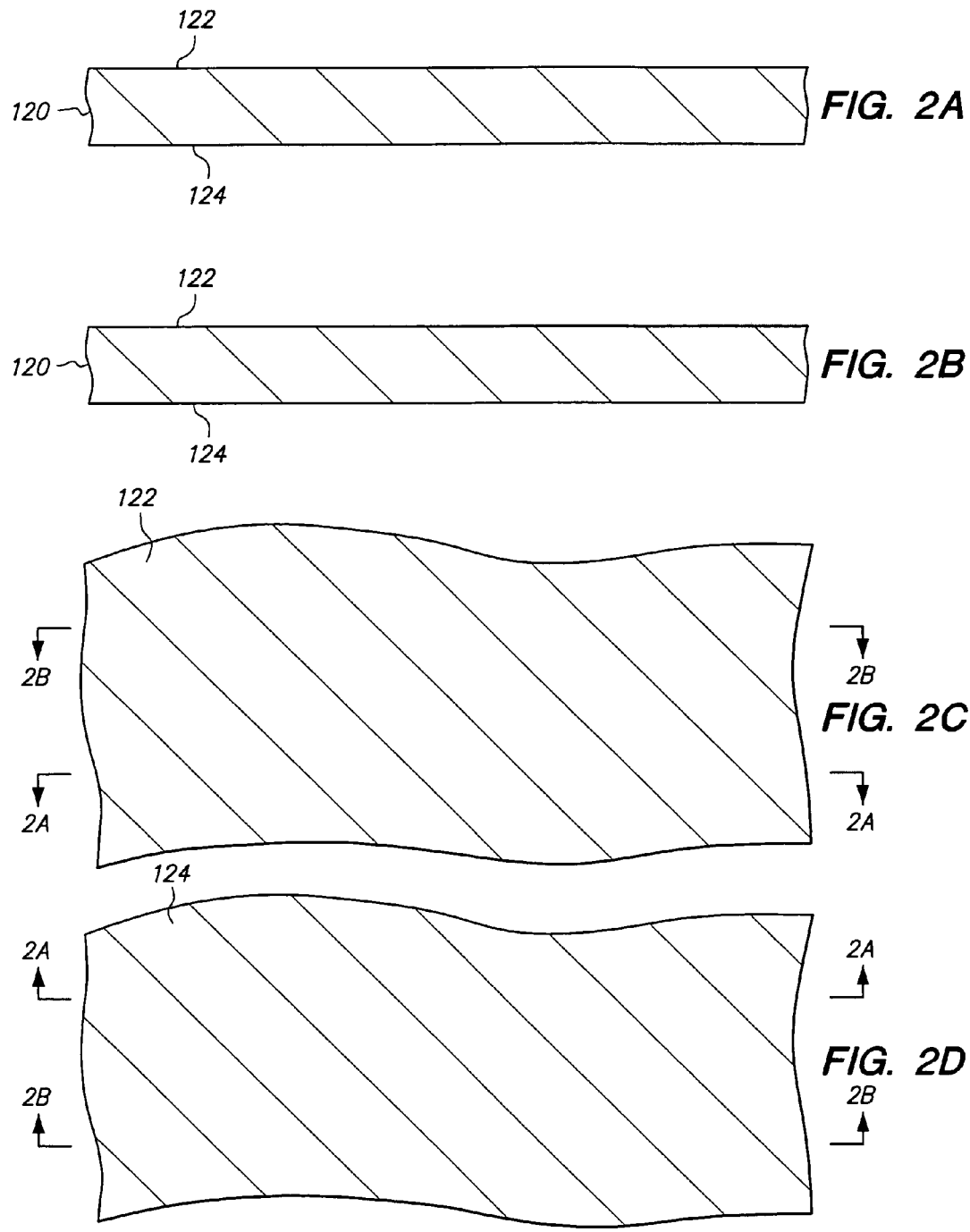

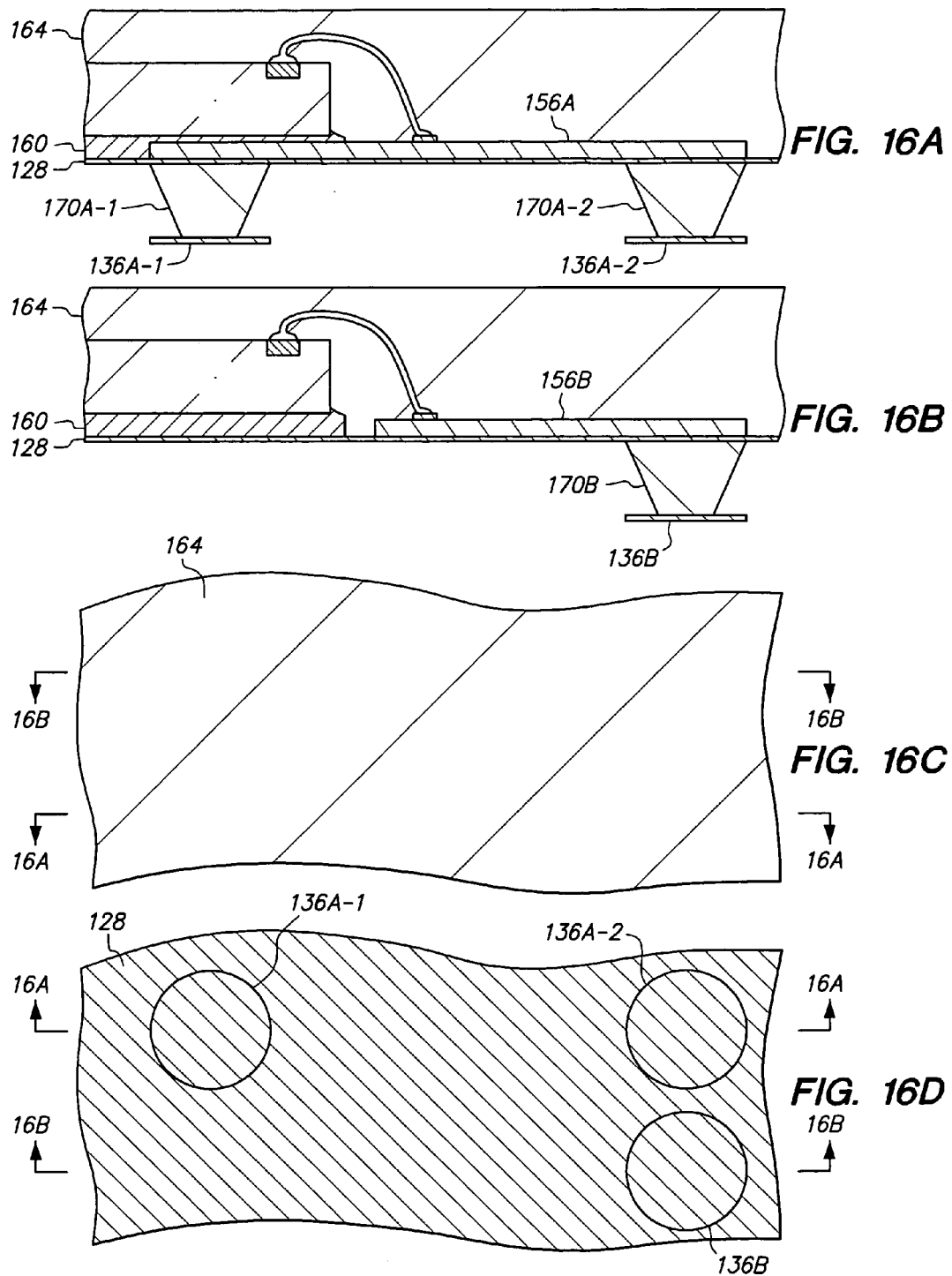

 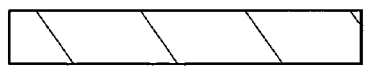
FIG. 21A
FIG. 21B
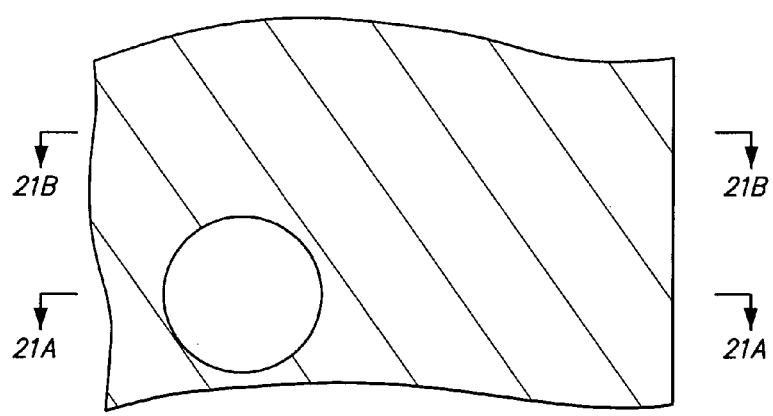
FIG. 21C
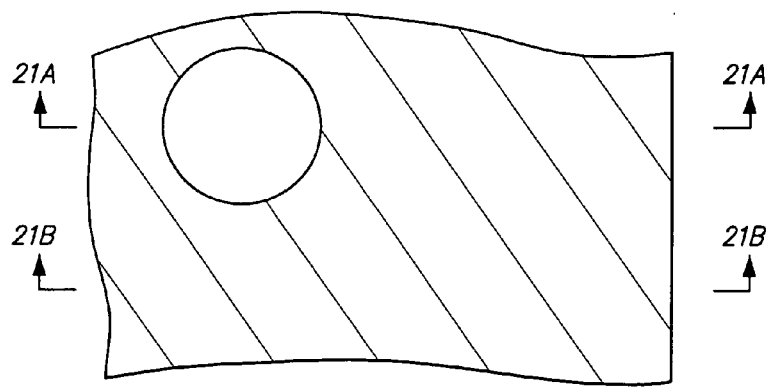
FIG. 21D

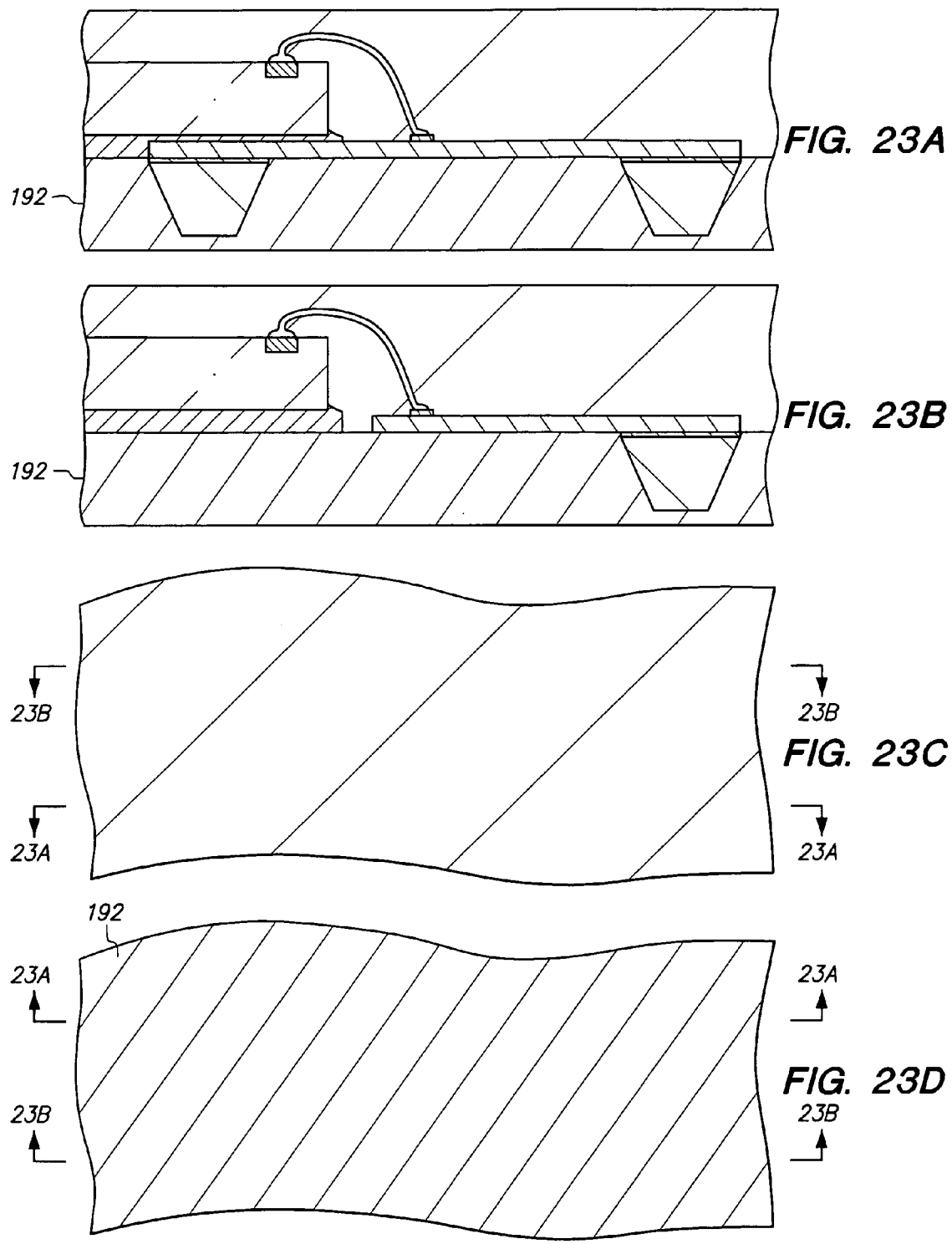

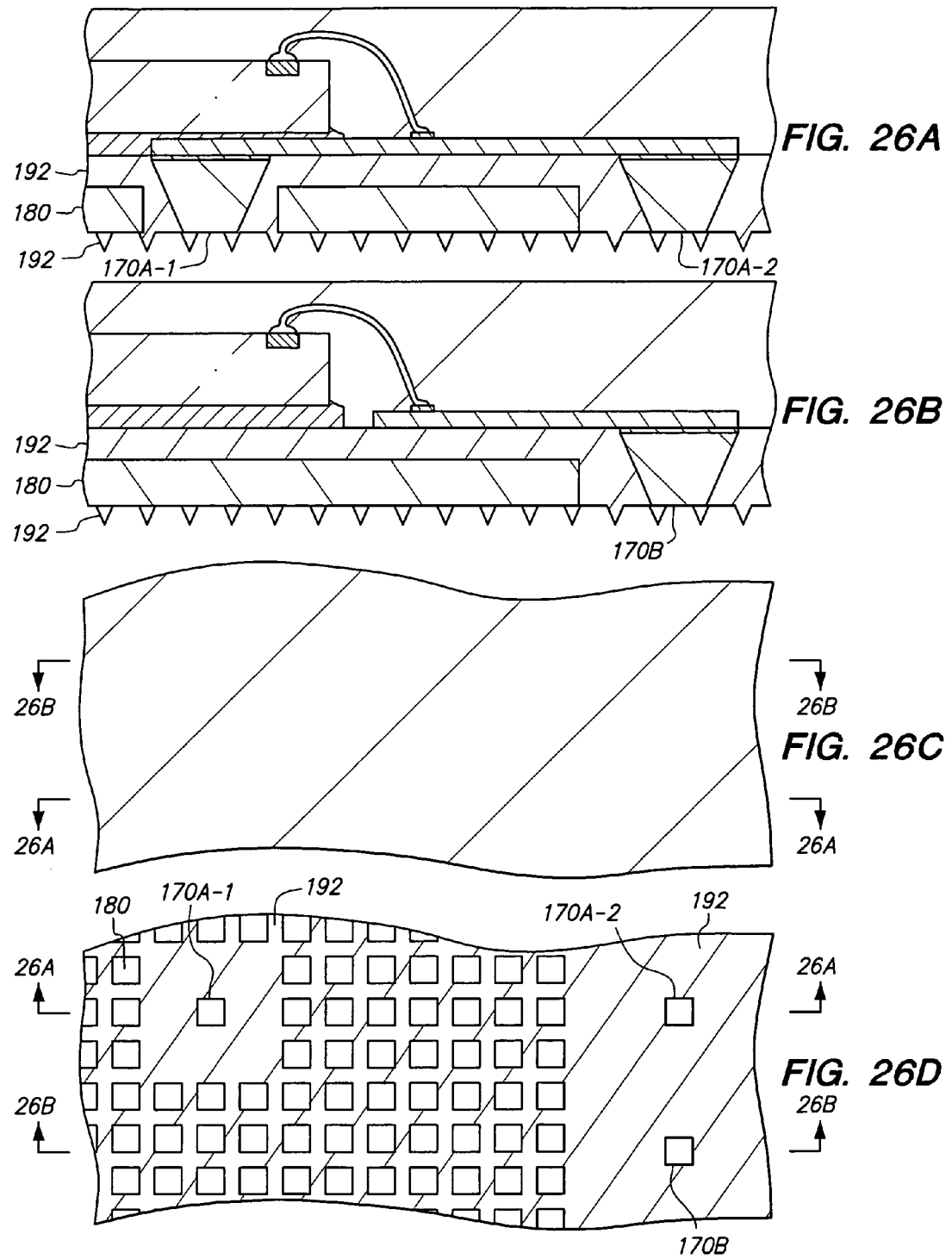

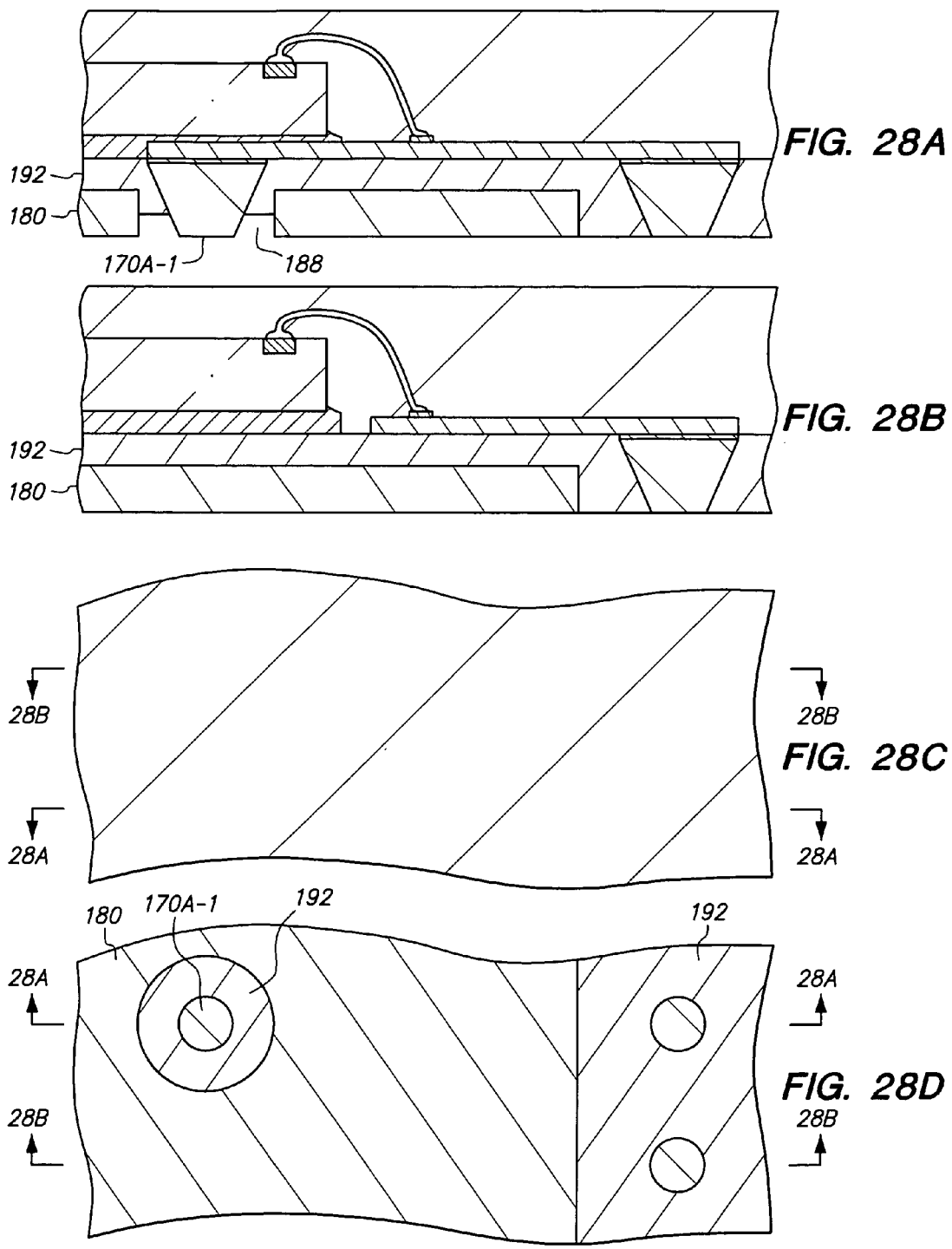

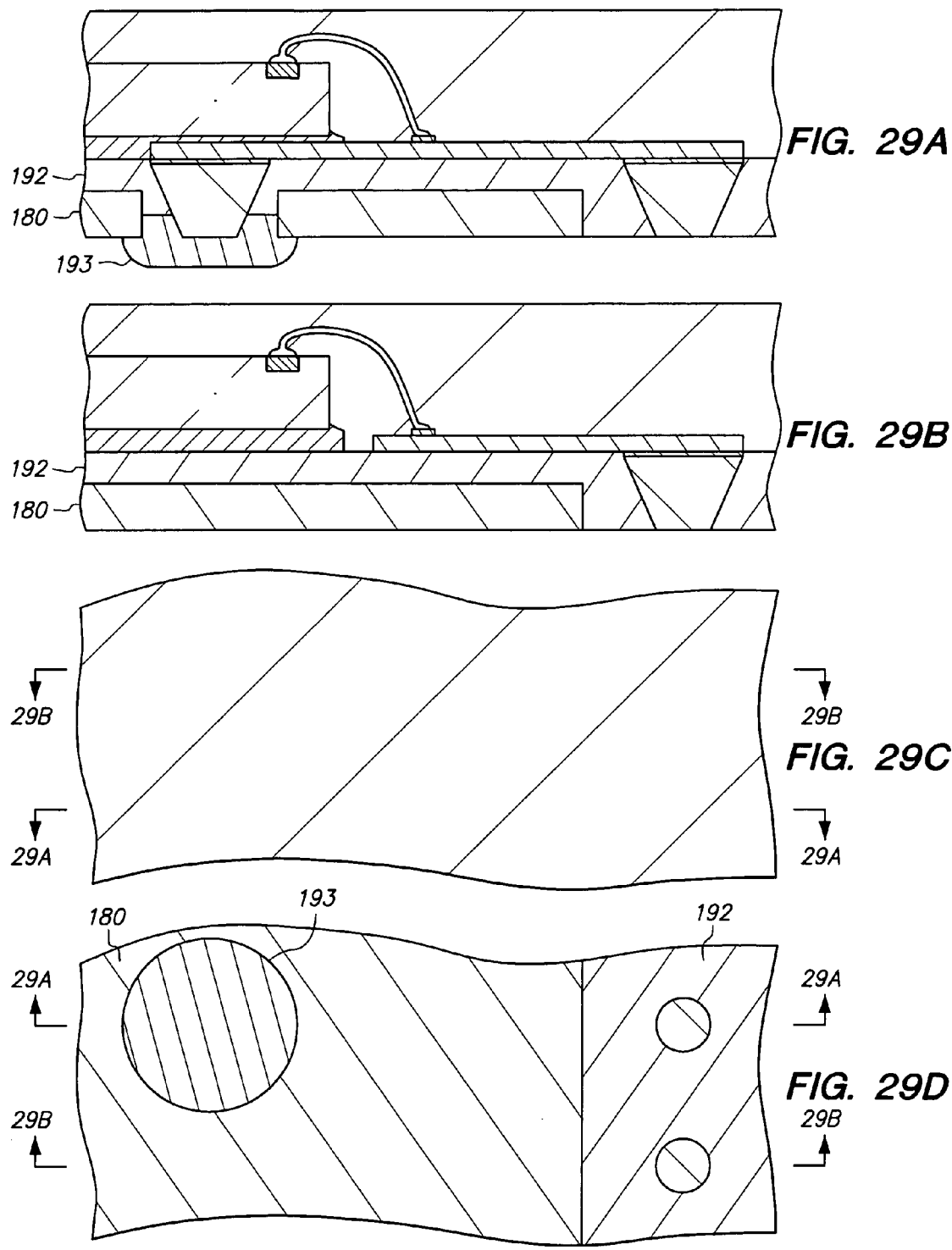

METHOD OF MAKING A SEMICONDUCTOR CHIP ASSEMBLY WITH A SOLDER-ATTACHED GROUND PLANE

CROSS-REFERENCE TO RELATED APPLICATIONS

This application is a continuation of U.S. application Ser. No. 10/894,593 filed on Jul. 20, 2004, which is a continuation-in-part of U.S. application Ser. No. 10/866,393 filed on Jun. 11, 2004, which is incorporated by reference.

BACKGROUND OF THE INVENTION

1. Field of the Invention

The present invention relates to a semiconductor chip assembly, and more particularly to a semiconductor chip assembly with a ground plane and its method of manufacture.

2. Description of the Related Art

Semiconductor chips have power, ground and input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

First-level packages include a chip and a connection technique. First-level packages provide contacts connected to the power, ground and input/output pads to provide power, ground and signal transmission for the chip. First-level packages also provide thermal expansion compatibility with the chip, heat removal from the chip, and low signal transmission delay and electrical noise.

First-level packages include through-hole packages such as the dual in-line package (DIP), single in-line package (SIP), zig-zag in-line package (ZIP) and pin grid array (PGA). First-level packages also include surface mount packages such as the small outline package (SOP), quad flat package (QFP), leadless chip carrier (LCC), plastic leaded chip carrier (PLCC), ball grid array (BGA) and chip scale package (CSP).

First-level packages can be a single-chip module (SCM) or a multi-chip module (MCM), depending on whether the package contains a single chip or multiple chips. Multi-chip modules provide the most circuits in the least amount of space, and are widely used in mainframes, workstations and consumer electronics as well as medical, aerospace, automotive and telecommunication devices.

Second-level packages includes groups of first-level packages along with other components such as capacitors, resistors, inductors, filters, switches, optical devices and radio frequency devices, mounted on a printed circuit board (PCB).

Telecommunication devices require chips to operate at high frequencies such as 30 to 300 GHz. At these frequencies, the signal lines generate electromagnetic and electrostatic fields which can cause cross-talk in adjacent signal lines. Cross-talk can increase signal line impedance, signal transmission delays and impedance mismatching leading to uncontrolled signal reflections. Thus, cross-talk is a critical problem that requires some form of compensation.

Ground planes are common in first-level packages and printed circuit boards to provide a signal return path and increase signal integrity.

Ground planes in first-level packages not only reduce cross-talk, but also reduce interference from external noise, prevent passage of incoming neutrons and increase heat removal from the chip. As a result, ground planes in first-level packages improve high frequency stability, noise immunity, isolation characteristics and heat dissipation. Furthermore, ground planes in first-level packages provide performance integration and hardware miniaturization with short design time and low cost that surpass ground planes in printed circuit boards.

Ground planes in first-level packages have been provided by the flag of the lead frame that supports the chip. However, the chip is typically mechanically attached to the flag by solder, which can run-out from underneath the chip. In addition, the chip is typically electrically connected to the flag by a lengthy wire bond, which can increase inductance and reduce power efficiency.

Ground planes in first-level packages have also been provided by a metal plate that is incorporated into a plastic encapsulant. However, it is difficult to orient and mechanically assemble the chip, the lead frame and the ground plane before the encapsulant is formed to provide a mechanically stable structure.

In view of the various development stages and limitations in currently available semiconductor chip assemblies, there is a need for a semiconductor chip assembly with a ground plane that is cost-effective, reliable, manufacturable, versatile, provides excellent mechanical and electrical properties, and makes advantageous use the particular connection joint technique best suited for a given application.

SUMMARY OF THE INVENTION

An object of the present invention is to provide a semiconductor chip assembly with a ground plane that provides a low cost, high performance, high reliability package.

Another object of the present invention is to provide a convenient, cost-effective method for manufacturing a semiconductor chip assembly with a ground plane.

Generally speaking, the present invention provides a semiconductor chip assembly that includes a semiconductor chip, a conductive trace, a solder joint and a ground plane. The chip includes a conductive pad. The conductive trace extends into an opening in the ground plane, the solder joint contacts and electrically connects the conductive trace and the ground plane, and the ground plane is electrically connected to the pad.

Generally speaking, the present invention also provides a method of making a semiconductor chip assembly that includes providing a semiconductor chip that includes a conductive pad, electrically connecting a conductive trace to the pad, then inserting the conductive trace into an opening in a ground plane, and then forming a solder joint that electrically connects the conductive trace and the ground plane, wherein the ground plane is electrically connected to the pad.

The chip can include first and second opposing major surfaces, and the first surface of the chip can include the pad. The first surface of the chip can face towards the ground plane, or alternatively, the first surface of the chip can face away from the ground plane. The chip can be proximate to the ground plane, and disposed within a periphery of the ground plane.

The conductive trace can contact or be spaced from the ground plane, and be disposed vertically beyond the chip. Furthermore, the conductive trace can include a pillar and a routing line.

The pillar can extend vertically from the routing line, have a conical shape in which its diameter decreases as it extends vertically from the routing line, extend into the opening, contact or be spaced from the ground plane, contact the solder joint in the opening, and be disposed vertically beyond the chip.

The routing line can extend laterally from the pillar, be an essentially flat planar lead, be spaced from the ground plane, and be disposed vertically beyond the chip.

The pillar and the routing line can be adjacent to one another, contact one another, adhere to one another, metallurgically bonded to one another, and not integral with one another.

The solder joint can contact and electrically connect the pillar and the ground plane inside the opening, outside the opening or both. The solder joint can extend into the opening, extend within and outside the opening, be disposed within the opening, or be disposed outside the opening. The solder joint can extend within a periphery of the opening, regardless of whether the solder joint extends into or is disposed outside the opening. The solder joint can be spaced from the routing line, and disposed vertically beyond the chip.

The ground plane can include first and second opposing major surfaces, and the opening can extend between these surfaces. The first and second surfaces of the ground plane can be essentially parallel to the first and second surfaces of the chip. The ground plane can be a single-piece metal plate, and disposed vertically beyond the routing line and the chip.

The opening can extend only through the ground plane, and be disposed vertically beyond the chip.

The pillar and the solder joint can be laterally aligned with the second surface of the ground plane, and the second surface of the ground plane can face away from the routing line and the chip. For instance, the solder joint can be disposed within or outside the opening and laterally aligned with the second surface of the ground plane.

The pillar, the solder joint and the opening can be disposed within a periphery of the chip, and the routing line can extend within and outside the periphery of the chip.

The assembly can include a connection joint that contacts and electrically connects the routing line and the pad. The connection joint can be electroplated metal, electrolessly plated metal, solder, conductive adhesive, a wire bond or a stud bump.

The assembly can include an adhesive that mechanically attaches the chip to the routing line. The adhesive can also contact and be sandwiched between the routing line and the chip.

The assembly can include an encapsulant that contacts and covers the chip. The encapsulant can also cover the pillar, the routing line and the connection joint, contact the routing line and the connection joint and be spaced from the solder joint and the ground plane.

The assembly can include an insulative base that contacts the ground plane. The insulative base can also contact the pillar, the routing line, the solder joint and the encapsulant, be sandwiched between the routing line and the ground plane, extend into the opening and be spaced from the connection joint and the chip.

The assembly can include a metal coating that contacts and covers the solder joint and the ground plane, covers the opening and is exposed. The metal coating can also cover the pillar and be spaced from the routing line.

The assembly can include an electrically conductive path between the ground plane and the pad that includes the conductive trace and the solder joint. The electrically conductive path can include the pillar, the routing line, the connection joint and the solder joint, require the routing line and the connection joint and include the pillar and the solder joint, require the pillar, the routing line and the connection joint and include the solder joint, require the pillar, the routing line, the connection joint and the solder joint, and be devoid of another ground plane.

The assembly can be a first-level package. The assembly can also be devoid of a printed circuit board and another ground plane.

In accordance with another aspect of the invention, the assembly includes a conductive trace that includes a first pillar, a second pillar and a routing line. The connection joint contacts and electrically connects the routing line and the pad. The first pillar extends into the opening, and the solder joint contacts and electrically connects the first pillar and the ground plane and extends into a periphery of the opening. An electrically conductive path between the ground plane and the pad includes the first pillar, the routing line, the connection joint and the solder joint, and the second pillar is electrically connected to the pad and is not in an electrically conductive path between the ground plane and the pad.

In this aspect of the invention, the first and second pillars can be coplanar with and laterally spaced from one another and have essentially identical thicknesses. The routing line can be spaced from the solder joint and the ground plane. The first and second pillars and the solder joint can be laterally aligned with the second surface of the ground plane. In addition, the first pillar, the solder joint and the opening can be disposed within a periphery of the chip, and the second pillar can be disposed outside the periphery of the chip.

In accordance with another aspect of the invention, the assembly includes first and second conductive traces and first and second connection joints. The first conductive trace includes a first pillar and a first routing line, and the second conductive trace includes a second pillar and a second routing line. The chip includes first and second conductive pads. The first connection joint contacts and electrically connects the first routing line and the first pad, and the second connection joint contacts and electrically connects the second routing line and the second pad. The first pillar extends into the opening, and the solder joint contacts and electrically connects the first pillar and the ground plane and extends into a periphery of the opening. An electrically conductive path between the ground plane and the first pad includes the first pillar, the first routing line, the first connection joint and the solder joint, and the second conductive trace is electrically isolated from the first conductive trace and the ground plane.

In this aspect of the invention, the first and second pillars can be coplanar with and laterally spaced from one another and have essentially identical thicknesses, and the first and second routing lines can be coplanar with and laterally spaced from one another and have essentially identical thicknesses. The first and second routing lines can also be spaced from the solder joint and the ground plane. The first and second pillars and the solder joint can be laterally aligned with the second surface of the ground plane. In addition, the first pillar, the solder joint and the opening can be disposed within a periphery of the chip, and the second pillar can be disposed outside the periphery of the chip.

In accordance with another aspect of the invention, the assembly includes first and second chips, first and second conductive traces, first and second connection joints and first and second solder joints. The first chip includes a first conductive pad, and the second chip includes a second conductive pad. The first conductive trace includes a first pillar and a first routing line, and the second conductive trace includes a second pillar and a second routing line. The first connection joint contacts and electrically connects the first routing line and the first pad, and the second connection joint contacts and electrically connects the second routing line and the second pad. The ground plane includes first and second openings. The first pillar extends into the first opening, and the second pillar extends into the second opening. The first solder joint contacts and electrically connects the first pillar and the ground plane and extends into a periphery of the first opening, and the second solder joint contacts and electrically connects the second pillar and the ground plane and extends into a periphery of the second opening. A first electrically conductive path between the ground plane and the first pad includes the first pillar, the first routing line, the first connection joint and the first solder joint and excludes the second conductive trace, the second connection joint and the second solder joint, and a second electrically conductive path between the ground plane and the second pad includes the second pillar, the second routing line, the second connection joint and the second solder joint and excludes the first conductive trace, the first connection joint and the first solder joint.

In this aspect of the invention, the first and second chips can be laterally spaced from one another, the first and second pillars can be coplanar with and laterally spaced from one another and have essentially identical thicknesses, and the first and second routing lines can be coplanar with and laterally spaced from one another and have essentially identical thicknesses. The first and second routing lines can also be spaced from the first and second solder joints and the ground plane. The first and second pillars and the first and second solder joints can be laterally aligned with the second surface of the ground plane. In addition, the first pillar, the first solder joint and the first opening can be disposed within a periphery of the first chip, and the second pillar, the second solder joint and the second opening can disposed within a periphery of the second chip.

The method can include providing the chip, providing the conductive trace that includes the pillar and the routing line, electrically connecting the routing line to the pad, then inserting the pillar into the opening, and then forming the solder joint.

The method can include forming the routing line, then mechanically attaching the chip to the routing line, electrically connecting the routing line to the pad, forming the pillar, then inserting the pillar into the opening, and then forming the solder joint.

The method can include forming the routing line by selectively depositing the routing line on a metal base. For instance, the method can include providing a plating mask on the metal base, wherein the plating mask includes an opening that exposes a portion of the metal base, and then electroplating a metal line on the exposed portion of the metal base through the opening in the plating mask, wherein the routing line includes the metal line.

The method can include providing the metal base with first and second opposing surfaces, wherein the routing line is formed on the first surface of the metal base and an etch mask is formed on the second surface of the metal base.

The method can include forming the metal base, the routing line and the etch mask by sequentially providing a metal plate with first and second opposing surfaces, providing a first plating mask on the second surface of the metal plate, wherein the first plating mask includes an opening that exposes a portion of the second surface of the metal plate, simultaneously electroplating a metal layer on the first surface of the metal plate and the etch mask on the exposed portion of the second surface of the metal plate through the opening in the first plating mask, wherein the metal base includes the metal layer and the metal plate, the metal base includes first and second opposing major surfaces, the metal layer provides the first surface of the metal base, and the metal plate provides the second surface of the metal base, removing the first plating mask, providing a second plating mask on the first surface of metal base and a third plating mask on the second surface of the metal base and the etch mask, wherein the second plating mask includes an opening that exposes a portion of the first surface of the metal base, and the third plating mask covers the etch mask, electroplating a metal line on the exposed portion of the first surface of the metal base through the opening in the third plating mask, wherein the routing line includes the metal line, and removing the second and third plating masks.

The method can include etching the metal base to form the pillar. For instance, the method can include etching the metal base such that an unetched portion of the metal base that contacts the routing line forms the pillar. Likewise, the method can include etching the metal base such that an unetched portion of the metal base defined by the etch mask forms the pillar.

The method can include etching the metal base to form the pillar, thereby etching through the metal base, removing a first portion of the metal base that contacts the routing line without removing a second portion of the metal base that contacts the routing line, reducing but not eliminating contact area between the metal base and the routing line, removing most of the metal base, exposing the routing line, electrically isolating the routing line from other routing lines that contact the metal base, and electrically isolating the pad from other conductive pads of the chip.

The method can include mechanically attaching the chip to the routing line using an adhesive. For instance, the method can include depositing an adhesive on and in contact with the metal base, then placing the chip on the adhesive, and then hardening the adhesive. Likewise, the method can include mechanically attaching the chip to the pillar and the routing line, or alternatively, mechanically attaching the chip to the metal base and the routing line and then forming the pillar.

The method can include forming the connection joint by plating the connection joint on the routing line and the pad. For instance, the connection joint can be electroplated or electrolessly plated on the routing line and the pad. Alternatively, the method can include forming the connection joint by depositing a non-solidified material on the routing line and the pad and then hardening the non-solidified material. For instance, solder paste can be deposited on the routing line and the pad and then hardened by reflowing, or conductive adhesive can be deposited on the routing line and the pad and then hardened by curing. Alternatively, the method can include forming the connection joint by wire bonding or stud bumping.

The method can include forming the encapsulant on and in contact with the chip after mechanically attaching the chip to the routing line. Likewise, the method can include forming the encapsulant on and in contact with the metal base, the routing line and the connection joint. Likewise, the method can include forming the encapsulant by transfer molding.

The method can include depositing the insulative base over the pillar, the routing line and the encapsulant after mechanically attaching the chip to the routing line, then inserting the pillar and the insulative base into the opening, then hardening the insulative base, and then forming the solder joint. The method can include moving the pillar and the ground plane towards one another such that the insulative base contacts the ground plane and enters the opening before the pillar enters the opening. The method can include hardening the insulative base to transform a loose unsecured relation between the pillar and the ground plane into a secure mechanical attachment between the pillar and the ground plane. Likewise, the method can include hardening the insulative base by curing the insulative base.

The method can include removing a portion of the insulative base, thereby increasing exposure of the pillar, after hardening the insulative base and before forming the solder joint. The method can include removing the portion of the insulative base to increase exposure of another pillar that, for instance, is electrically connected to the pad, or alternatively, is electrically connected to another conductive pad of the chip and electrically isolated from the ground plane. The method can include removing the portion of the insulative base by laser ablation, plasma etching, grinding, photolithography or combinations thereof.

The method can include forming the solder joint by depositing solder paste on the pillar and the ground plane, and then hardening the solder paste into the solder joint.

The method can include etching the metal base to form the pillar before or after mechanically attaching the chip to the routing line, before or after forming the connection joint, and before or after forming the encapsulant. Likewise, the method can include forming the connection joint during or after mechanically attaching the chip to the routing line, and before or after forming the encapsulant.

The method can include forming the routing line, then mechanically attaching the chip to the routing line, then forming the encapsulant, then inserting the pillar into the opening, and then forming the solder joint.

The method can include forming the routing line, then mechanically attaching the chip to the routing line, then inserting the pillar into the opening and forming the insulative base, and then forming the solder joint.

The method can include forming the routing line on the metal base, then mechanically attaching the chip to the metal base and the routing line, then etching the metal base to form the pillar, then inserting the pillar into the opening, and then forming is the solder joint.

The method can include forming the routing line on the metal base, then etching the metal base to form the pillar, then mechanically attaching the chip to the pillar and the routing line, then inserting the pillar into the opening, and then forming the solder joint.

The method can include forming the routing line and the etch mask on the metal base, then mechanically attaching the chip to the metal base, the routing line and the etch mask, then etching the metal base using the etch mask to form the pillar, then inserting the pillar into the opening, and then forming the solder joint.

The method can include forming the routing line and the etch mask on the metal base, then etching the metal base using the etch mask to form the pillar, then mechanically attaching the chip to the pillar and the routing line, then inserting the pillar into the opening, and then forming the solder joint.

The method can include forming the routing line on the metal base, then mechanically attaching the chip to the metal base and the routing line, then forming the connection joint, then forming the encapsulant, then etching the metal base to form the pillar, then inserting the pillar into the opening, and then forming the solder joint.

The method can include forming the routing line on the metal base, then mechanically attaching the chip to the metal base and the routing line, then forming the encapsulant, then etching the metal base to form the pillar, then forming the connection joint, then inserting the pillar into the opening, and then forming the solder joint.

The method can include forming the routing line on the metal base, then etching the metal base to form the pillar, then mechanically attaching the chip to the pillar and the routing line, then forming the connection joint, then forming the encapsulant, then inserting the pillar into the opening, and then forming the solder joint.

The method can include forming the routing line on the metal base, then etching the metal base to form the pillar, then mechanically attaching the chip to the pillar and the routing line, then forming the encapsulant, then forming the connection joint, then inserting the pillar into the opening, and then forming the solder joint.

In accordance with another aspect of the present invention, the method includes forming the routing line on the metal base, mechanically attaching the chip to the routing line, electrically connecting the routing line to the pad, etching the metal base, wherein a first unetched portion of the metal base forms a first pillar that contacts the routing line, and a second unetched portion of the metal base forms a second pillar that contacts the routing line, then inserting the first pillar into the opening, and then forming the solder joint, wherein an electrically conductive path between the ground plane and the pad includes the first pillar, the routing line and the solder joint, and the second pillar is electrically connected to the pad and is not in an electrically conductive path between the ground plane and the pad.

In this aspect of the invention, the method can include etching the metal base to remove a first portion of the metal base that contacts the routing line without removing second and third portions of the metal base that contact the routing line, thereby reducing but not eliminating contact area between the metal base and the routing line and exposing the routing line.

In this aspect of the invention, the method can include depositing the insulative base over the first and second pillars and the routing line after mechanically attaching the chip to the routing line, then inserting the first pillar and the insulative base into the opening and contacting the insulative base and the ground plane, then hardening the insulative base, then removing a portion of the insulative base, thereby increasing exposure of the first and second pillars, and then forming the solder joint.

In this aspect of the invention, the method can include providing the metal base, the ground plane and the chip each with first and second opposing major surfaces, then selectively depositing the routing line on the first surface of the metal base, then mechanically attaching the chip to the metal base and the routing line such that the first surface of the metal base faces in a first direction and towards the chip, the second surface of the metal base faces in a second direction and away from the chip, the metal base and the routing line are disposed vertically beyond the chip in the second direction, and the first and second directions are opposite vertical directions, then forming the encapsulant to extend vertically beyond the chip, the metal base and the routing line in the first direction, then etching the metal base such that the first and second pillars extend vertically from the routing line in the second direction and are disposed vertically beyond the chip and the encapsulant in the second direction, then inserting the first pillar into the opening, and then forming the solder joint such that the ground plane is disposed vertically beyond the chip, the encapsulant and the routing line in the second direction.

In accordance with another aspect of the present invention, the method includes forming first and second routing lines on the metal base, mechanically attaching the chip to the first and second routing lines, wherein the chip includes first and second conductive pads, electrically connecting the first routing line to the first pad, electrically connecting the second routing line to the second pad, etching the metal base, wherein a first unetched portion of the metal base forms a first pillar that contacts the first routing line, and a second unetched portion of the metal base forms a second pillar that contacts the second routing line, then inserting the first pillar into the opening, and then forming the solder joint, wherein an electrically conductive path between the ground plane and the pad includes the first pillar, the first routing line and the solder joint, and the second pillar and the second routing line are electrically connected to the second pad and electrically isolated from the ground plane.

In this aspect of the invention, the method can include forming the first and second routing lines by selectively depositing the first and second routing lines on the metal base. For instance, the method can include providing a plating mask on the metal base, wherein the plating mask includes first and second openings that expose first and second portions of the metal base, electroplating first and second metal lines on the exposed first and second portions of the metal base through the first and second openings in the plating mask, wherein the first and second routing lines include the first and second metal lines, and then removing the plating mask.

In this aspect of the invention, the method can include forming a first connection joint that contacts and electrically connects the first routing line and the first pad before inserting the first pillar into the opening, and forming a second connection joint that contacts and electrically connects the second routing line and the second pad before inserting the first pillar into the opening. The method can also include etching the metal base to remove portions of the metal base that contact the first and second routing lines without removing other portions of the metal base that contact the first and second routing lines, thereby reducing but not eliminating contact area between the metal base and the first and second routing lines, exposing the first and second routing lines and electrically isolating the first and second routing lines from one another. The method can also include etching the metal base after mechanically attaching the chip to the first and second routing lines and forming the first and second connection joints, thereby electrically isolating the first and second pads from one another.

In this aspect of the invention, the method can include depositing the insulative base over the first and second pillars and the first and second routing lines after mechanically attaching the chip to the first and second routing lines, then inserting the first pillar and the insulative base into the opening and contacting the insulative base and the ground plane, then hardening the insulative base, then removing a portion of the insulative base, thereby increasing exposure of the first and second pillars, and then forming the solder joint.

In this aspect of the invention, the method can include providing the metal base, the ground plane and the chip each with first and second opposing major surfaces, then selectively depositing the first and second routing lines on the first surface of the metal base, thereby electrically connecting the first and second routing lines, then mechanically attaching the chip to the metal base and the first and second routing lines such that the first surface of the metal base faces in a first direction and towards the chip, the second surface of the metal base faces in a second direction and away from the chip, the metal base and the first and second routing lines are disposed vertically beyond the chip in the second direction, and the first and second directions are opposite vertical directions, then forming the encapsulant to extend vertically beyond the chip, the metal base and the first and second routing lines in the first direction, then etching the metal base such that the first pillar extends vertically from the first routing line in the second direction, the second pillar extends vertically from the second routing line in the second direction, and the first and second pillars are disposed vertically beyond the chip and the encapsulant in the second direction, then inserting the first pillar into the opening, and then forming the solder joint such that the ground plane is disposed vertically beyond the chip, the encapsulant and the first and second routing lines in the second direction.

In accordance with another aspect of the present invention, the method includes forming first and second routing lines on the metal base, mechanically attaching a first chip to the first routing line, wherein the first chip includes a first conductive pad, mechanically attaching a second chip to the second routing line, wherein the second chip includes a second conductive pad, electrically connecting the first routing line to the first pad, electrically connecting the second routing line to the second pad, etching the metal base, wherein a first unetched portion of the metal base forms a first pillar that contacts the first routing line, and a second unetched portion of the metal base forms a second pillar that contacts the second routing line, then inserting the first pillar into a first opening in the ground plane and the second pillar into a second opening in the ground plane, and then forming a first solder joint that electrically connects the first pillar and the ground plane and a second solder joint that electrically connects the second pillar and the ground plane, wherein a first electrically conductive path between the ground plane and the first pad includes the first pillar, the first routing line and the first solder joint and excludes the second pillar, the second routing line and the second solder joint, and a second electrically conductive path between the ground plane and the second pad includes the second pillar, the second routing line and the second solder joint and excludes the first pillar, the first routing line and the first solder joint.

In this aspect of the invention, the method can include forming the first and second routing lines by selectively depositing the first and second routing lines on the metal base. For instance, the method can include providing a plating mask on the metal base, wherein the plating mask includes first and second openings that expose first and second portions of the metal base, electroplating the first and second metal lines on the exposed first and second portions of the metal base through the first and second openings in the plating mask, wherein the first and second routing lines include the first and second metal lines, and then removing the plating mask.

In this aspect of the invention, the method can include forming a first connection joint that contacts and electrically connects the first routing line and the first pad before inserting the first pillar into the first opening, and forming a second connection joint that contacts and electrically connects the second routing line and the second pad before inserting the second pillar into the second opening. The method can also include etching the metal base to remove portions of the metal base that contact the first and second routing lines without removing other portions of the metal base that contact the first and second routing lines, thereby reducing but not eliminating contact area between the metal base and the first and second routing lines, exposing the first and second routing lines and electrically isolating the first and second routing lines from one another. The method can also include etching the metal base after mechanically attaching the first and second chips to the first and second routing lines and forming the first and second connection joints, thereby electrically isolating the first and second pads from one another.

In this aspect of the invention, the method can include forming the encapsulant to contact and cover the first and second chips after mechanically attaching the first and second chips to the first and second routing lines and before inserting the first and second pillars into the first and second openings. The method can also include forming the encapsulant before forming the first and second pillars. The method can also include depositing the insulative base over the first and second pillars and the first and second routing lines after mechanically attaching the first and second chips to the first and second routing lines, then inserting the first pillar and the insulative base into the first opening, inserting the second pillar and the insulative base into the second opening and contacting the insulative base and the ground plane, then hardening the insulative base, then removing a portion of the insulative base, thereby increasing exposure of the first and second pillars, a third pillar that is electrically connected to a third conductive pad of the first chip and electrically isolated from the ground plane and a fourth pillar that is electrically connected to a fourth conductive pad of the second chip and electrically isolated from the ground plane, and then forming the first and second solder joints.

In this aspect of the invention, the method can include providing the metal base, the ground plane and the first and second chips each with first and second opposing major surfaces, then selectively depositing the first and second routing lines on the first surface of the metal base, thereby electrically connecting the first and second routing lines, then mechanically attaching the first and second chips to the metal base and the first and second routing lines such that the first surface of the metal base faces in a first direction and towards the first and second chips, the second surface of the metal base faces in a second direction and away from the first and second chips, the metal base and the first and second routing lines are disposed vertically beyond the first and second chips in the second direction, and the first and second directions are opposite vertical directions, then forming the encapsulant to extend vertically beyond the first and second chips, the metal base and the first and second routing lines in the first direction, then etching the metal base such that the first pillar extends vertically from the first routing line in the second direction, the second pillar extends vertically from the second routing line in the second direction, and the first and second pillars are disposed vertically beyond the first and second chips and the encapsulant in the second direction, then inserting the first and second pillars into the first and second openings, and then forming the first and second solder joints such that the ground plane is disposed vertically beyond the first and second chips, the encapsulant and the first and second routing lines in the second direction.

An advantage of the present invention is that the semiconductor chip assembly can be manufactured conveniently and cost-effectively. Another advantage is that the encapsulant can be provided before the metal base is etched, thereby enhancing mechanical support and protection for the routing line after the pillar is formed. Another advantage is that the pillar can be formed using etching (i.e., subtractively) rather than by electroplating or electroless plating (i.e., additively) which improves uniformity and reduces manufacturing time and cost. Another advantage is that the assembly can include a connection joint made from a wide variety of materials and processes, thereby making advantageous use of mature connection joint technologies in a unique and improved manufacturing approach. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–31A are cross-sectional views showing a method of making a semiconductor chip assembly in accordance with a first embodiment of the present invention;

FIGS. 1B–31B are cross-sectional views corresponding to FIGS. 1A–31A, respectively;

FIGS. 1C–31C are top plan views corresponding to FIGS. 1A–31A and 1B–31B, respectively;

FIGS. 1D–31D are bottom plan views corresponding to FIGS. 1A–31A and 1B–31B, respectively;

DETAILED DESCRIPTION OF THE PREFERRED EMBODIMENTS

Figure 1A:
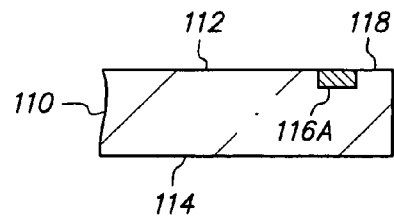
Figure 1B:
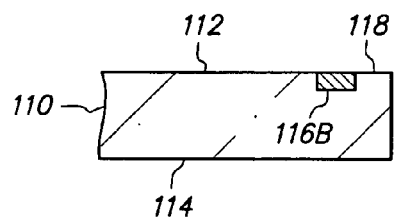
Figure 1C:
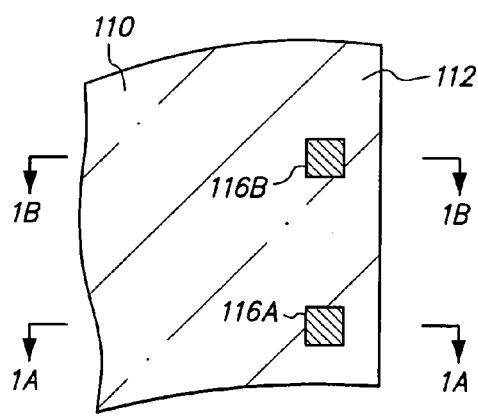
Figure 1D:
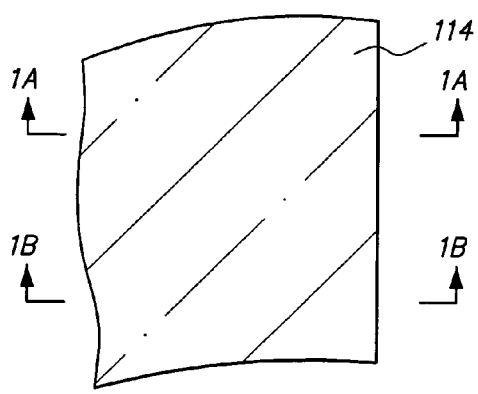
Figure 3A:
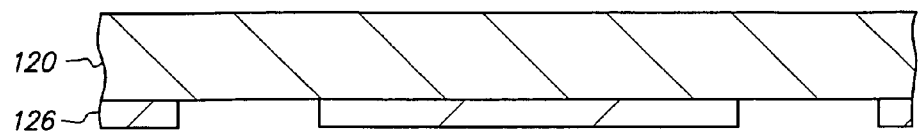
Figure 3B:
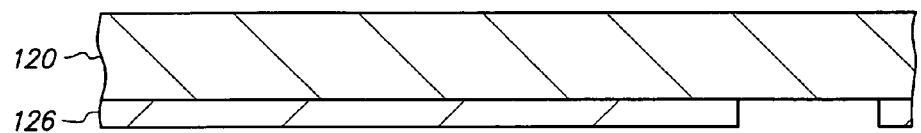
Figure 3C:
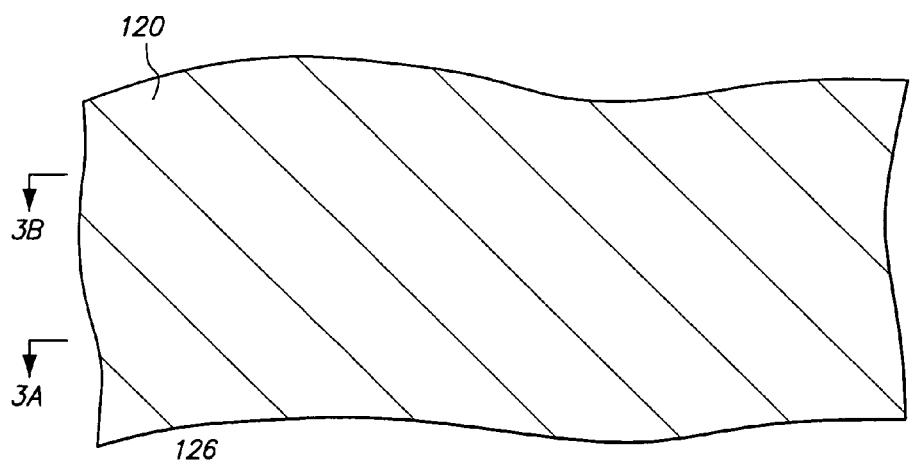
Figure 3D:
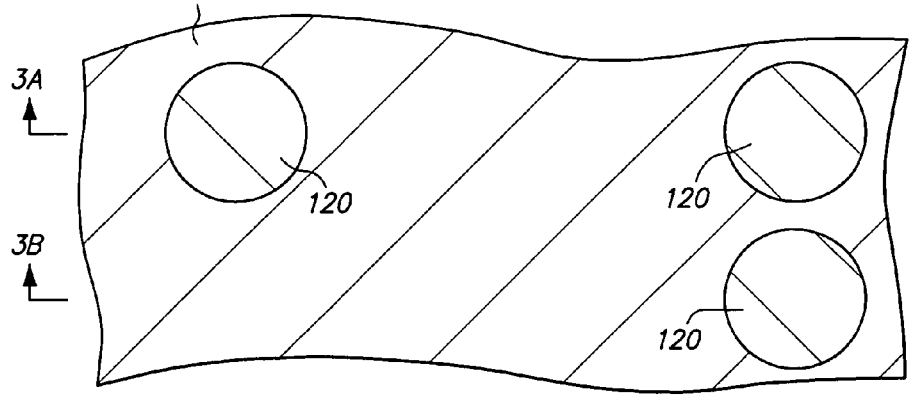
Figure 4A:
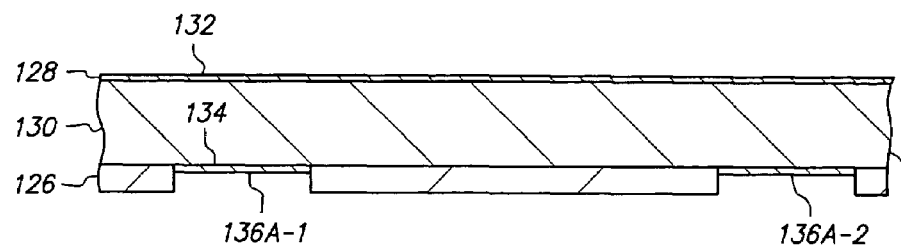
Figure 4B:
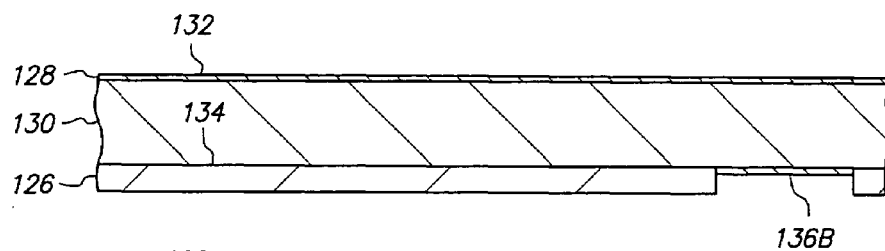
Figure 4C:
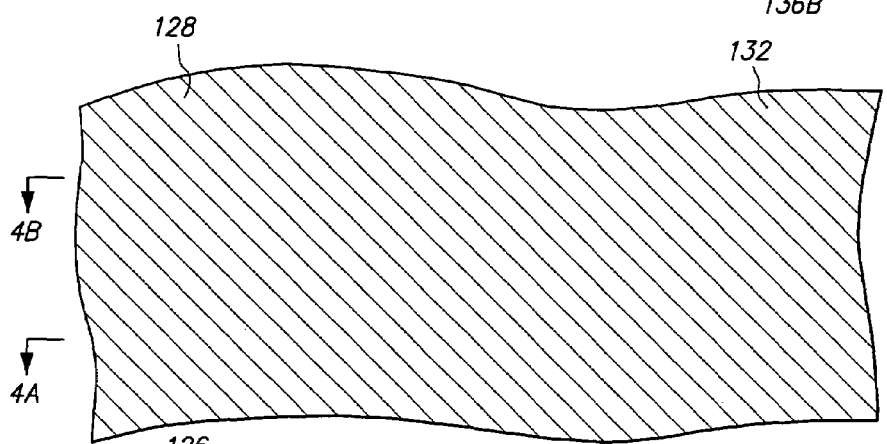
Figure 4D:
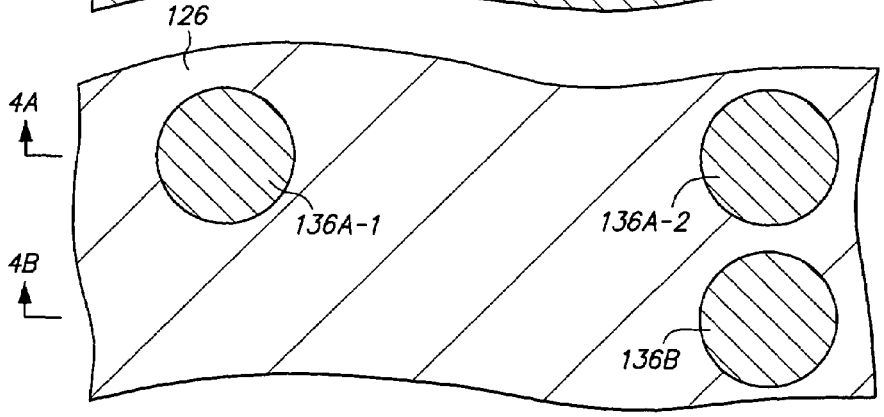
Figure 5A:
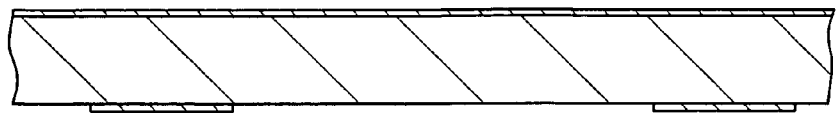
Figure 5B:
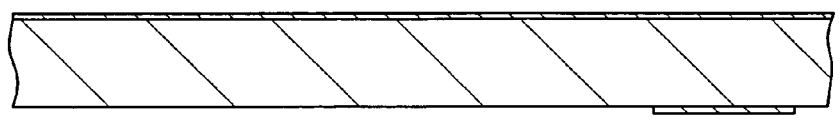
Figure 5C:
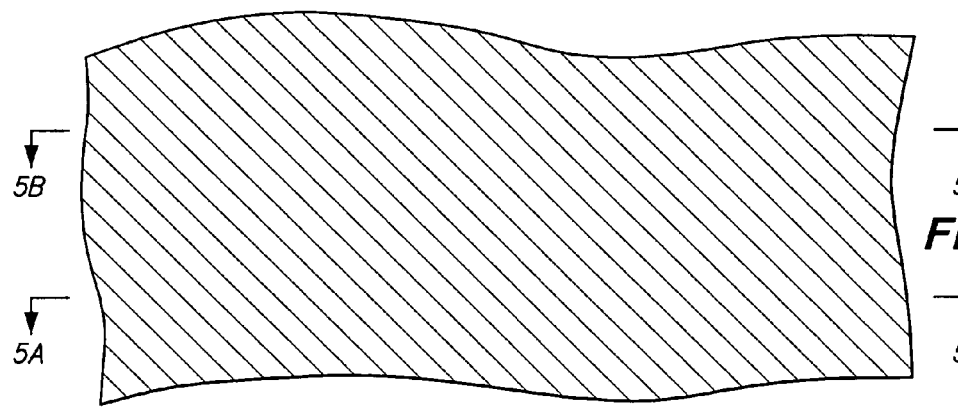
Figure 5D:
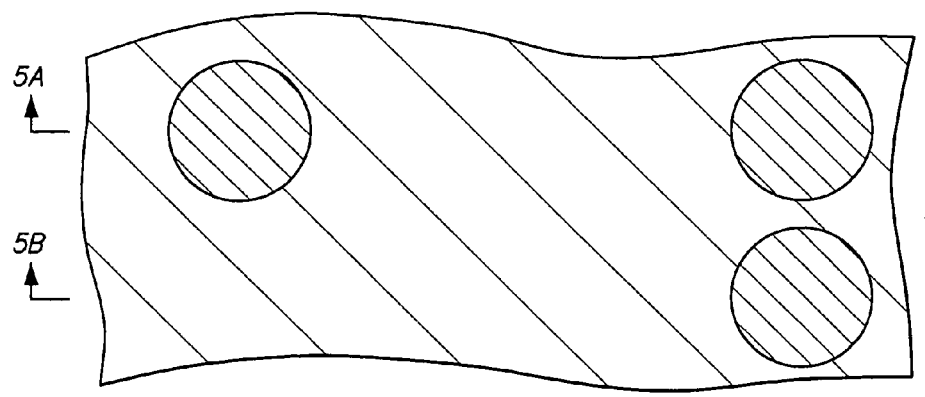
Figure 6A:
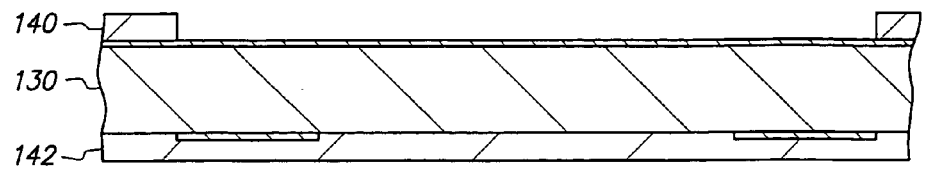
Figure 6B:
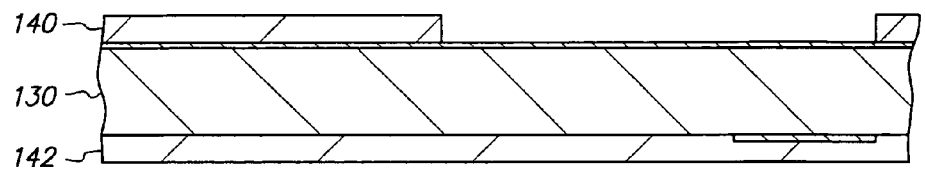
Figure 6C:
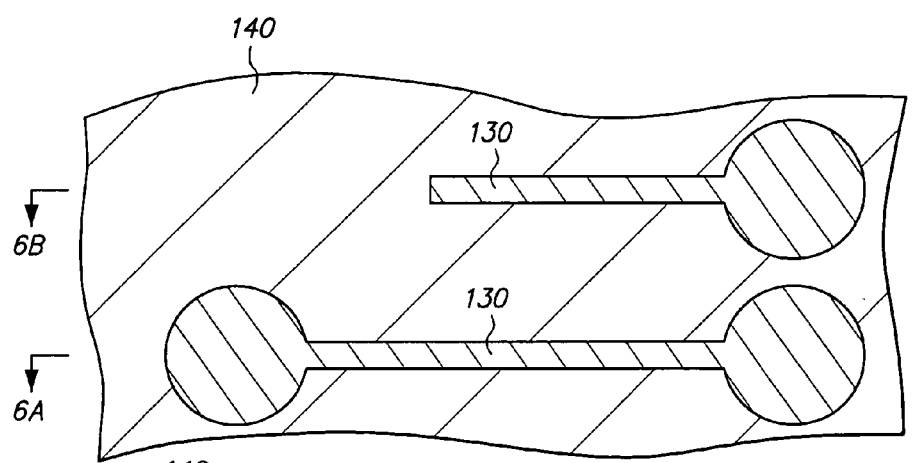
Figure 6D:
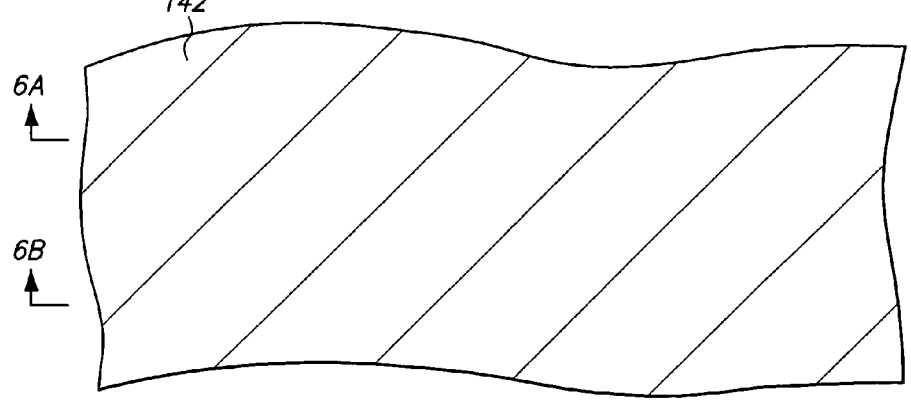
Figure 7A:
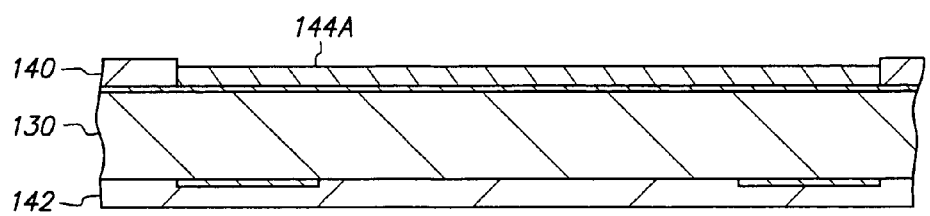
Figure 7B:
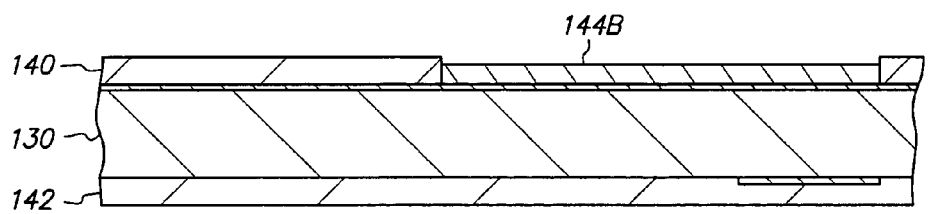
Figure 7C:
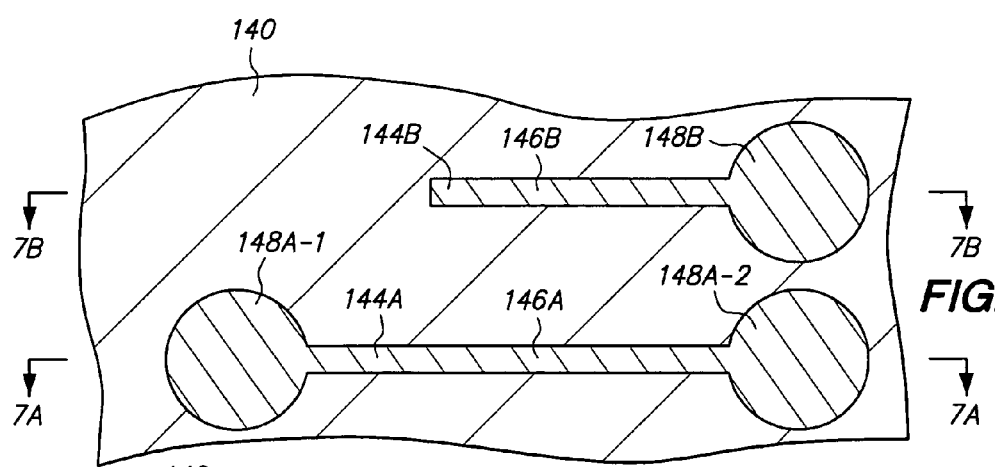
Figure 7D:
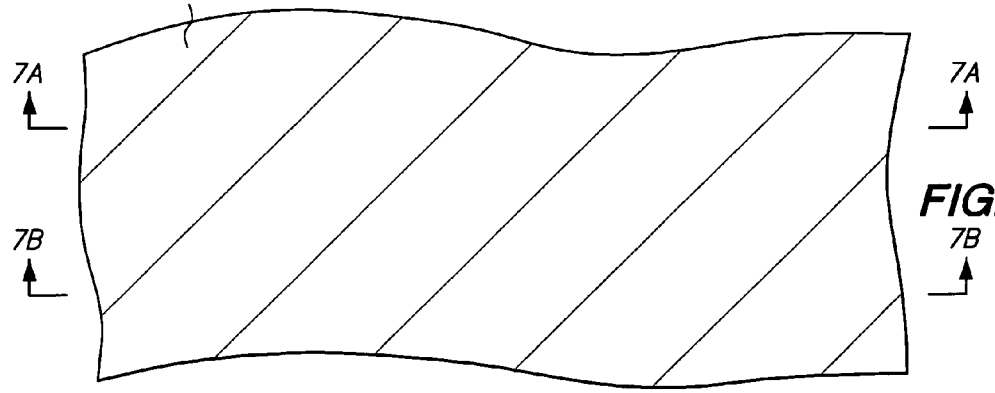
Figure 8A:
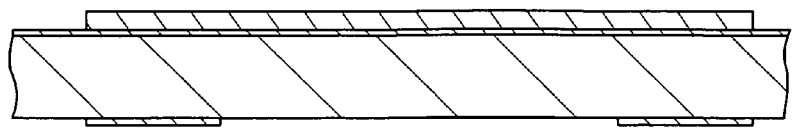
Figure 8B:
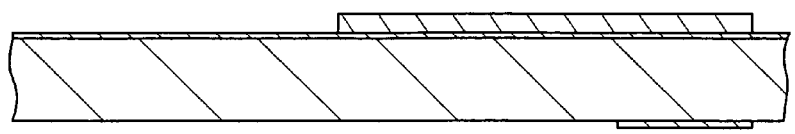
Figure 8C:
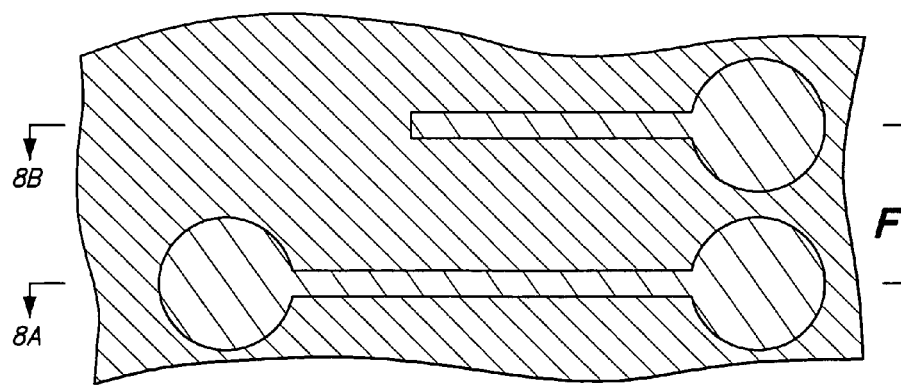
Figure 8D:
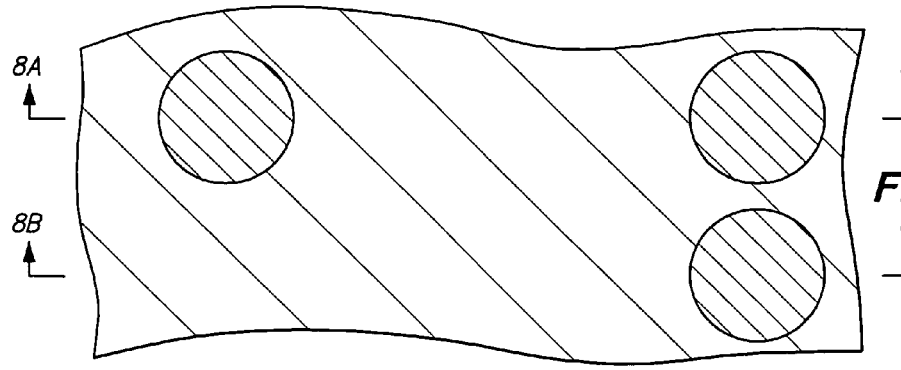
Figure 9A:
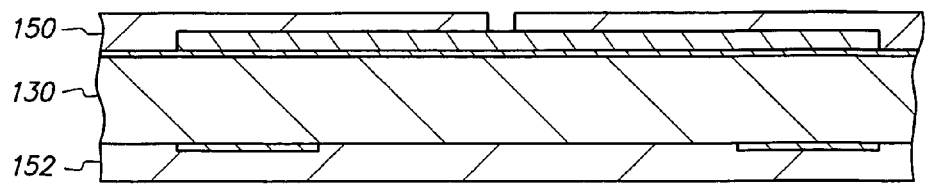
Figure 9B:
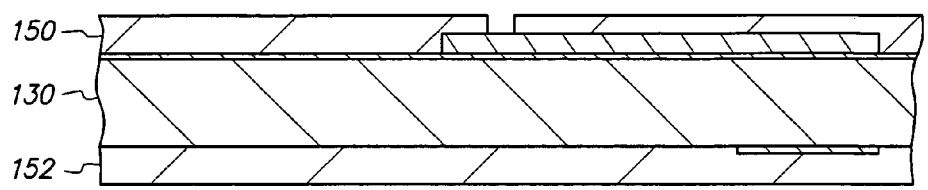
Figure 9C:
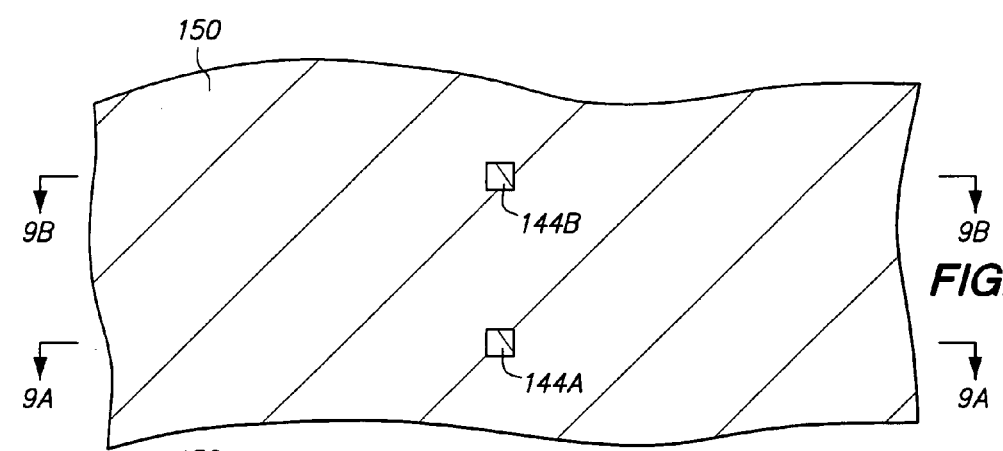
Figure 9D:
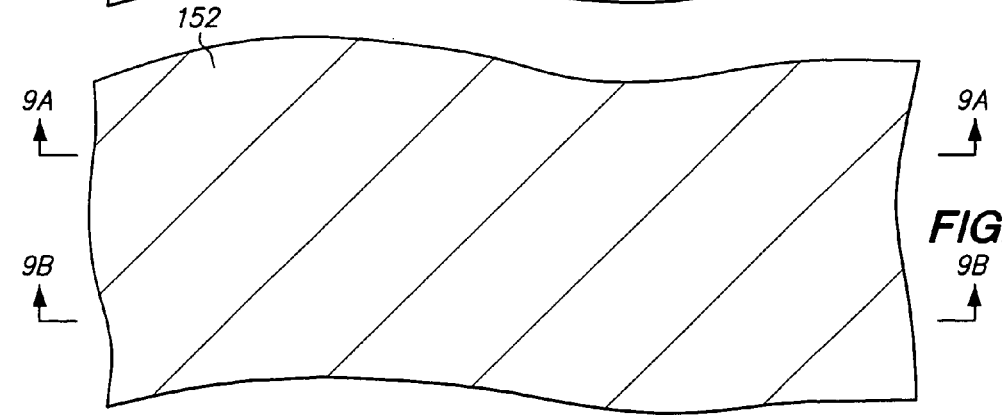
Figure 10A:
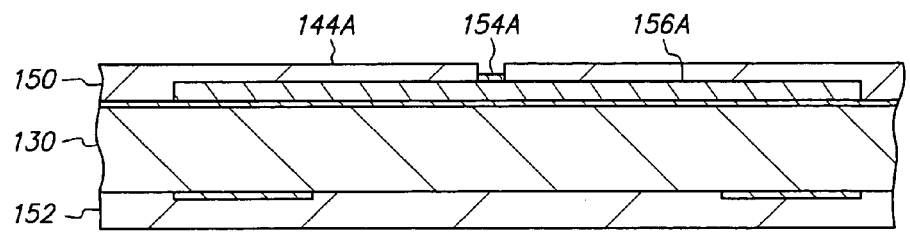
Figure 10B:
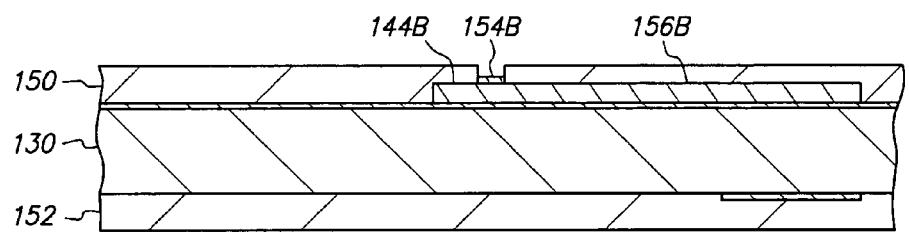
Figure 10C:
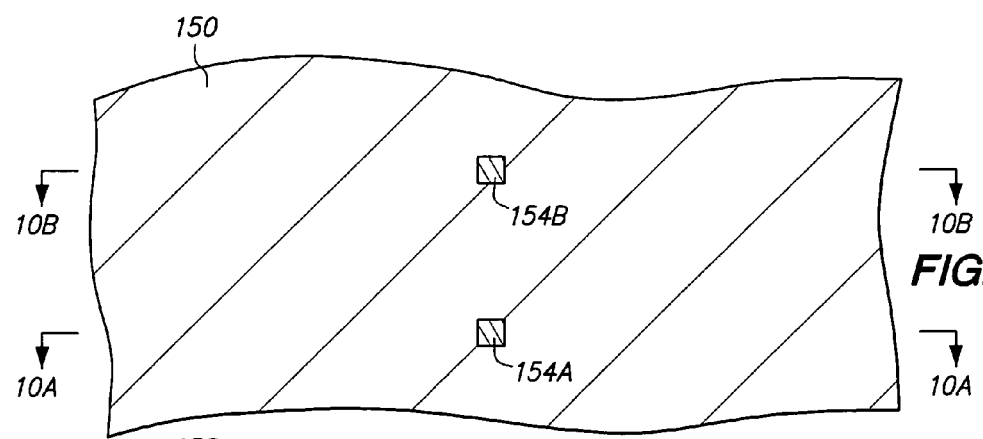
Figure 10D:
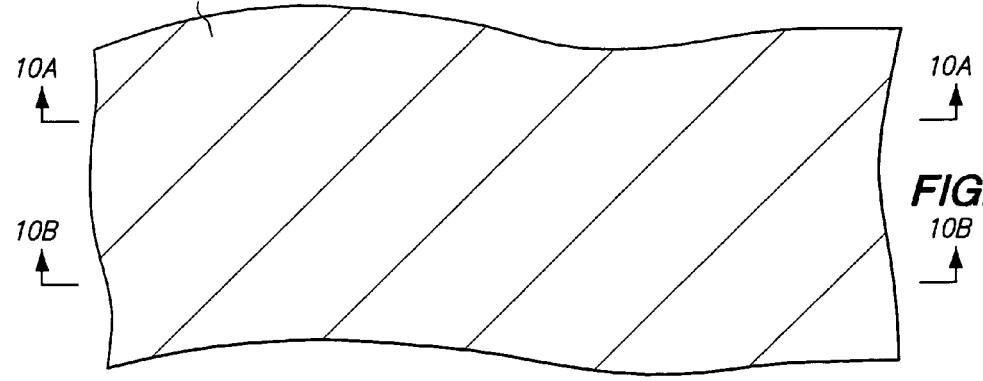
Figure 11A:
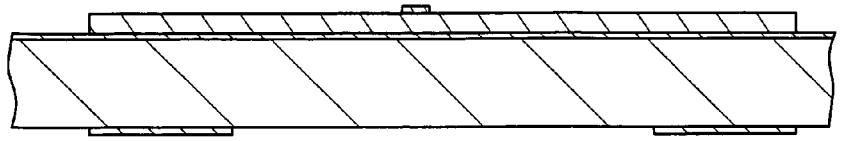
Figure 11B:
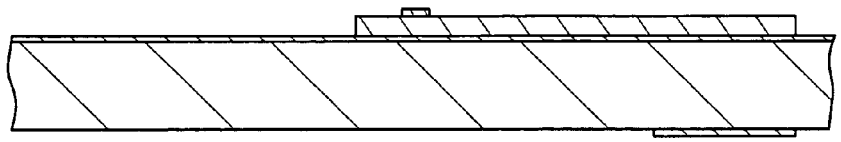
Figure 11C:
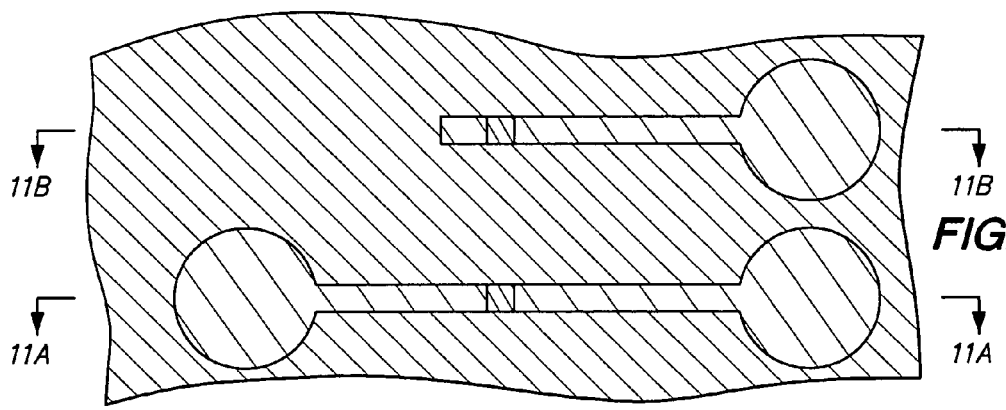
Figure 11D:
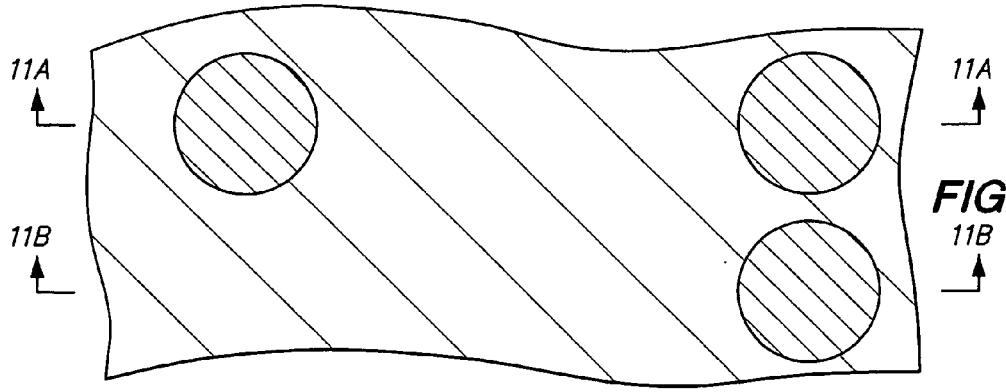
Figure 12A:
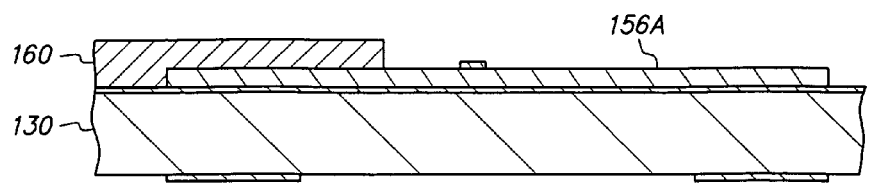
Figure 12B:
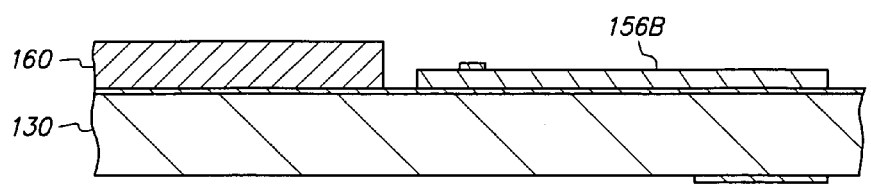
Figure 12C:
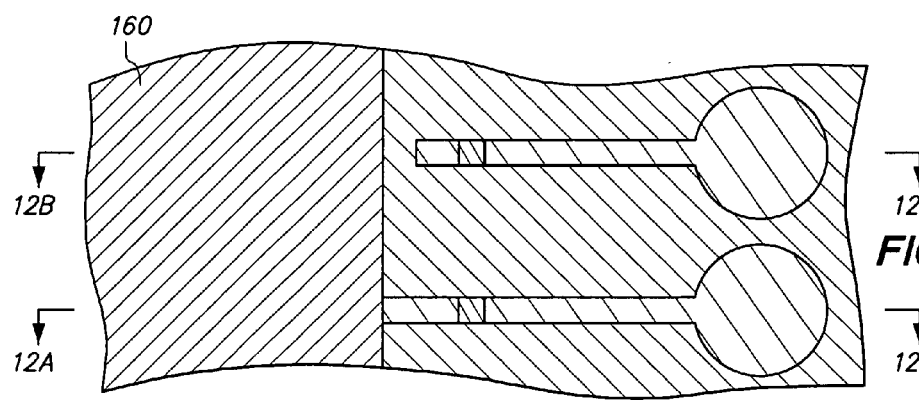
Figure 12D:
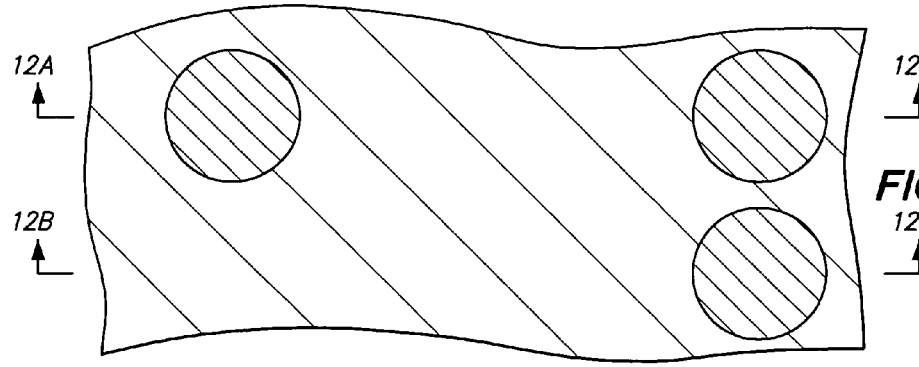
Figure 13A:
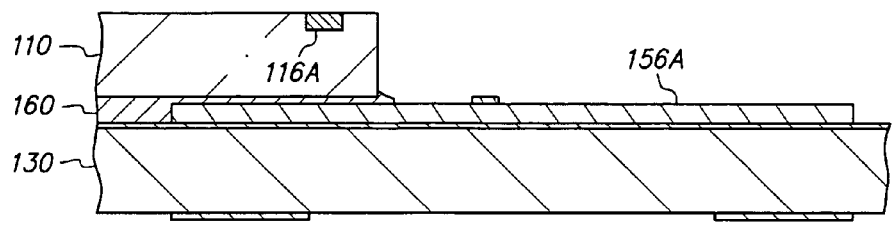
Figure 13B:
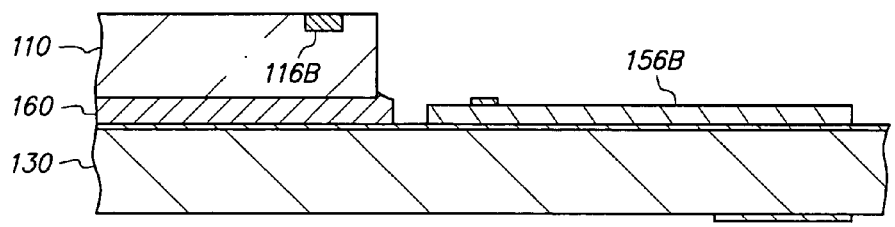
Figure 13C:
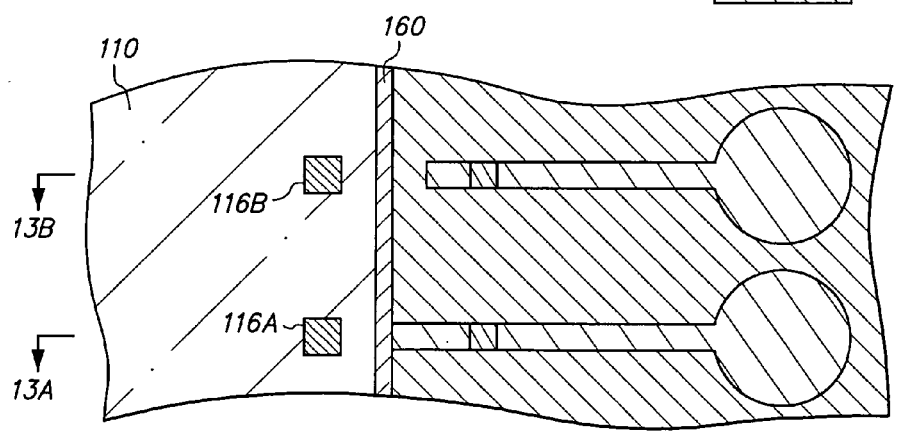
Figure 13D:
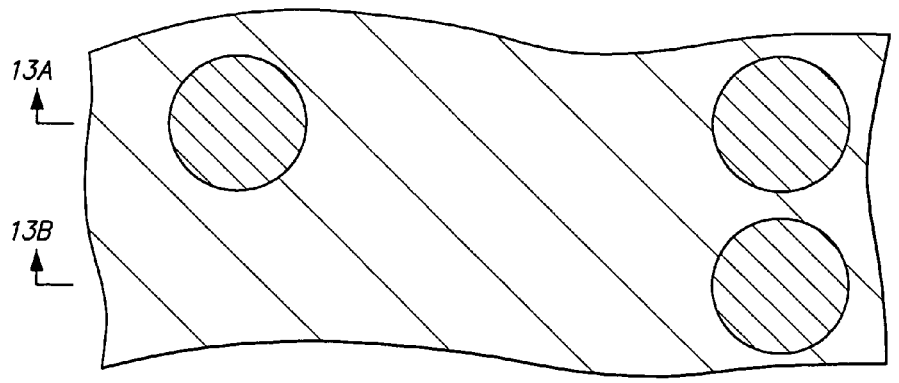
Figure 14A:
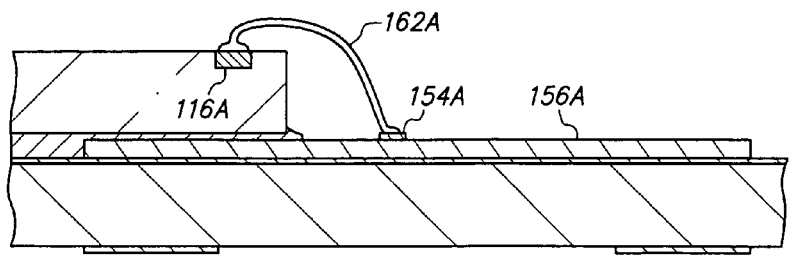
Figure 14B:
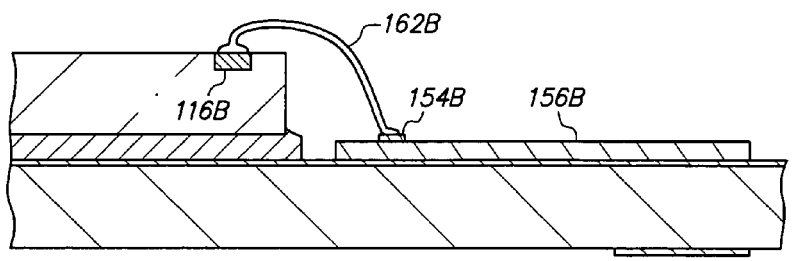
Figure 14C:
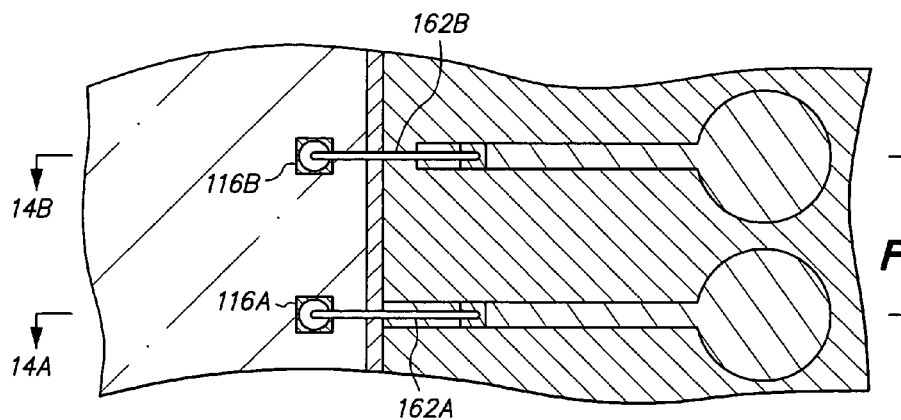
Figure 14D:
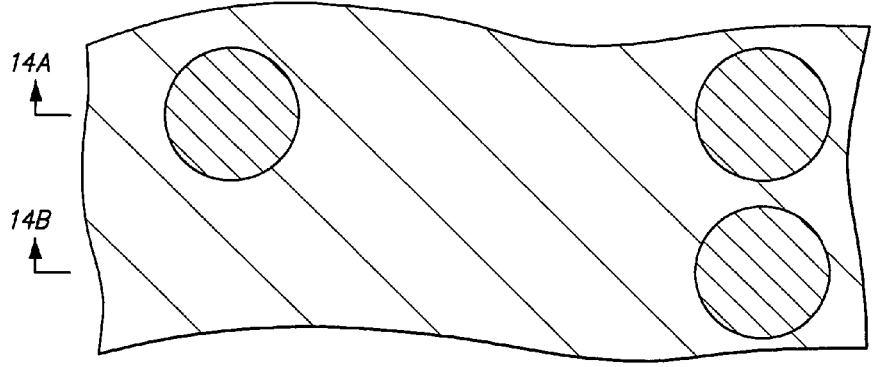
Figure 15A:
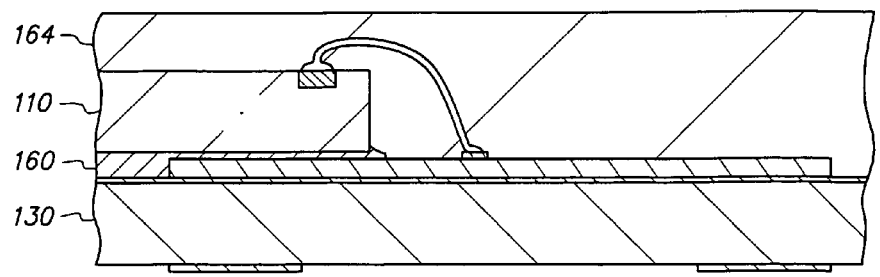
Figure 15B:
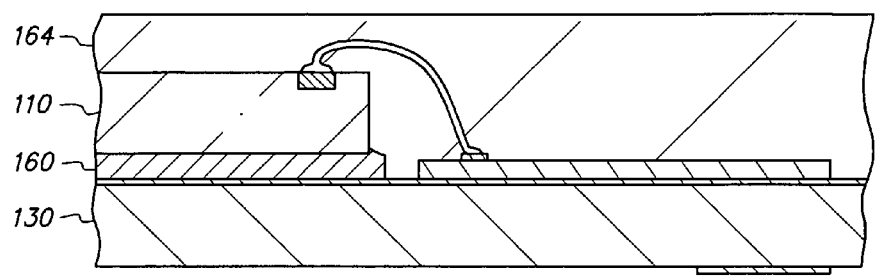
Figure 15C:
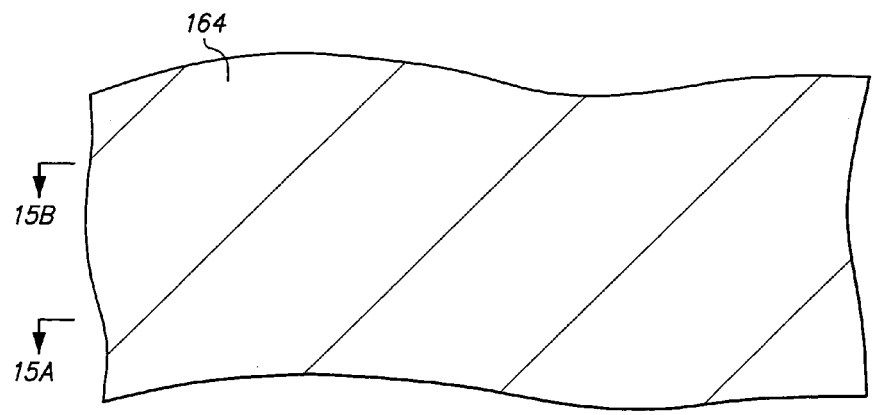
Figure 15D:
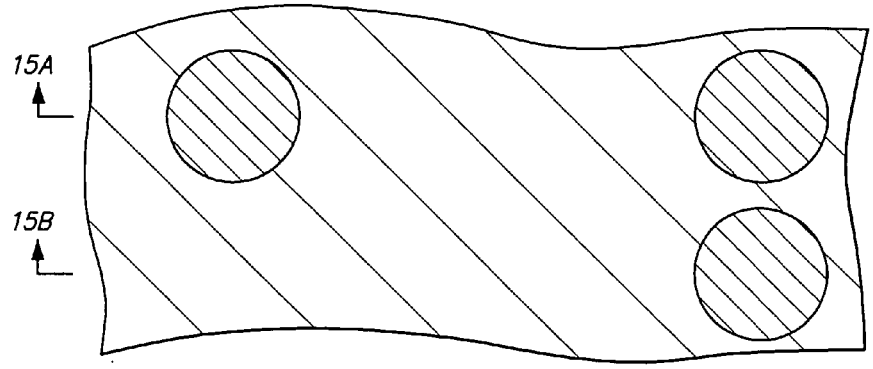
Figure 17A:
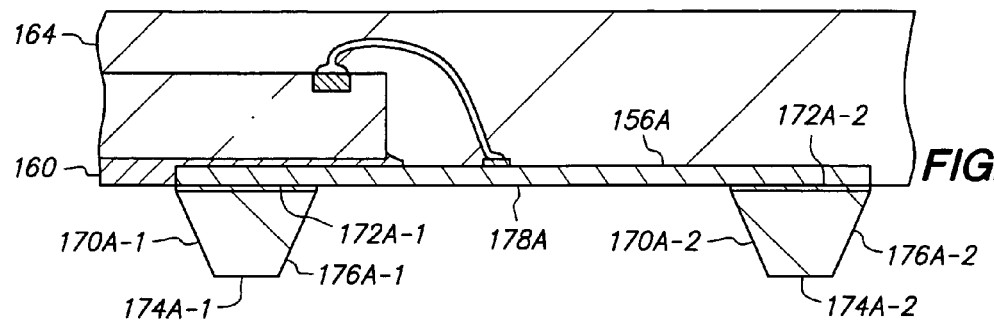
Figure 17B:
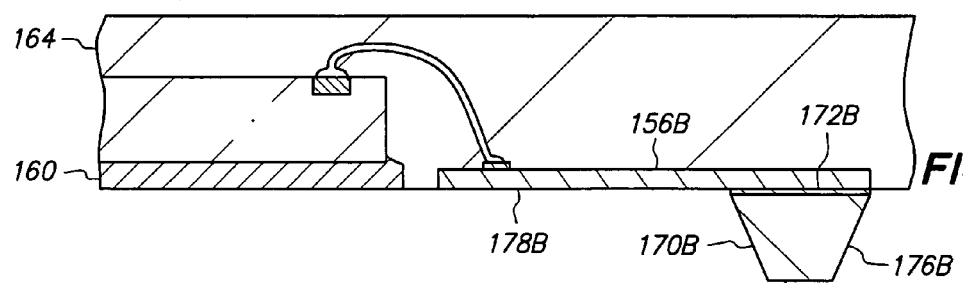
Figure 17C:
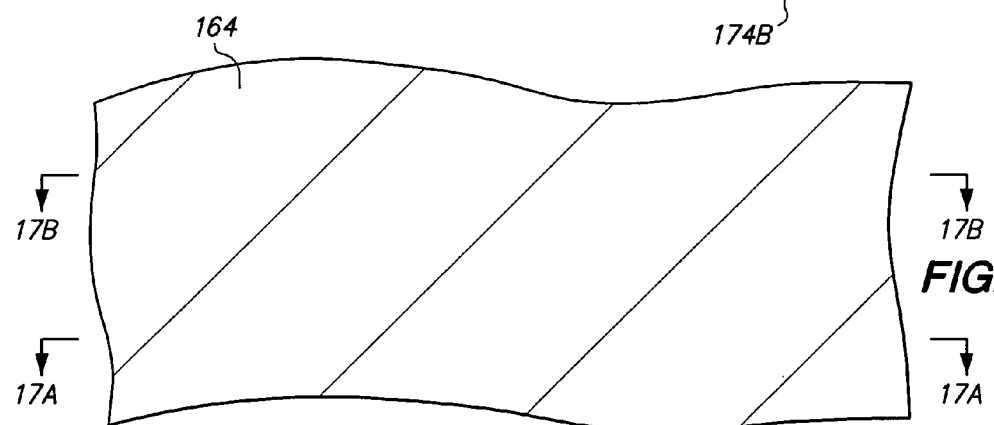
Figure 17D:
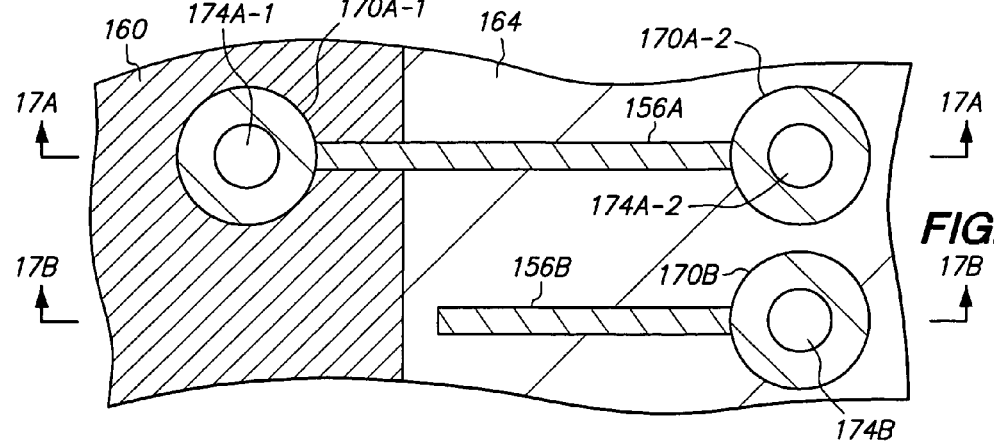
Figure 18A:
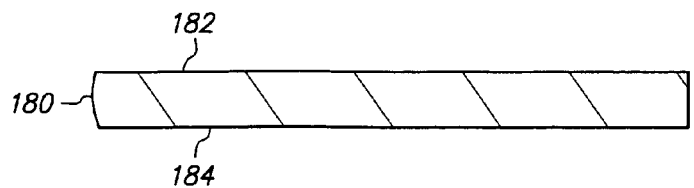
Figure 18B:
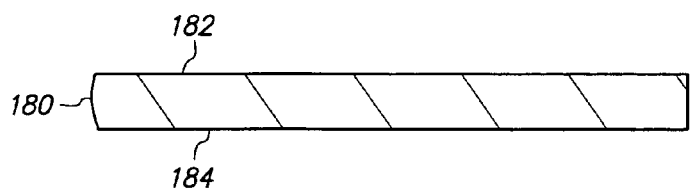
Figure 18C:
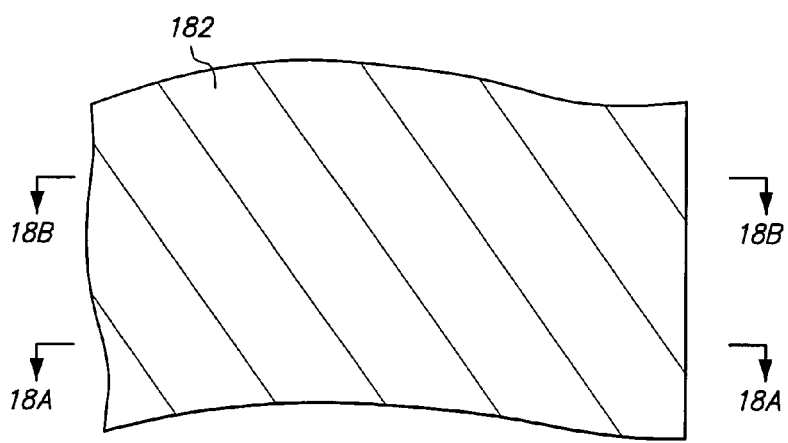
Figure 18D:
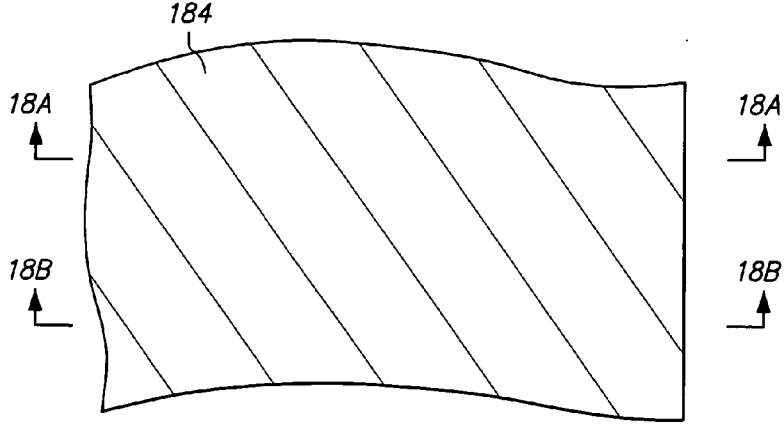
Figure 19A:
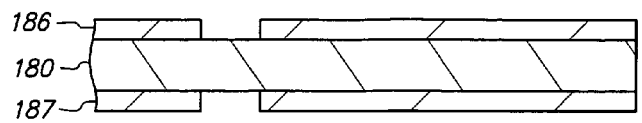
Figure 19B:
Figure 19C:
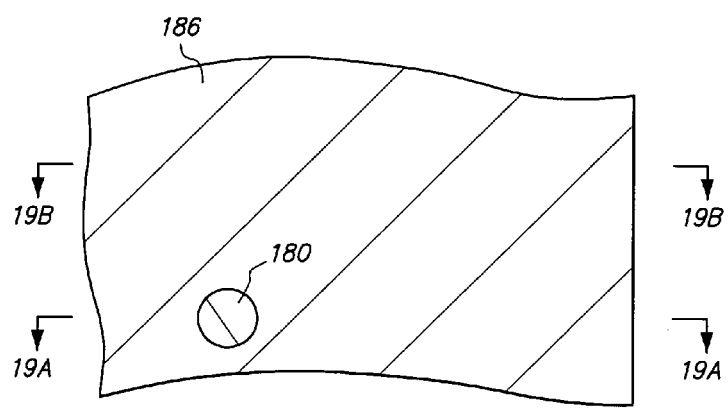
Figure 19D:
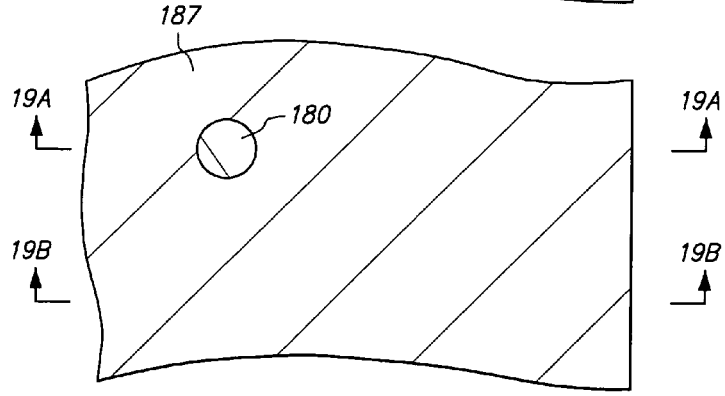
Figure 20A:
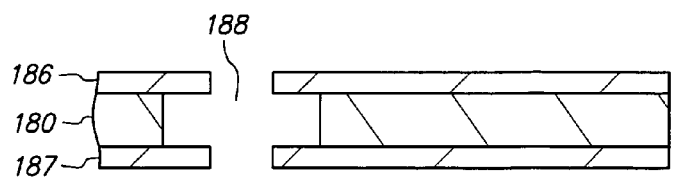
Figure 20B:
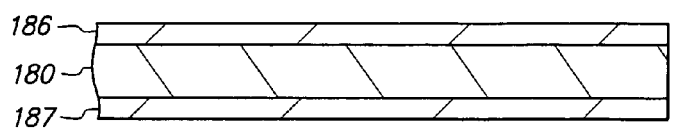
Figure 20C:
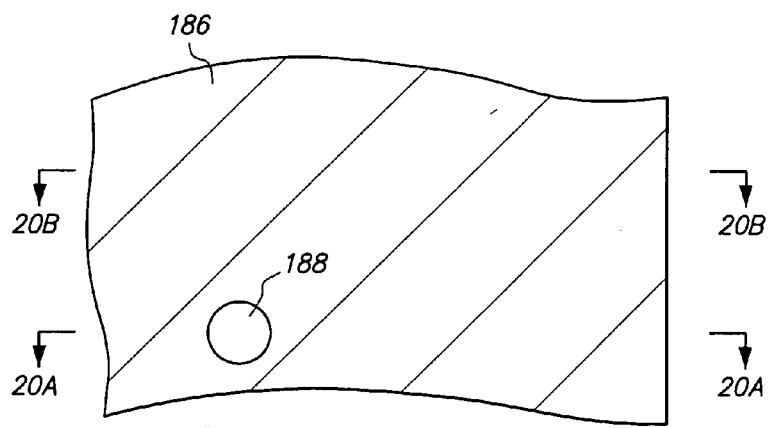
Figure 20D:
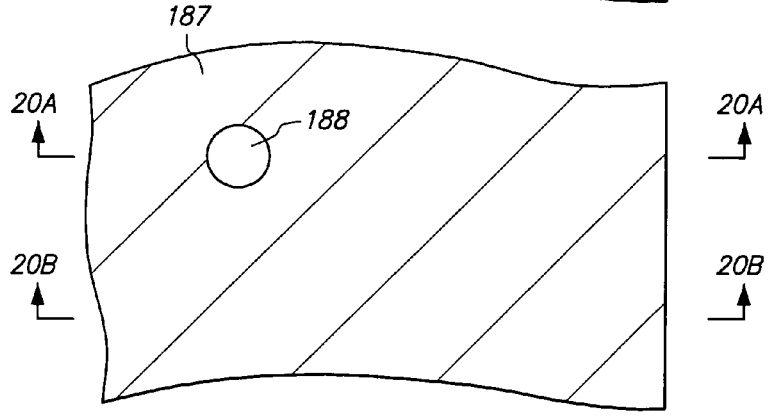
Figure 22A:
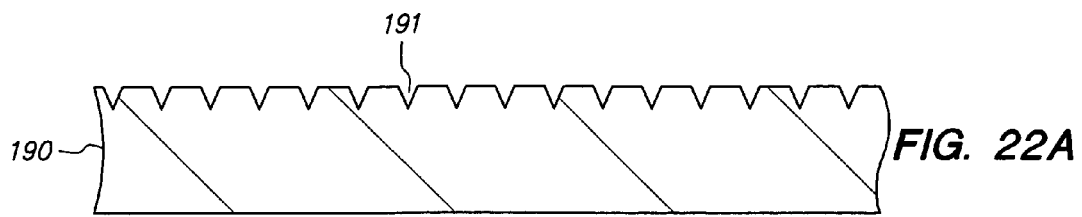
Figure 22B:
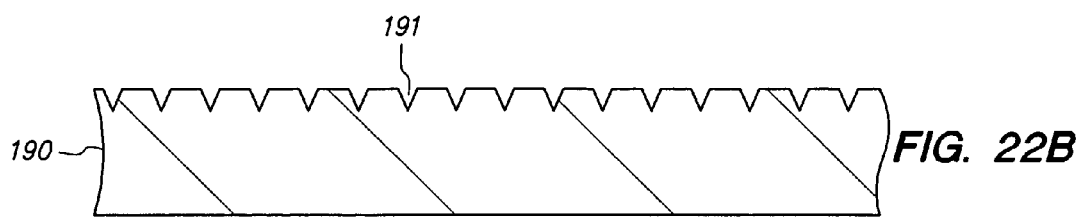
Figure 22C:
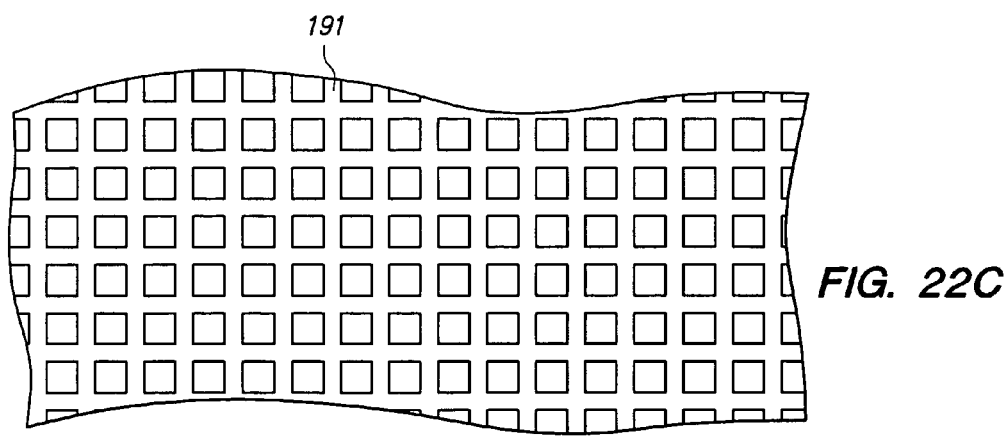
Figure 22D:
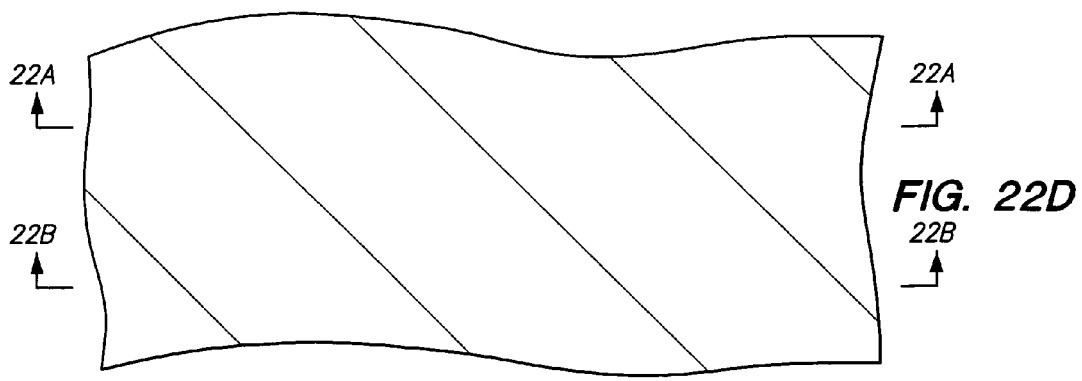
Figure 24A:
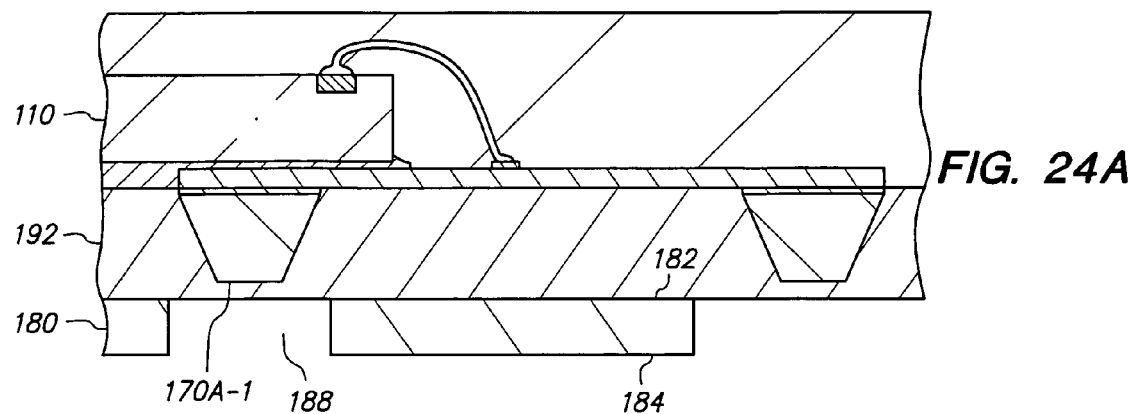
Figure 24B:
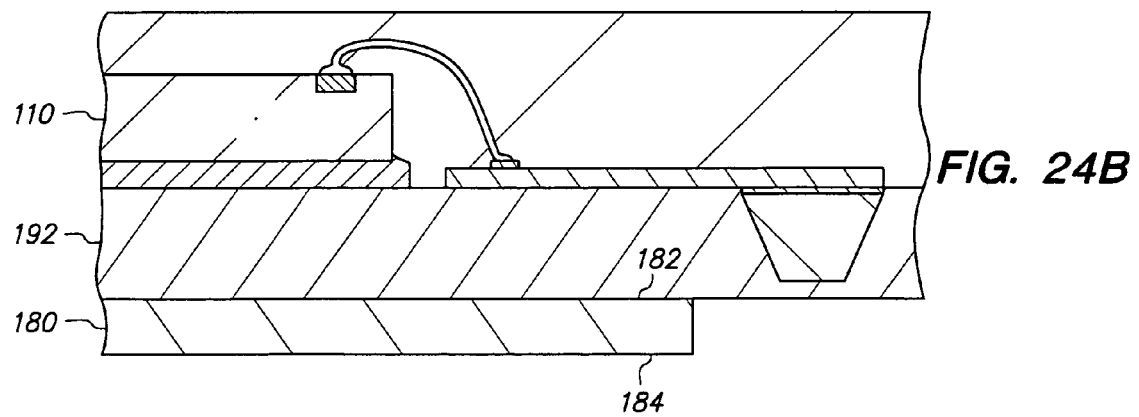
Figure 24C:
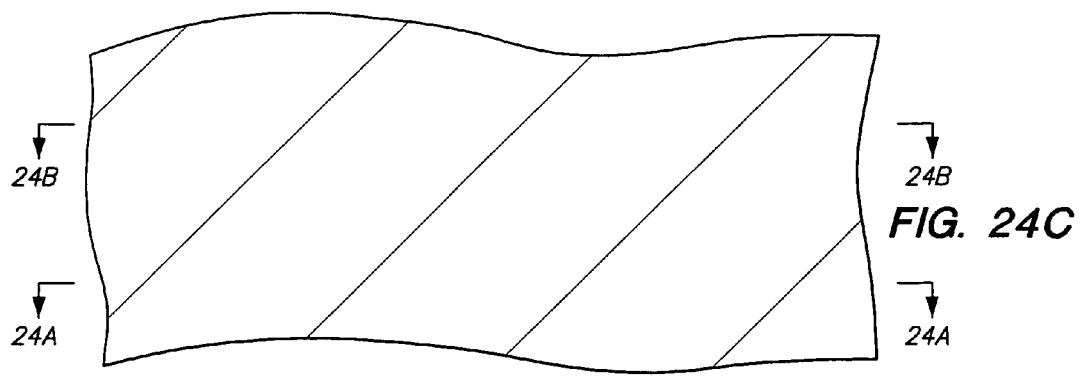
Figure 24D:
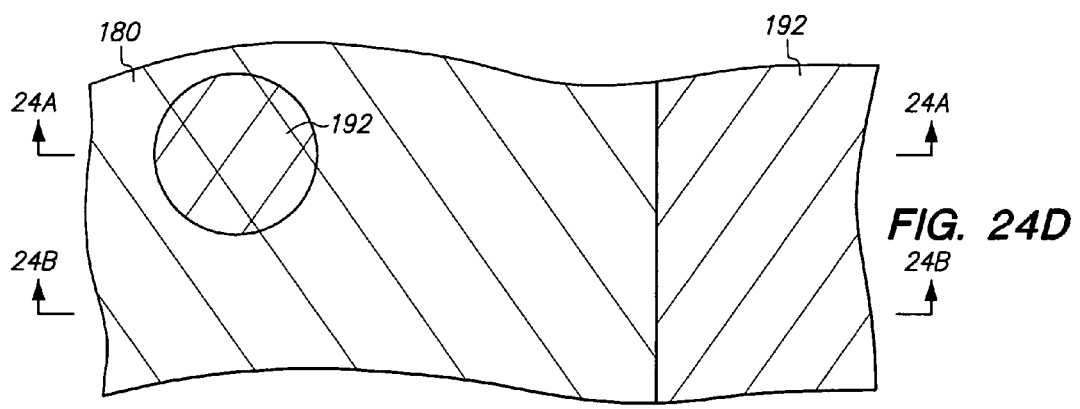
Figure 25A:
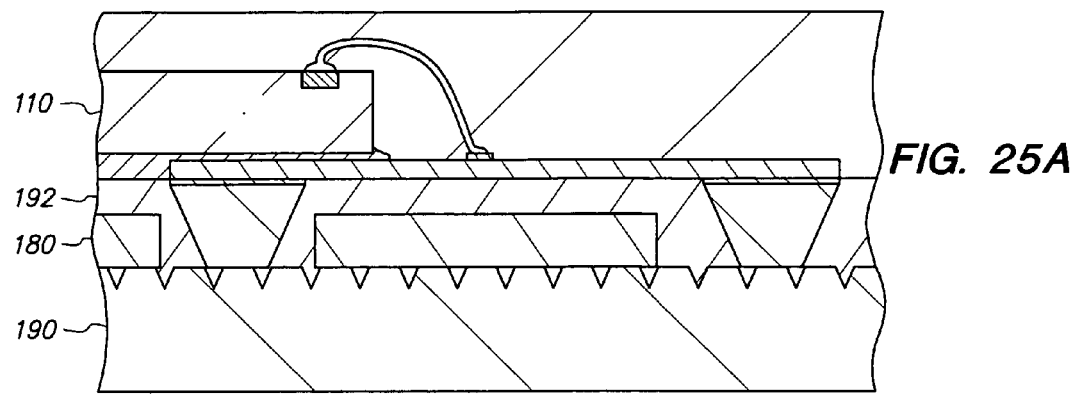
Figure 25B:
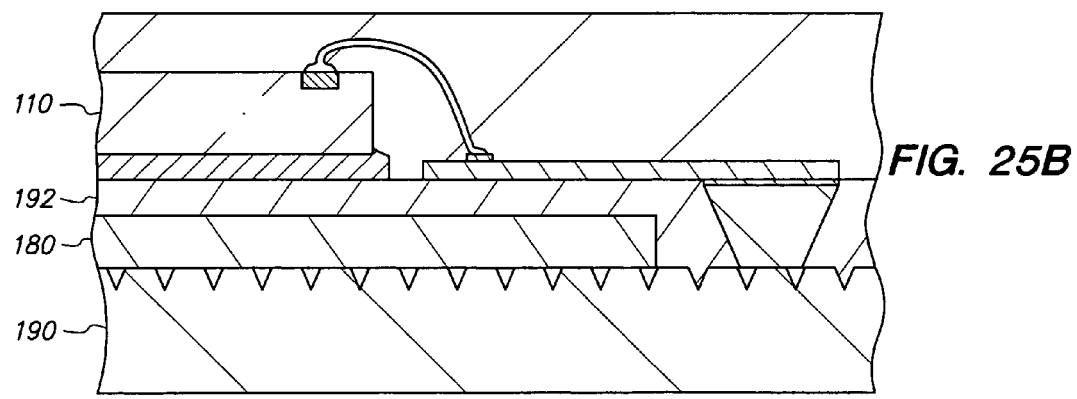
Figure 25C:
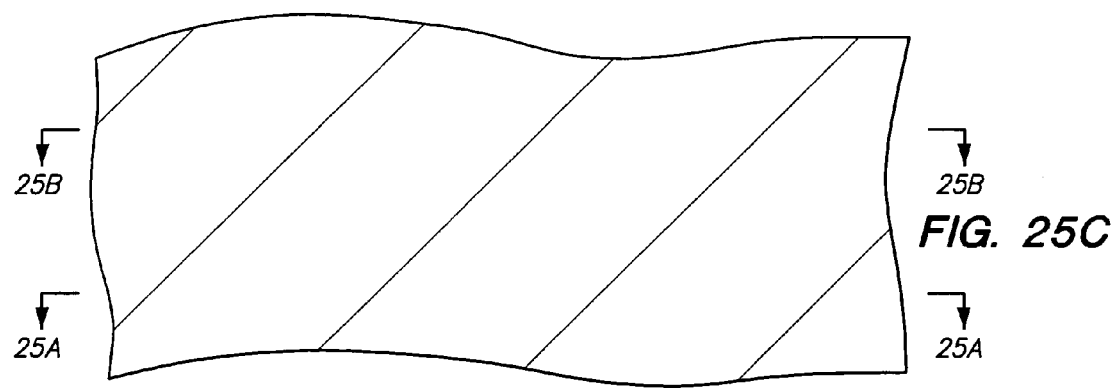
Figure 25D:
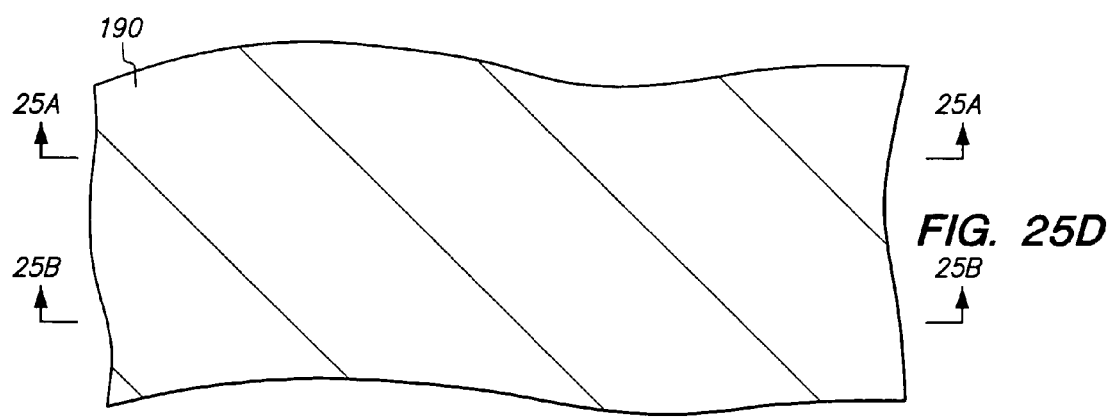
Figure 27A:
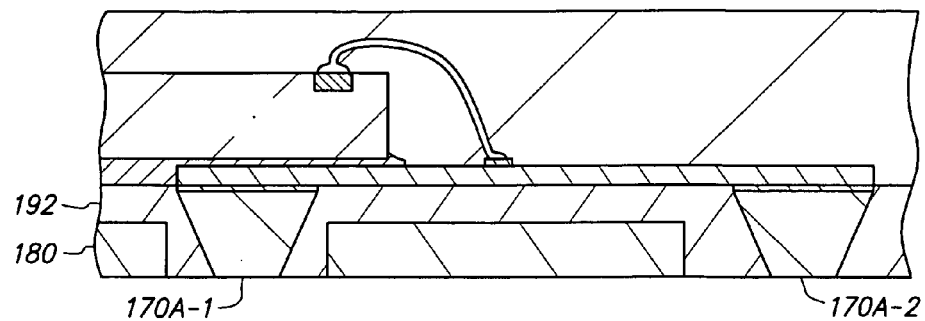
Figure 27B:
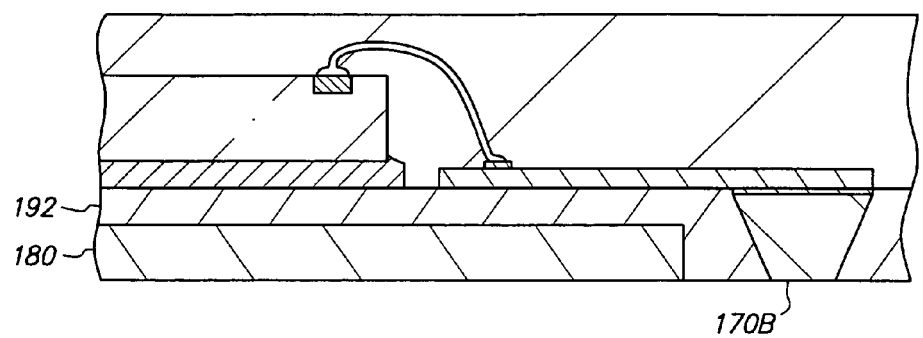
Figure 27C:
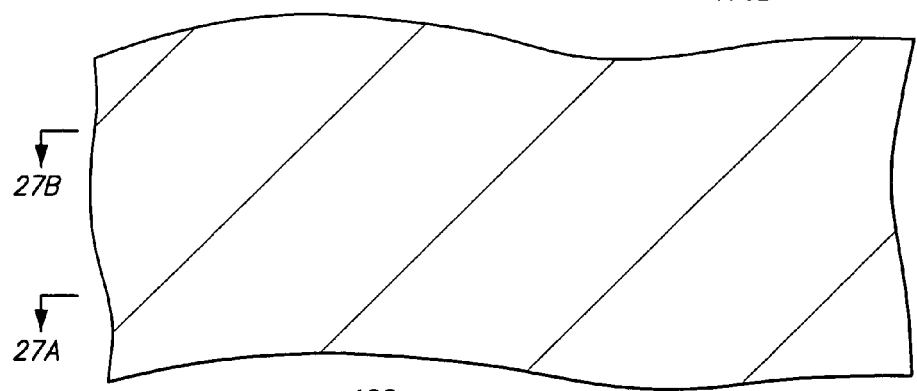
Figure 27D:
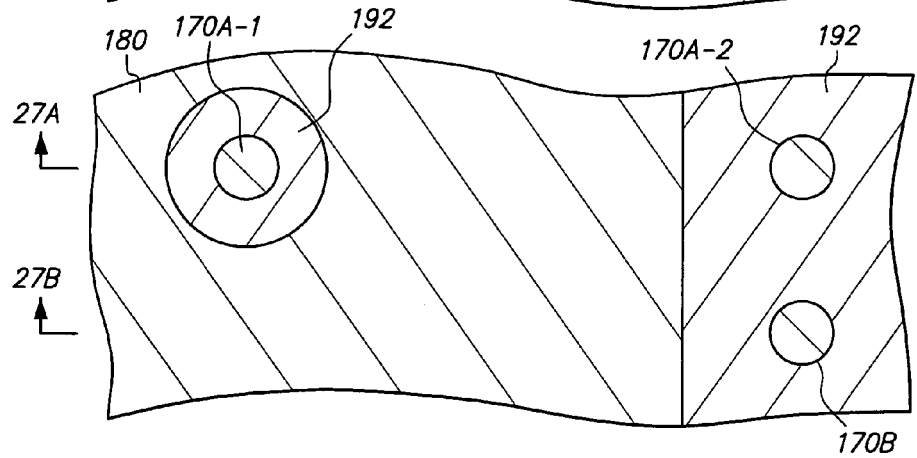
Figure 30A:
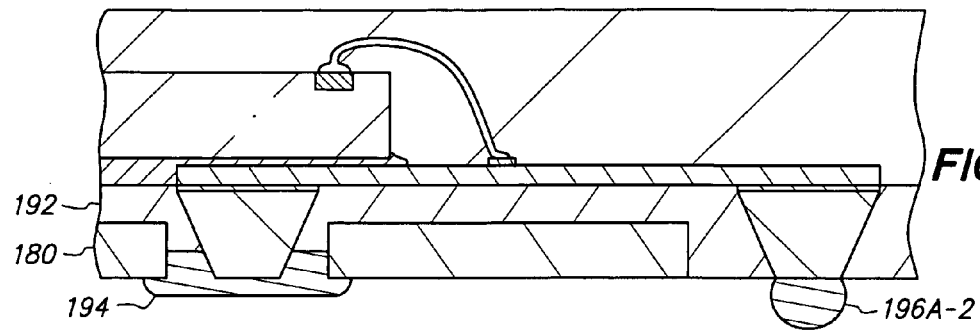
Figure 30B:
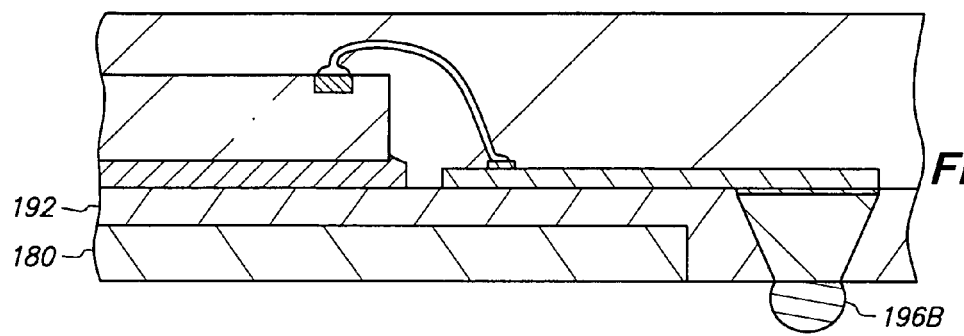
Figure 30C:
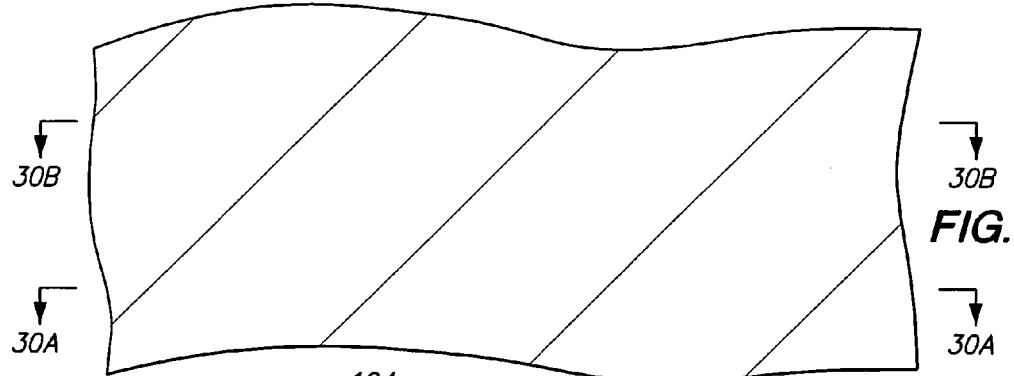
Figure 30D:
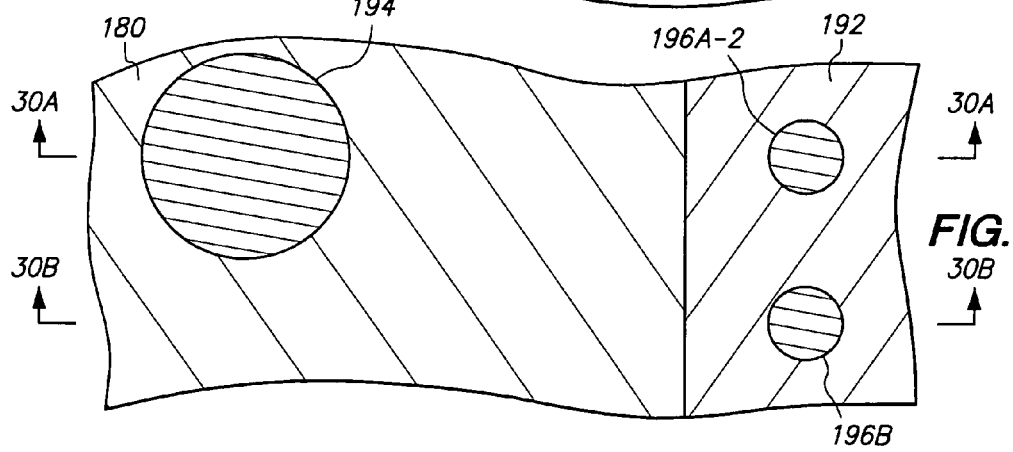
Figure 31A:
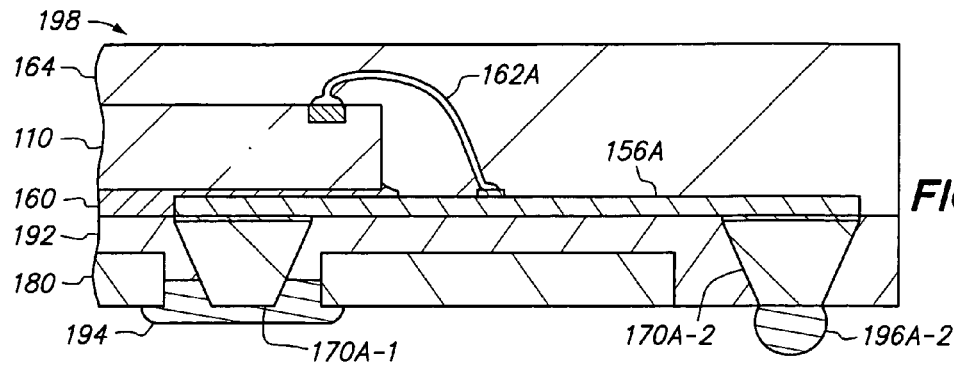
Figure 31B:
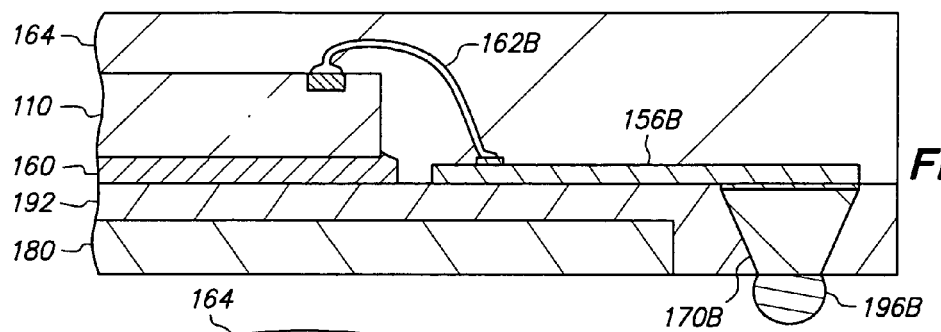
Figure 31C:
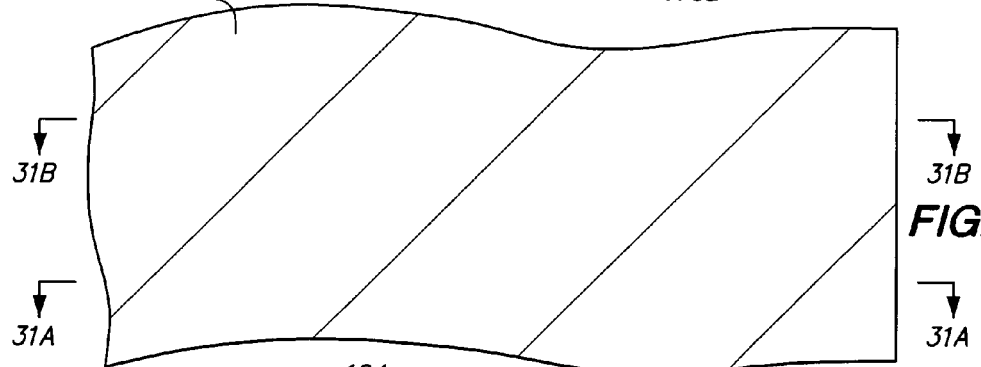
Figure 31D:
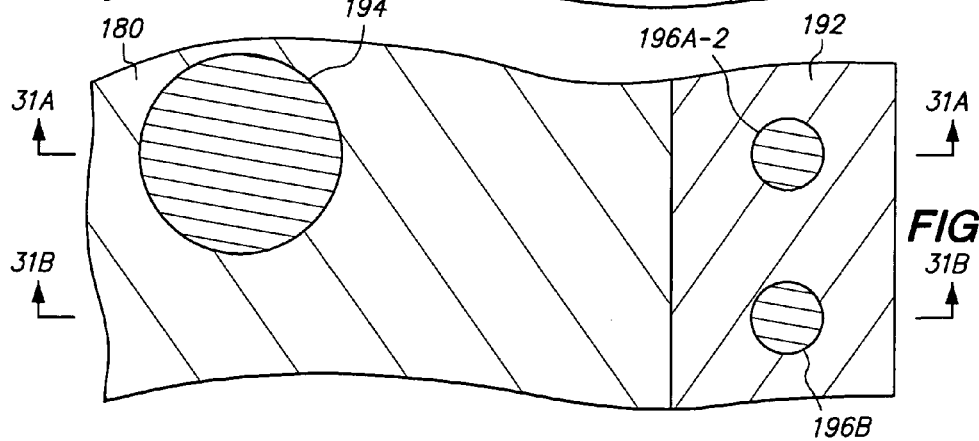
Figure 32A:
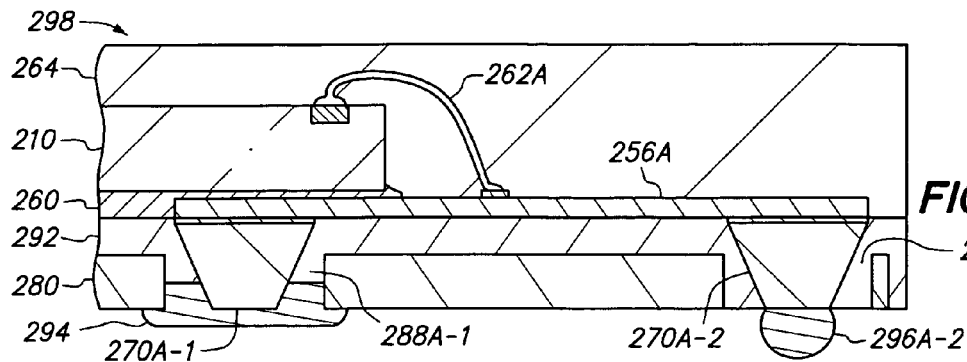
FIGS. 32A, 32B, 32C and 32D are cross-sectional, cross-sectional, top and bottom views, respectively, of a semiconductor chip assembly in accordance with a second embodiment of the present invention.
Figure 32B:
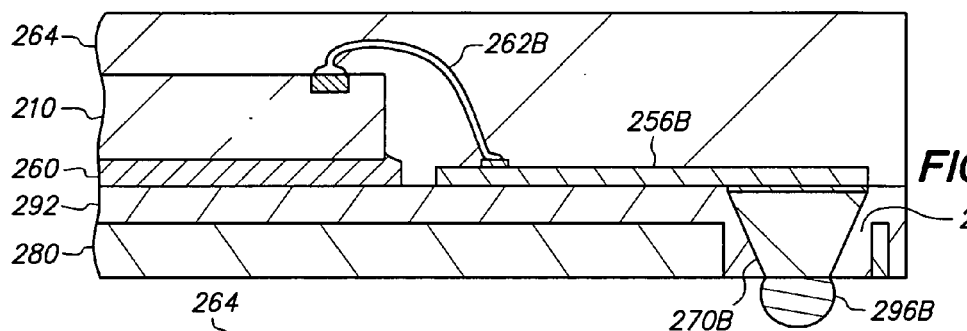
Figure 32C:
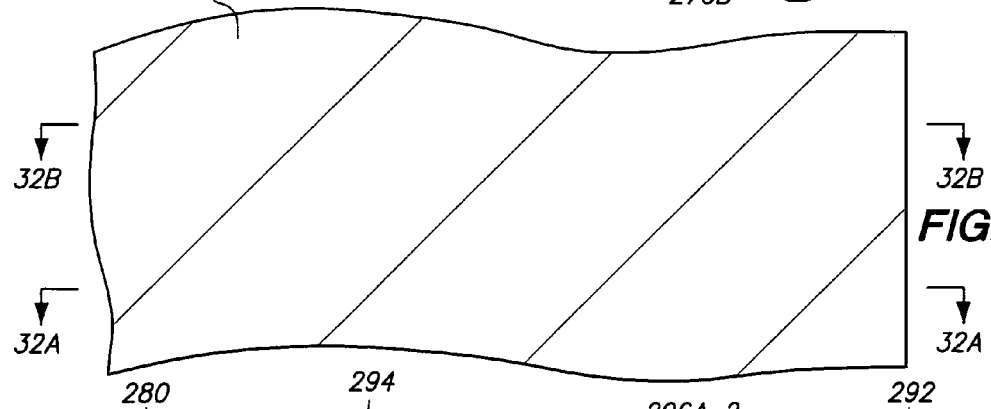
Figure 32D:
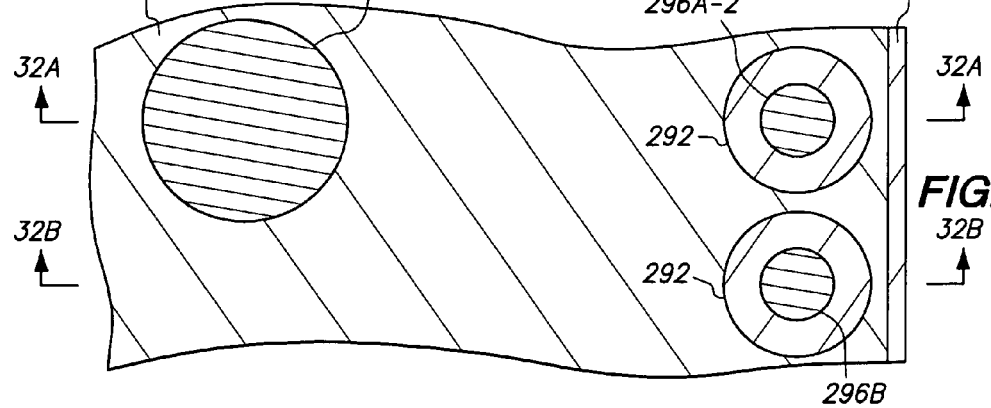
Figure 33A:
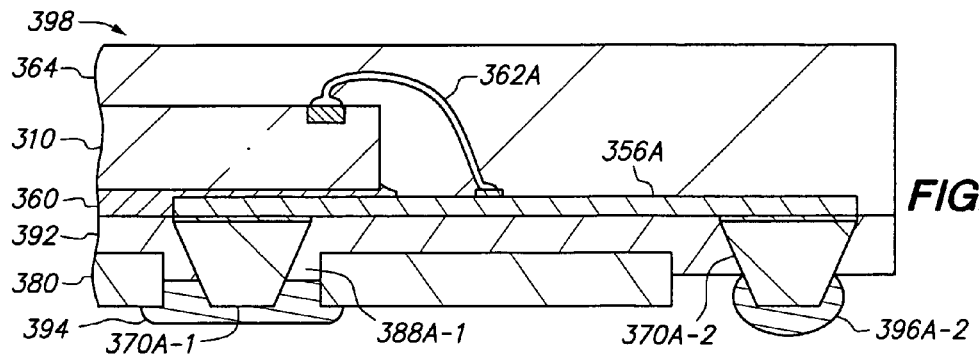
FIGS. 33A, 33B, 33C and 33D are cross-sectional, cross-sectional, top and bottom views, respectively, of a semiconductor chip assembly in accordance with a third embodiment of the present invention.
Figure 33B:
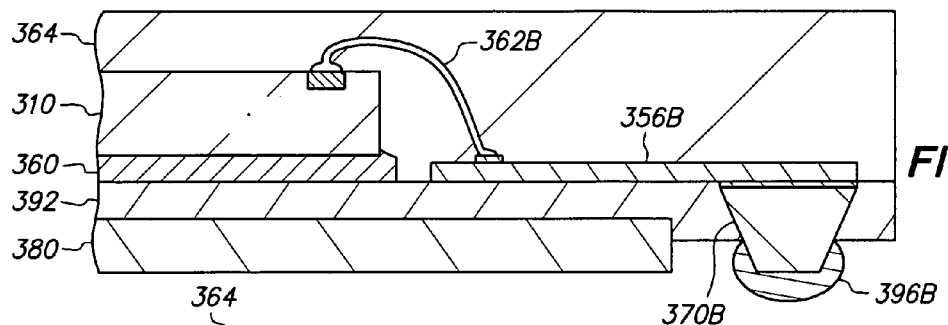
Figure 33C:
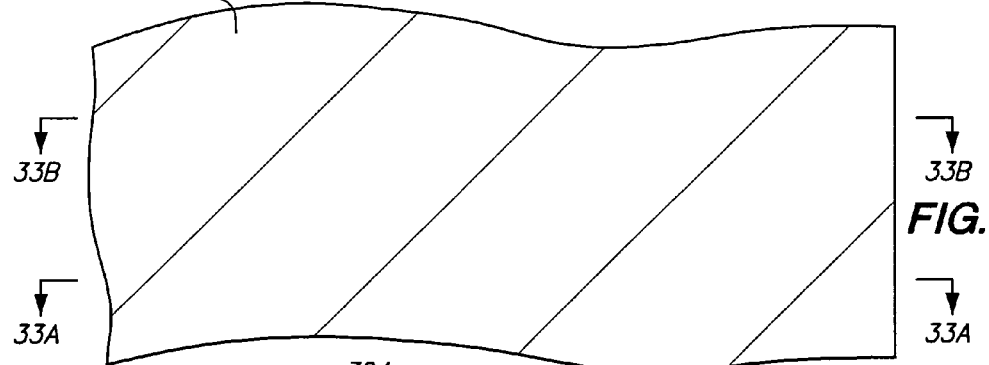
Figure 33D:
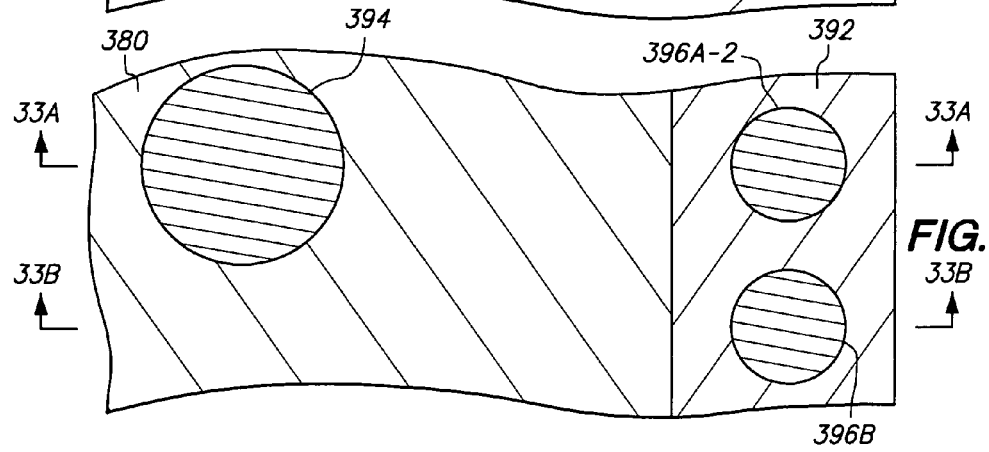
Figure 34A:
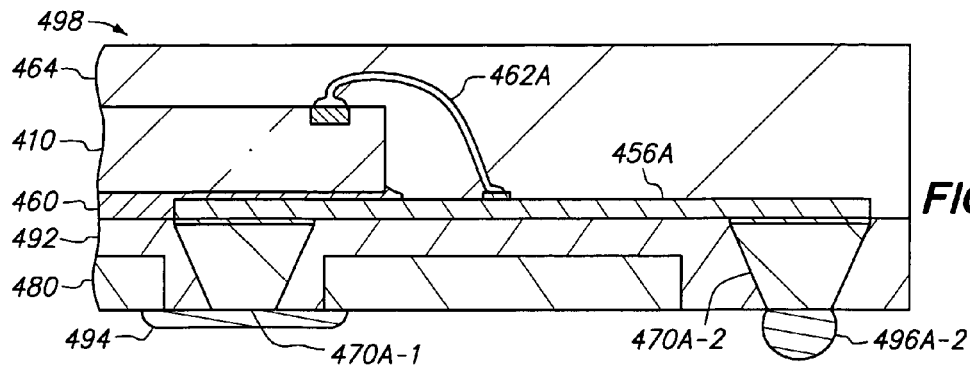
FIGS. 34A, 34B, 34C and 34D are cross-sectional, cross-sectional, top and bottom views, respectively, of a semiconductor chip assembly in accordance with a fourth embodiment of the present invention.
Figure 34B:
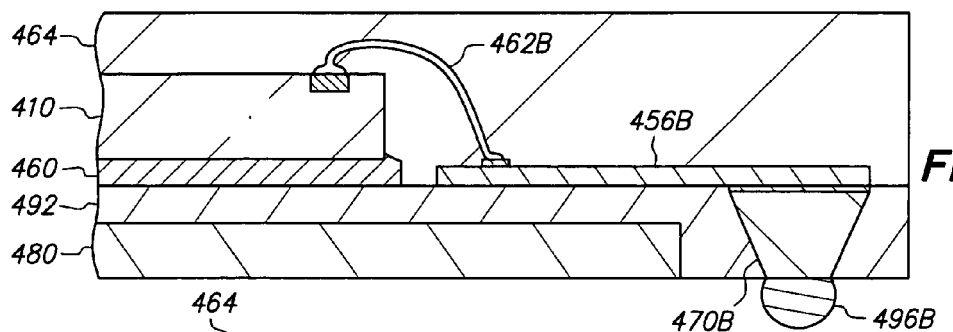
Figure 34C:
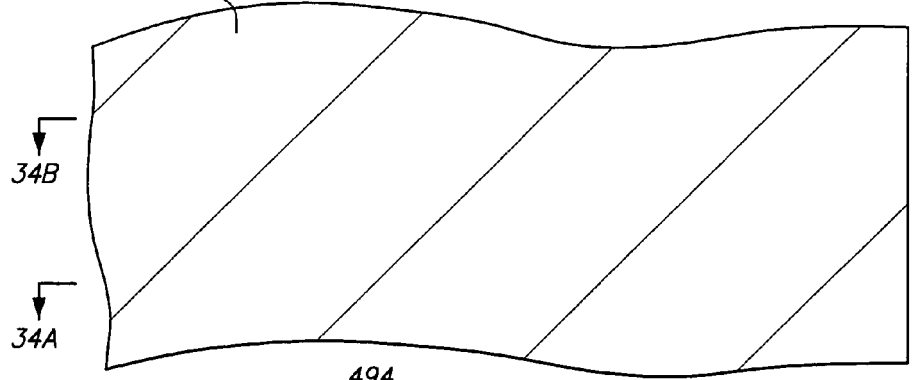
Figure 34D:
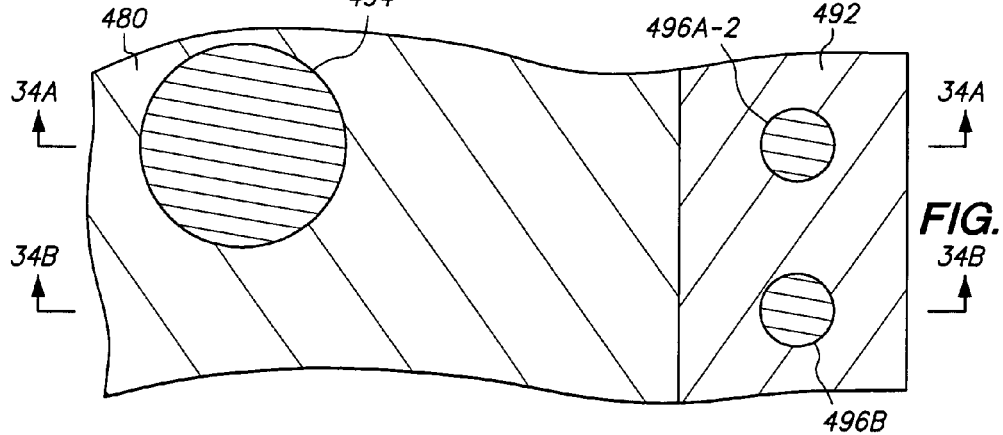
Figure 35A:
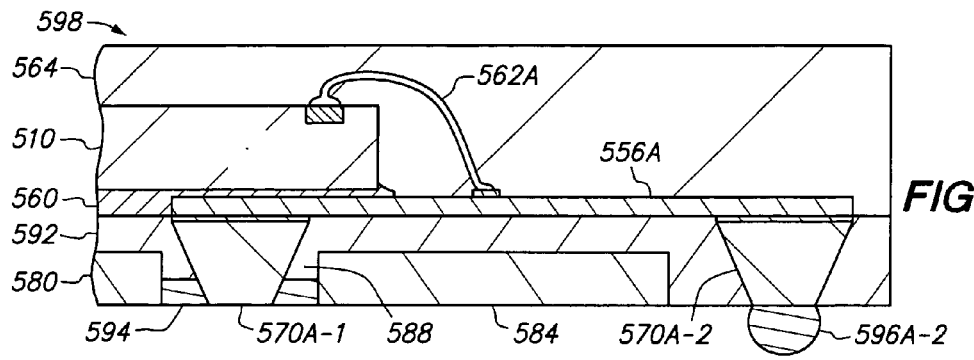
FIGS. 35A, 35B, 35C and 35D are cross-sectional, cross-sectional, top and bottom views, respectively, of a semiconductor chip assembly in accordance with a fifth embodiment of the present invention.
Figure 35B:
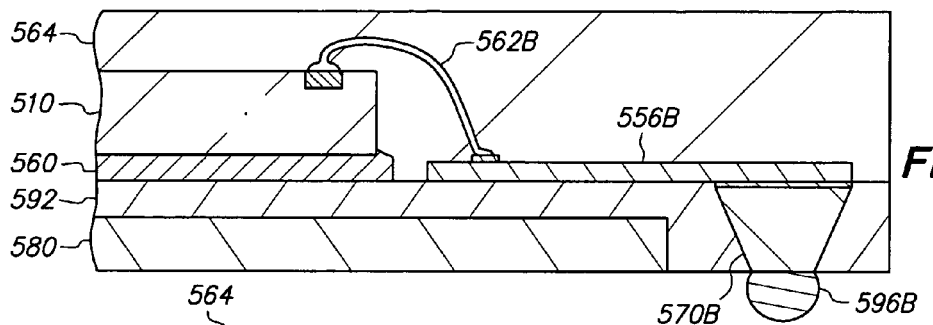
Figure 35C:
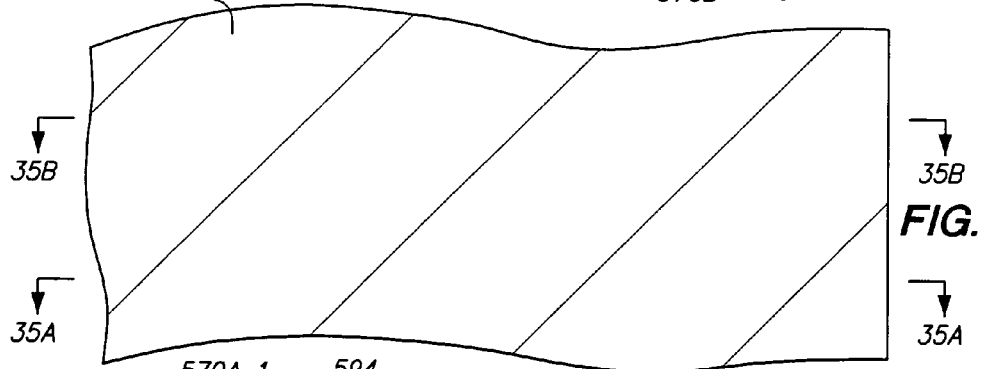
Figure 35D:
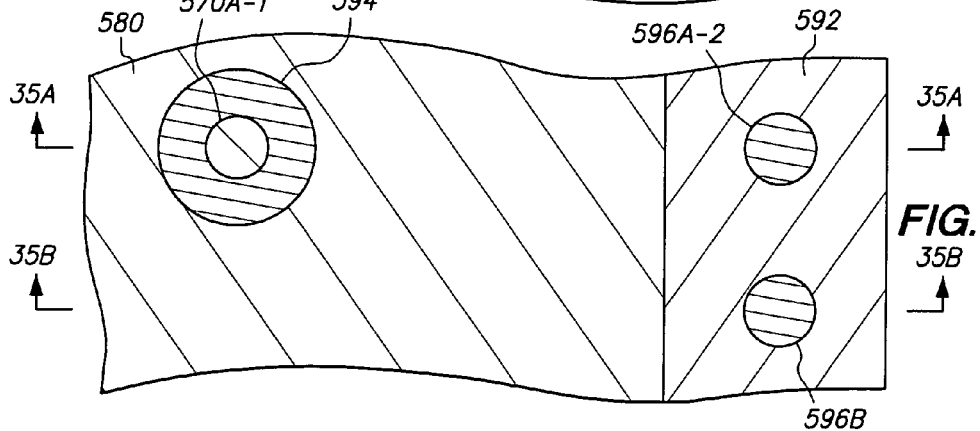
Figure 36A:
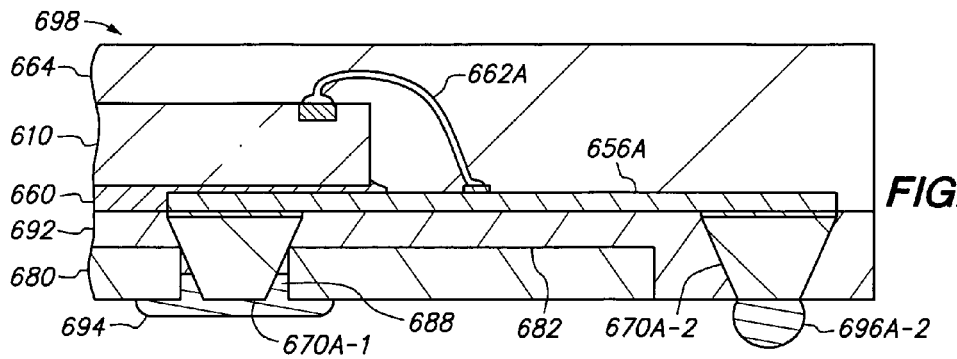
FIGS. 36A, 36B, 36C and 36D are cross-sectional, cross-sectional, top and bottom views, respectively, of a semiconductor chip assembly in accordance with a sixth embodiment of the present invention.
Figure 36B:
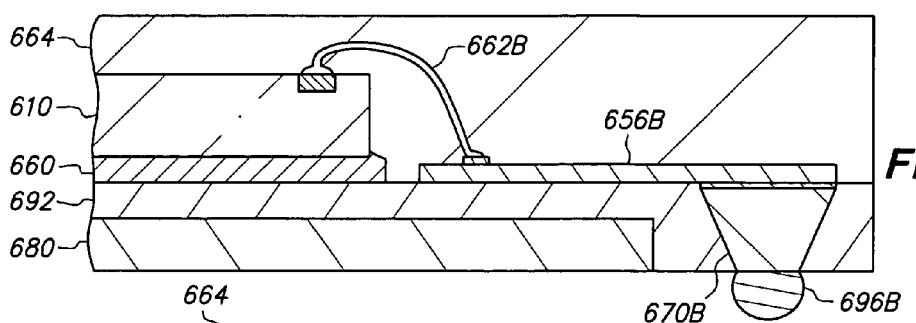
Figure 36C:
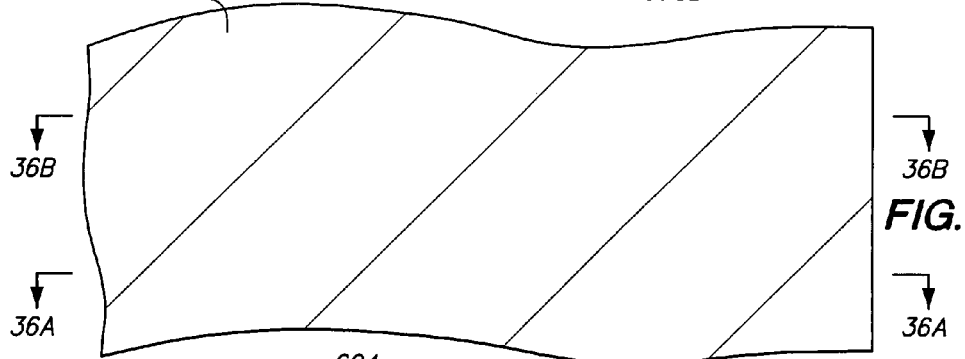
Figure 36D:
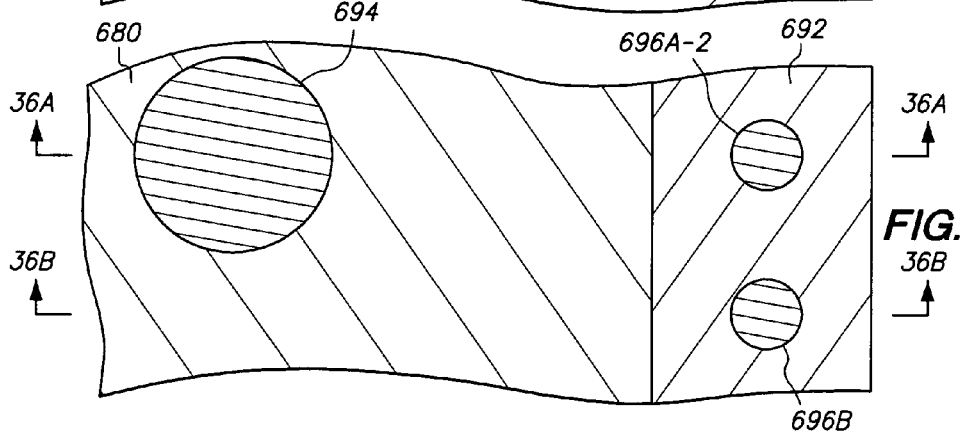
Figure 37A:
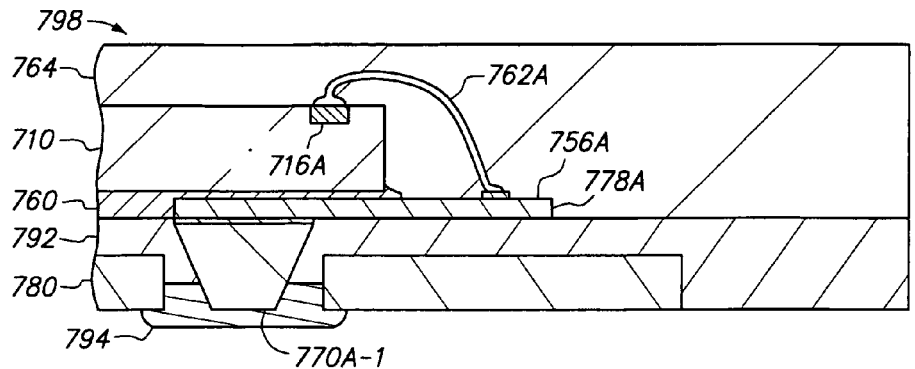
FIGS. 37A, 37B, 37C and 37D are cross-sectional, cross-sectional, top and bottom views, respectively, of a semiconductor chip assembly in accordance with a is seventh embodiment of the present invention.
Figure 37B:
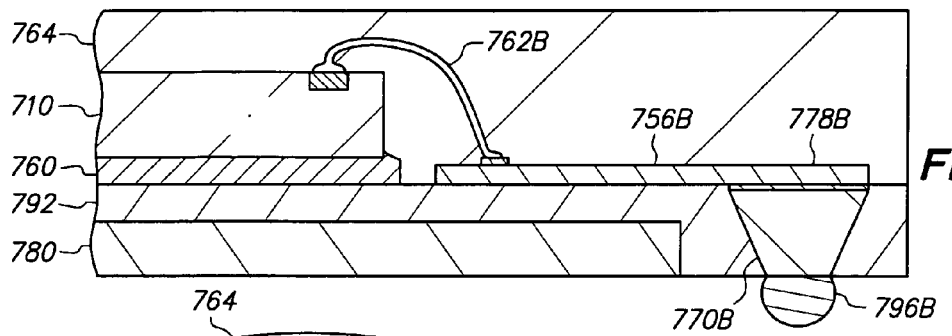
Figure 37C:
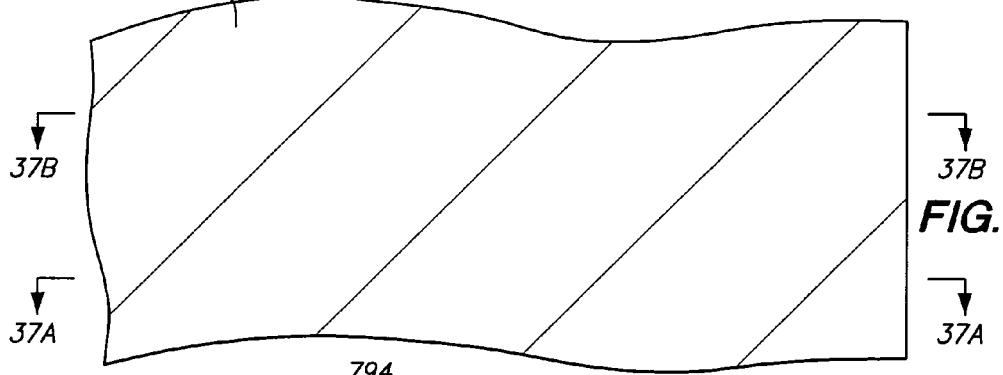
Figure 37D:
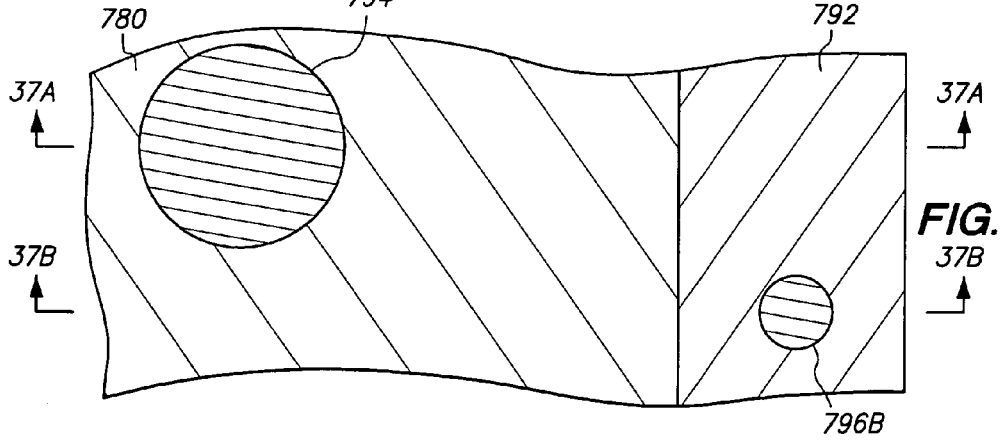
Figure 38A:
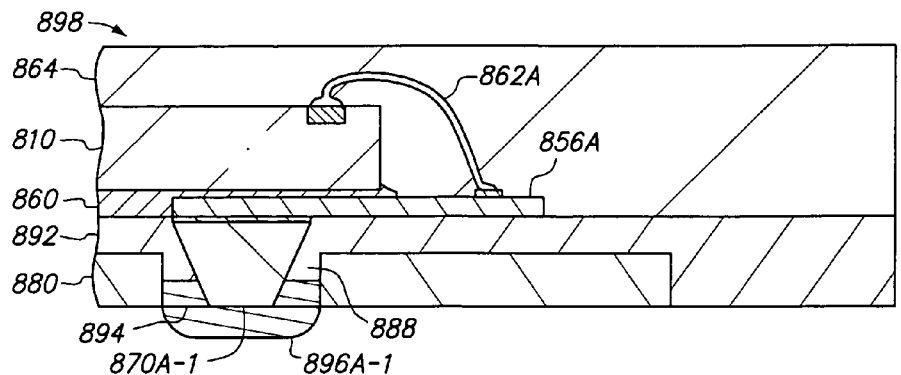
FIGS. 38A, 38B, 38C and 38D are cross-sectional, cross-sectional, top and bottom views, respectively, of a semiconductor chip assembly in accordance with an eighth embodiment of the present invention.
Figure 38B:
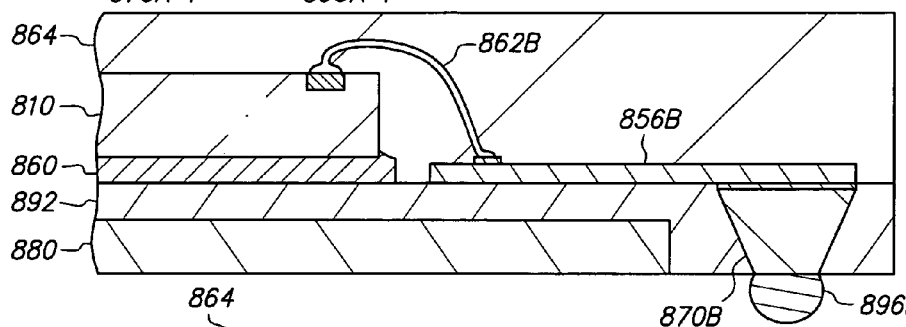
Figure 38C:
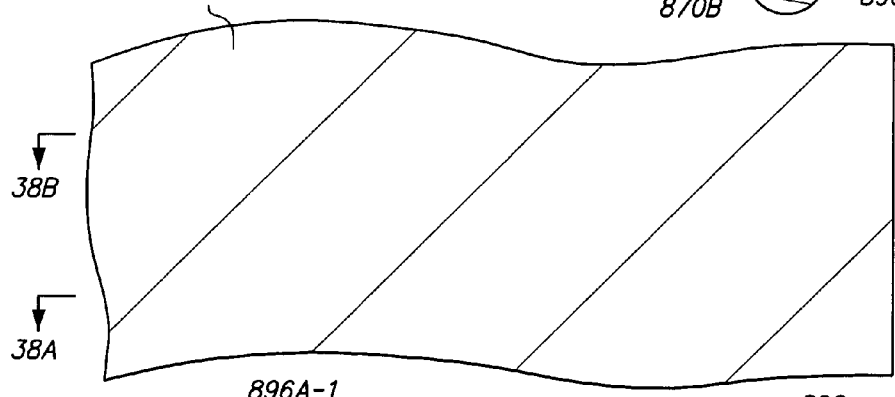
Figure 38D:
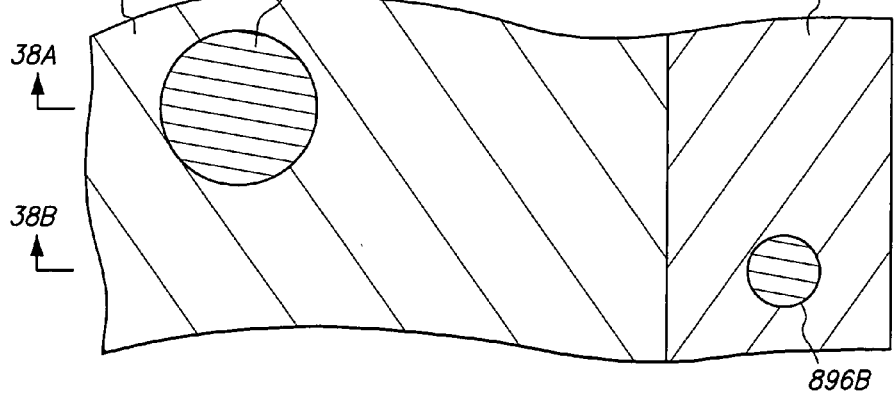
Figure 39A:
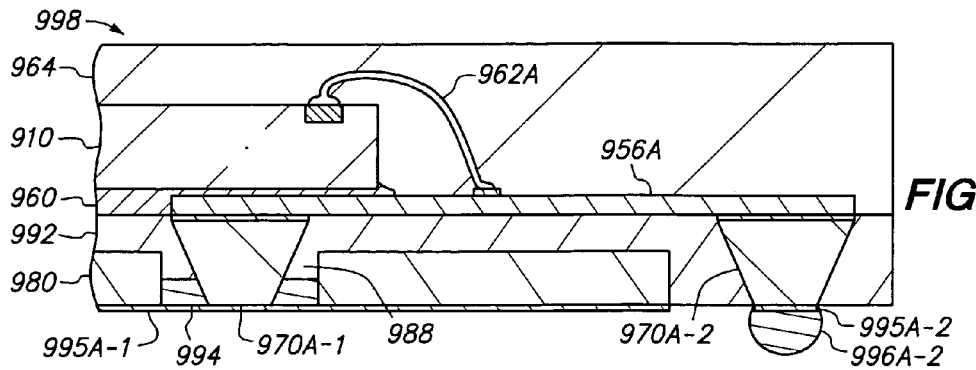
FIGS. 39A, 39B, 39C and 39D are cross-sectional, cross-sectional, top and bottom views, respectively, of a semiconductor chip assembly in accordance with a ninth embodiment of the present invention.
Figure 39B:
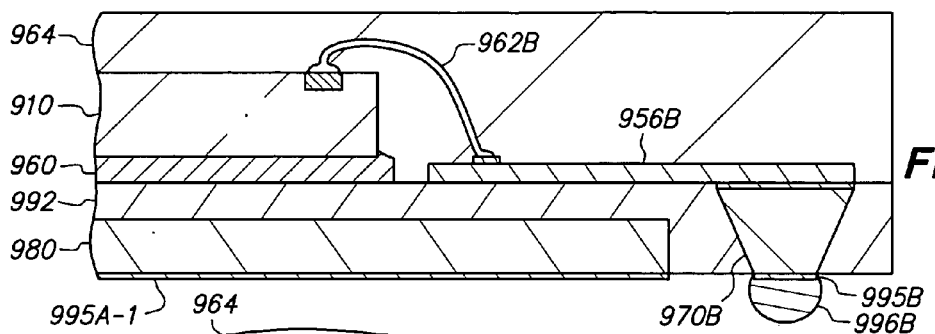
Figure 39C:
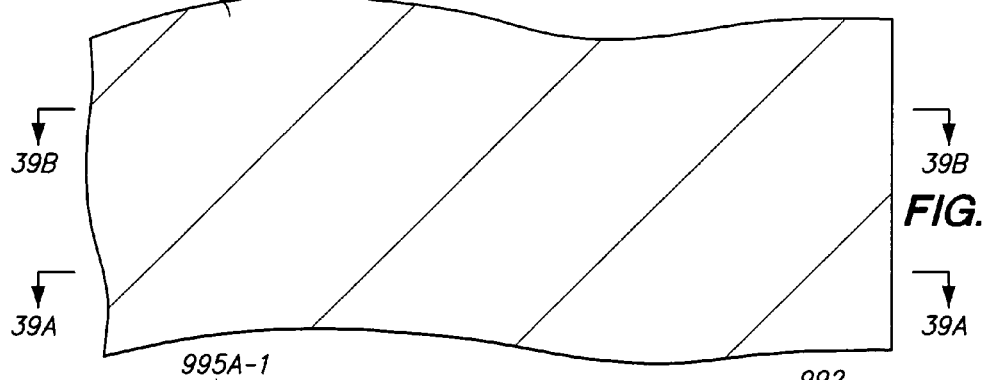
Figure 39D:
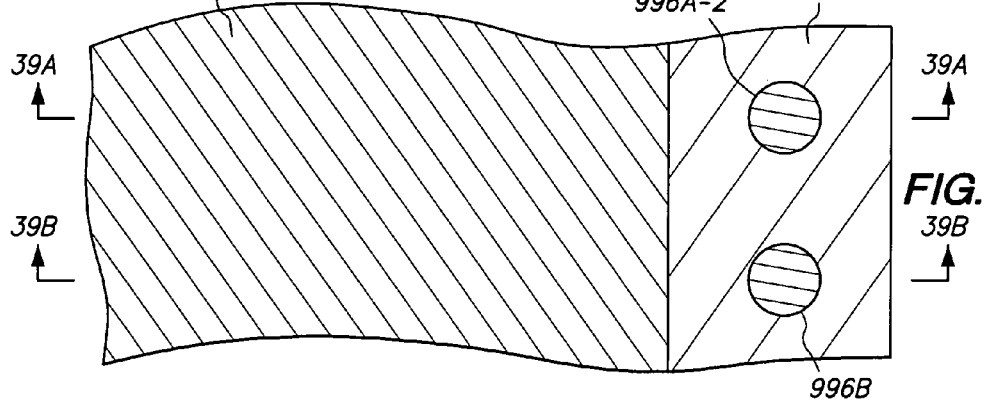
Figure 40A:
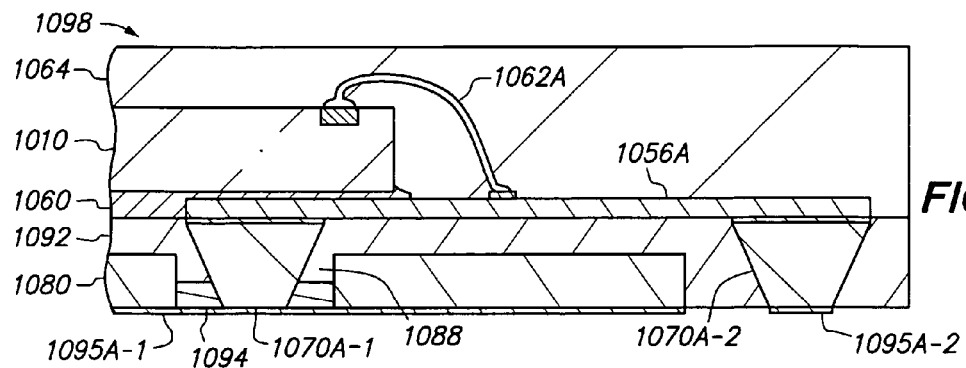
FIGS. 40A, 40B, 40C and 40D are cross-sectional, cross-sectional, top and bottom views, respectively, of a semiconductor chip assembly in accordance with a tenth embodiment of the present invention.
Figure 40B:
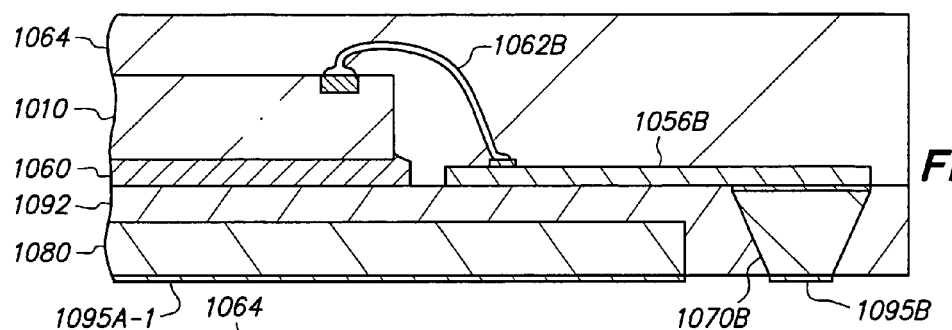
Figure 40C:
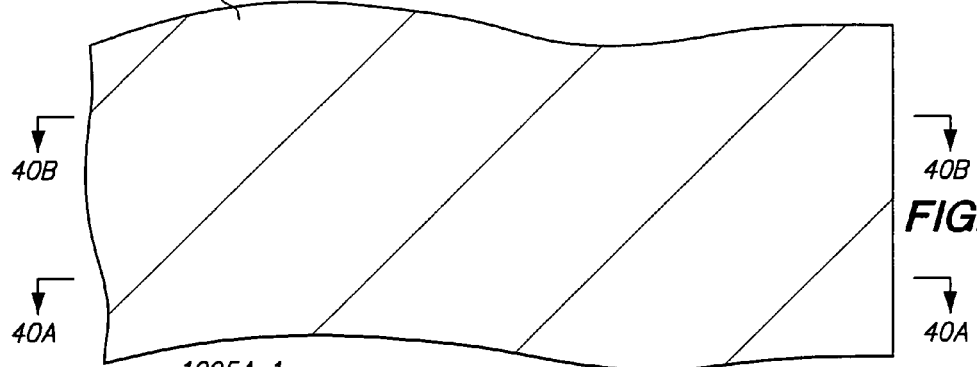
Figure 40D:
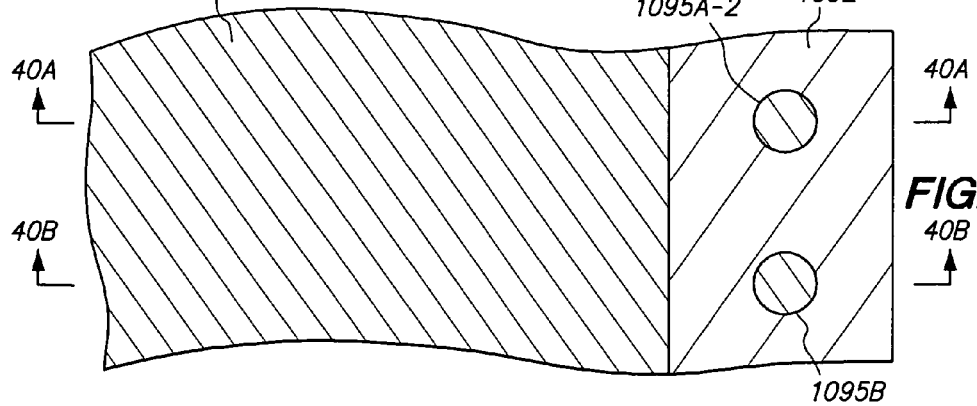
Figure 41A:
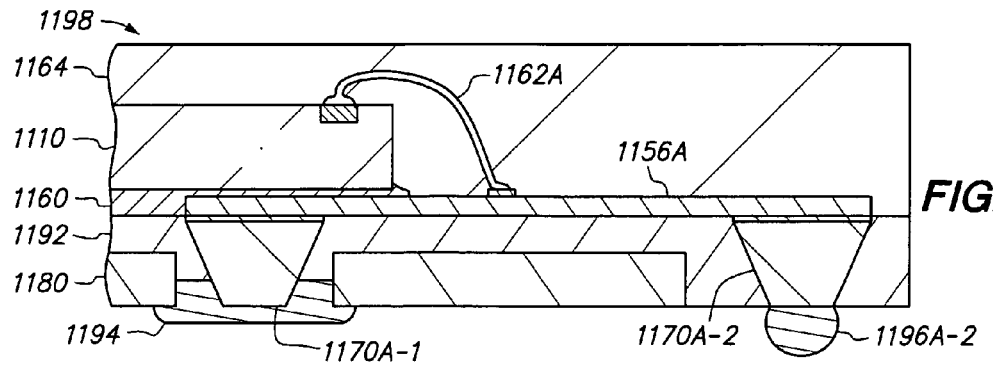
FIGS. 41A, 41B, 41C and 41D are cross-sectional, cross-sectional, top and bottom views, respectively, of a semiconductor chip assembly in accordance with an eleventh embodiment of the present invention.
Figure 41B:
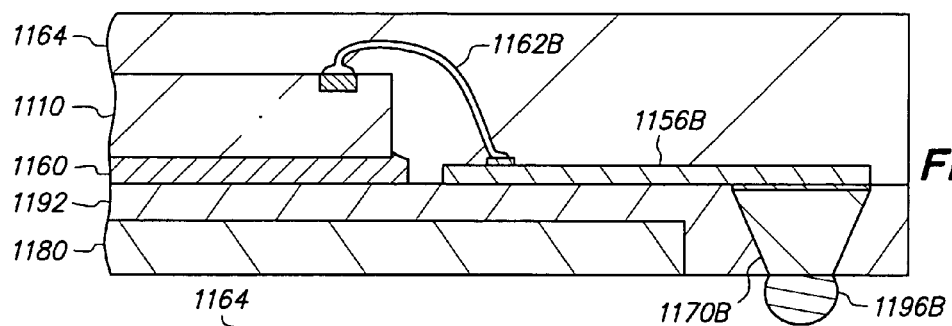
Figure 41C:
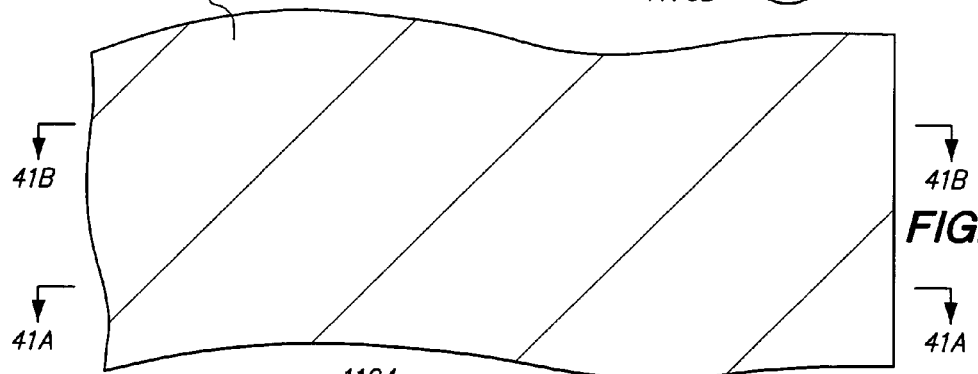
Figure 41D:
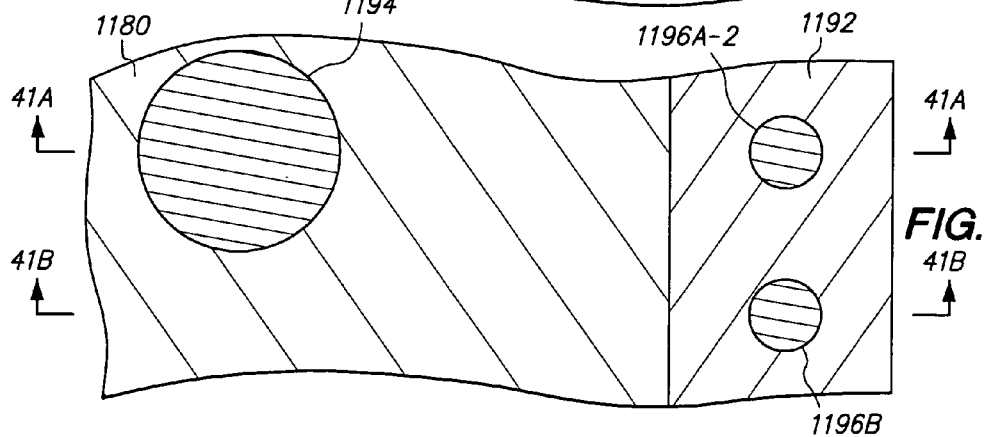
Figure 42A:
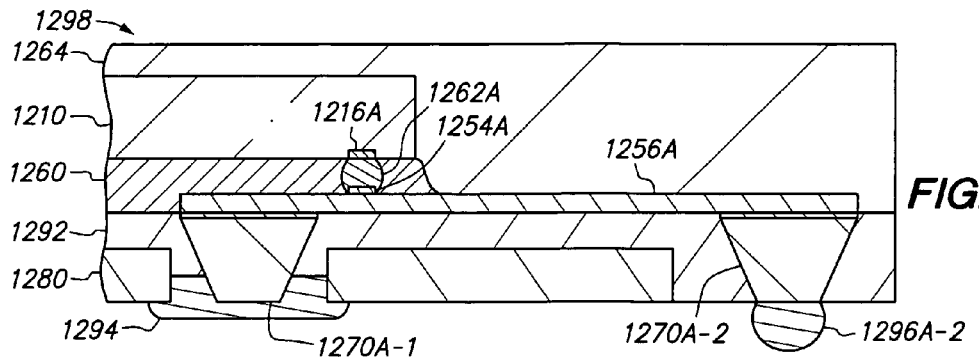
FIGS. 42A, 42B, 42C and 42D are cross-sectional, cross-sectional, top and bottom views, respectively, of a semiconductor chip assembly in accordance with a twelfth embodiment of the present invention.
Figure 42B:
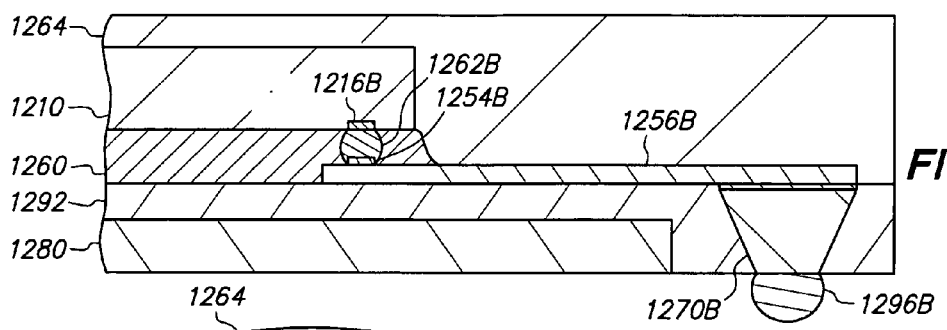
Figure 42C:
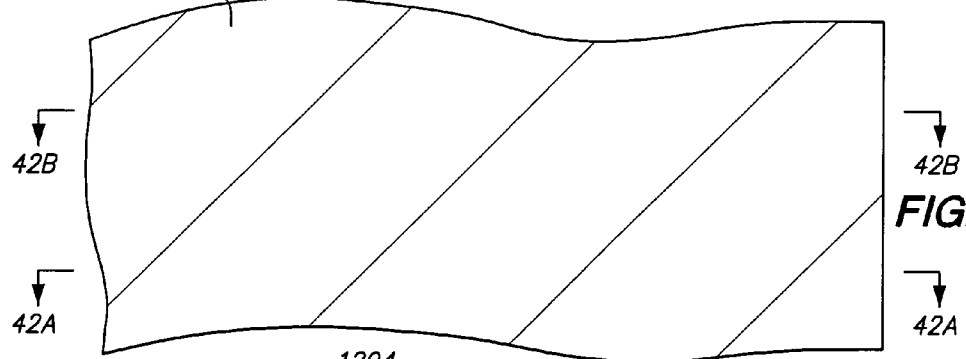
Figure 42D:
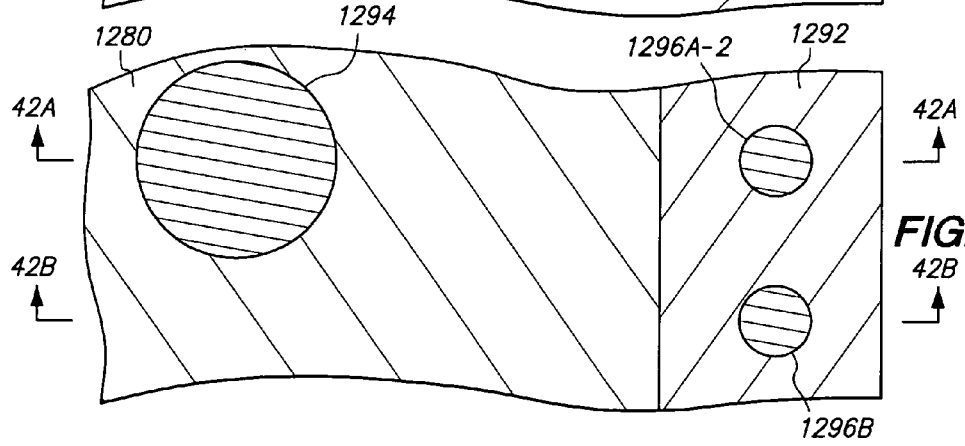

FIGS. 1A–31A, 1B–31B, 1C–31C and 1D–31D are cross-sectional, cross-sectional, top and bottom views, respectively, of a method of making a semiconductor chip assembly in accordance with a first embodiment of the present invention.

FIGS. 1A, 1B, 1C and 1D are cross-sectional, cross-sectional, top and bottom views, respectively, of semiconductor chip 110 which is an integrated circuit in which various transistors, circuits, interconnect lines and the like are formed (not shown).

Chip 110 includes opposing major surfaces 112 and 114 and has a thickness (between surfaces 112 and 114) of 150 microns. Surface 112 is the active surface and includes conductive pads 116A and 116B and passivation layer 118. Pads 116A and 116B provide bonding sites to electrically couple chip 110 with external circuitry. Pad 116A is a ground pad, and pad 116B is an input/output pad.

Pads 116A and 116B are substantially aligned with passivation layer 118 so that surface 112 is essentially flat. Alternatively, pads 116A and 116B can extend above or be recessed below passivation layer 118. Pads 116A and 116B have a length and width of 100 microns.

Pads 116A and 116B have an aluminum base that is cleaned by dipping chip 110 in a solution containing 0.05 M phosphoric acid at room temperature for 1 minute and then rinsed in distilled water. Pads 116A and 116B can have the aluminum base serve as a surface layer, or alternatively, pads 116A and 116B can be treated to include a surface layer that covers the aluminum base, depending on the nature of a connection joint that shall subsequently contact the surface layer. In this embodiment, the connection joint is a gold wire bond. Therefore, pads 116A and 116B need not be treated to accommodate this connection joint. Alternatively, pads 116A and 116B can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process.

Chip 110 includes many other pads on surface 112, and only pads 116A and 116B are shown for convenience of illustration. In addition, chip 110 has already been singulated from other chips that it was previously attached to on a wafer.

FIGS. 2A, 2B, 2C and 2D are cross-sectional, cross-sectional, top and bottom views, respectively, of metal plate 120 which includes opposing major surfaces 122 and 124. Metal plate 120 is a copper plate with a thickness of 150 microns.

FIGS. 3A, 3B, 3C and 3D are cross-sectional, cross-sectional, top and bottom views, respectively, of photoresist layer 126 formed on metal plate 120. Photoresist layer 126 is deposited using a dry film lamination process in which a hot roll presses photoresist layer 126 onto surface 124. A reticle (not shown) is positioned proximate to photoresist layer 126. Thereafter, photoresist layer 126 is patterned by selectively applying light through the reticle, applying a developer solution to remove the photoresist portions rendered soluble by the light, and then hard baking, as is conventional. As a result, photoresist layer 126 contains openings that selectively expose surface 124 of metal plate 120. In addition, surface 122 of metal plate 120 remains fully exposed. Photoresist layer 126 has a thickness of 25 microns.

FIGS. 4A, 4B, 4C and 4D are cross-sectional, cross-sectional, top and bottom views, respectively, of metal layer 128 and etch masks 136A-1, 136A-2 and 136B formed on metal plate 120.

Metal layer 128 is blanketly electroplated on surface 122, and etch masks 136A-1, 136A-2 and 136B are electroplated on the exposed portions of surface 124. Metal layer 128 and etch masks 136A-1, 136A-2 and 136B are composed of nickel and have a thickness of 2 microns.

Metal layer 128 and etch masks 136A-1, 136A-2 and 136B are simultaneously formed by an electroplating operation using photoresist layer 126 as a plating mask. Thus, metal layer 128 and etch masks 136A-1, 136A-2 and 136B are formed additively. Initially, a plating bus (not shown) is connected to metal plate 120, current is applied to the plating bus from an external power source, and metal plate 120 is submerged in an electrolytic nickel plating solution such as Technic Techni Nickel "S" at room temperature. As a result, the nickel electroplates (deposits or grows) on surface 122 and the exposed portions of surface 124. The nickel electroplating operation continues until the nickel has the desired thickness. Thereafter, the structure is removed from the electrolytic nickel plating solution and rinsed in distilled water to remove contaminants.

Metal layer 128 is a flat sheet. Etch masks 136A-1, 136A-2 and 136B have a circular shape with a diameter of 500 microns and are laterally spaced from one another.

Metal base 130 includes metal plate 120 and metal layer 128. Thus, metal base 130 has a thickness of 152 microns (150+2). Metal base 130 also includes opposing major surfaces 132 and 134. Metal layer 128 provides surface 132 and is spaced from surface 134, and metal plate 120 provides surface 134 (at surface 124) and is spaced from surface 132. Furthermore, etch masks 136A-1, 136A-2 and 136B contact surface 134.

FIGS. 5A, 5B, 5C and 5D are cross-sectional, cross-sectional, top and bottom views, respectively, of metal base 130 and etch masks 136A-1, 136A-2 and 136B after photoresist layer 126 is stripped. Photoresist layer 126 is removed using a solvent, such as a mild alkaline solution with a pH of 9, that is highly selective of photoresist with respect to copper and nickel. Therefore, no appreciable amount of metal base 130 or etch masks 136A-1, 136A-2 and 136B is removed.

FIGS. 6A, 6B, 6C and 6D are cross-sectional, cross-sectional, top and bottom views, respectively, of photoresist layers 140 and 142 formed on metal base 130 and etch masks 136A-1, 136A-2 and 136B. Photoresist layers 140 and 142 are deposited using a dry film lamination process in which hot rolls simultaneously press photoresist layers 140 and 142 onto surfaces 132 and 134, respectively. Thereafter, photoresist layer 140 is patterned by selectively applying light through a reticle (not shown), applying a developer solution to remove the photoresist portions rendered soluble by the light, and then hard baking, as is conventional. As a result, photoresist layer 140 contains openings that selectively expose surface 132 of metal base 130, and photoresist layer 142 remains unpatterned. In addition, photoresist layer 142 covers surface 134 of metal base 130 and etch masks 136A-1, 136A-2 and 136B. Photoresist layers 140 and 142 have a thickness of 25 microns.

FIGS. 7A, 7B, 7C and 7D are cross-sectional, cross-sectional, top and bottom views, respectively, of metal lines 144A and 144B formed on metal base 130.

Metal lines 144A and 144B are electroplated on the exposed portions of surface 132. Metal lines 144A and 144B are composed of copper and have a thickness of 20 microns.

Metal lines 144A and 144B are simultaneously formed by an electroplating operation using photoresist layers 140 and 142 as plating masks. Thus, metal lines 144A and 144B are formed additively. Initially, a plating bus (not shown) is connected to metal base 130, current is applied to the plating bus from an external power source, and metal base 130 is submerged in an electrolytic copper plating solution such as Sel-Rex CUBATH M™ at room temperature. As a result, the copper electroplates on the exposed portions of surface 132. The copper electroplating operation continues until the copper has the desired thickness. Thereafter, the structure is removed from the electrolytic copper plating solution and rinsed in distilled water to remove contaminants.

Metal line 144A is a flat planar lead that includes elongated region 146A with a width (orthogonal to its elongated length) of 100 microns and enlarged circular regions 148A-1 and 148A-2 with a diameter of 500 microns, and metal line 144B is a flat planar leads that includes elongated region 146B with a width (orthogonal to its elongated length) of 100 microns and enlarged circular region 148B with a diameter of 500 microns. Furthermore, etch mask 136A-1 and enlarged circular region 148A-1 are vertically aligned with one another, etch mask 136A-2 and enlarged circular region 148A-2 are vertically aligned with one another, and etch mask 136B and enlarged circular region 148B are vertically aligned with one another.

FIGS. 8A, 8B, 8C and 8D are cross-sectional, cross-sectional, top and bottom views, respectively, of metal base 130, etch masks 136A-1, 136A-2 and 136B and metal lines 144A and 144B after photoresist layers 140 and 142 are stripped. Photoresist layers 140 and 142 are removed using a solvent, such as a mild alkaline solution with a pH of 9, that is highly selective of photoresist with respect to copper and nickel. Therefore, no appreciable amount of metal base 130, etch masks 136A-1, 136A-2 and 136B or metal lines 144A and 144B is removed.

FIGS. 9A, 9B, 9C and 9D are cross-sectional, cross-sectional, top and bottom views, respectively, of photoresist layers 150 and 152 formed on metal base 130, etch masks 136A-1, 136A-2 and 136B and metal lines 144A and 144B. Photoresist layers 150 and 152 are deposited using a dry film lamination process in which hot rolls simultaneously press photoresist layers 150 and 152 onto surfaces 132 and 134, respectively. Thereafter, photoresist layer 150 is patterned by selectively applying light through a reticle (not shown), applying a developer solution to remove the photoresist portions rendered soluble by the light, and then hard baking, as is conventional. As a result, photoresist layer 150 contains openings that selectively expose metal lines 144A and 144B, and photoresist layer 152 remains unpatterned. In addition, photoresist layer 152 covers surface 134 of metal base 130 and etch masks 136A-1, 136A-2 and 136B. Photoresist layers 150 and 152 have a thickness of 25 microns.

FIGS. 10A, 10B, 10C and 10D are cross-sectional, cross-sectional, top and bottom views, respectively, of terminals 154A and 154B formed on metal lines 144A and 144B.

Terminals 154A and 154B are electroplated on the exposed portions of metal lines 144A and 144B, respectively. Terminals 154A and 154B are composed of nickel electroplated on metal lines 144A and 144B, and gold electroplated on the nickel. The nickel contacts and is sandwiched between metal lines 144A and 144B and the gold, and the gold contacts the nickel. Thus, the nickel is buried beneath the gold, and the gold is spaced and separated from metal lines 144A and 144B and is exposed. Terminals 154A and 154B have a thickness of 3.5 microns. In particular, the nickel has a thickness of 3 microns, and the gold has a thickness of 0.5 microns. For convenience of illustration, the nickel and gold are shown as a single layer.

Terminals 154A and 154B are simultaneously formed by an electroplating operation using photoresist layers 150 and 152 as plating masks. Thus, terminals 154A and 154B are formed additively. Initially, a plating bus (not shown) is connected to metal base 130, current is applied to the plating bus from an external power source, and metal base 130 is submerged in an electrolytic nickel plating solution such as Technic Techni Nickel "S" at room temperature. As a result, the nickel electroplates on the exposed portions of metal lines 144A and 144B. The nickel electroplating operation continues until the nickel has the desired thickness. Thereafter, the structure is removed from the electrolytic nickel plating solution and submerged in an electrolytic gold plating solution such as Technic Orotemp at room temperature while current is applied to the plating bus to electroplate the gold on the nickel. The gold electroplating operation continues until the gold has the desired thickness. Thereafter, the structure is removed from the electrolytic gold plating solution and rinsed in distilled water to remove contaminants.

Terminals 154A and 154B contact and are electrically connected to metal lines 144A and 144B, respectively.

Routing line 156A includes metal line 144A and terminal 154A, and routing line 156B includes metal line 144B and terminal 154B. Routing lines 156A and 156B are essentially flat planar leads that are coplanar with one another, laterally spaced from one another and have essentially identical thicknesses.

Etch masks 136A-1, 136A-2 and 136B and routing lines 156A and 156B contact metal base 130, are spaced and separated from one another, and are electrically connected to one another by metal base 130.

FIGS. 11A, 11B, 11C and 11D are cross-sectional, cross-sectional, top and bottom views, respectively, of metal base 130, etch masks 136A-1, 136A-2 and 136B and routing lines 156A and 156B after photoresist layers 150 and 152 are stripped. Photoresist layers 150 and 152 are removed using a solvent, such as a mild alkaline solution with a pH of 9, that is highly selective of photoresist with respect to copper, nickel and gold. Therefore, no appreciable amount of metal base 130, etch masks 136A-1, 136A-2 and 136B or routing lines 156A and 156B is removed.

FIGS. 12A, 12B, 12C and 12D are cross-sectional, cross-sectional, top and bottom views, respectively, of adhesive 160 formed on metal base 130 and routing line 156A.

Adhesive 160 may include an organic surface protectant such as HK 2000 which is promptly applied to the structure after photoresist layers 150 and 152 are removed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is dispensed over selected portions of metal base 130 and routing line 156A using stencil printing. During stencil printing, a stencil (not shown) is placed over metal base 130 and routing lines 156A and 156B, a stencil opening is aligned with metal base 130 and routing line 156A and offset from routing line 156B, and then a squeegee (not shown) pushes the liquid resin along the surface of the stencil opposite metal base 130 and routing lines 156A and 156B, through the stencil opening and onto metal base 130 and routing line 156A but not routing line 156B. The liquid resin is compliant enough at room temperature to conform to virtually any shape. Therefore, the liquid resin flows over and covers portions of metal base 130 and routing line 156A and remains spaced and separated from routing line 156B. Adhesive 160 has a thickness of 30 microns as measured from routing line 156A.

FIGS. 13A, 13B, 13C and 13D are cross-sectional, cross-sectional, top and bottom views, respectively, of chip 110 mechanically attached to metal base 130, etch masks 136A-1, 136A-2 and 136B and routing lines 156A and 156B by adhesive 160.

Adhesive 160 extends between and contacts chip 110 and metal base 130, and likewise, adhesive 160 extends between and contacts chip 110 and routing line 156A. Surface 114 of chip 110 faces towards metal base 130 and routing line 156A and is covered by adhesive 160, and surface 112 of chip 110 faces away from metal base 130 and routing line 156A and is exposed. Chip 110 and metal base 130 do not contact one another, and chip 110 and routing line 156A do not contact one another.

Adhesive 160 is sandwiched between chip 110 and metal base 130 and between chip 110 and routing line 156A using relatively low pressure from a pick-up head that places chip 110 on adhesive 160, holds chip 110 against adhesive 160 for 5 seconds and then releases chip 110. The pick-up head is heated to a relatively low temperature such as 150° C., and adhesive 160 receives heat from the pick-up head transferred through chip 110. As a result, adhesive 160 proximate to chip 110 is partially polymerized (B stage) and forms a gel but is not fully cured, and adhesive 160 that is partially polymerized provides a loose mechanical bond between chip 110 and metal base 130 and between chip 110 and routing line 156A.

Chip 110 and metal base 130 are positioned relative to one another so that chip 110 is disposed within the periphery of adhesive 160. Chip 110 and metal base 130 can be aligned using an automated pattern recognition system.

Thereafter, the structure is placed in an oven and adhesive 160 is fully cured (C stage) and hardened at relatively low temperature in the range of 200 to 250° C. to form a solid adhesive insulative thermosetting polyimide layer that mechanically attaches chip 110 to metal base 130 and routing line 156A. Adhesive 160 is 5 microns thick between chip 110 and routing line 156A.

At this stage, routing line 156A extends within and outside the periphery of chip 110, routing line 156B is disposed outside the periphery of chip 110, and metal base 130 and routing lines 156A and 156B are disposed vertically beyond chip 110.

FIGS. 14A, 14B, 14C and 14D are cross-sectional, cross-sectional, top and bottom views, respectively, of connection joints 162A and 162B formed on pads 116A and 116B and routing lines 156A and 156B.

Connection joint 162A is a wire bond composed of gold that is ball bonded to pad 116A and then wedge bonded to terminal 154A. Likewise, connection joint 162B is a wire bond composed of gold that is ball bonded to pad 116B and then wedge bonded to terminal 154B. Thus, connection joint 162A contacts and electrically connects pad 116A and routing line 156A, and connection joint 162B contacts and electrically connects pad 116B and routing line 156B. Furthermore, connection joints 162A and 162B extend within and outside the periphery of chip 110.

At this stage, pad 116A is electrically connected to routing line 156A by connection joint 162A, pad 116B is electrically connected to routing line 156B by connection joint 162B, and routing lines 156A and 156B are electrically connected to one another by metal base 130. As a result, pads 116A and 116B are electrically connected to one another by metal base 130, routing lines 156A and 156B and connection joints 162A and 162B.

FIGS. 15A, 15B, 15C and 15D are cross-sectional, cross-sectional, top and bottom views, respectively, of encapsulant 164 formed on chip 110, metal base 130, routing lines 156A and 156B, adhesive 160 and connection joints 162A and 162B.

Encapsulant 164 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "uplatens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 130. However, the upper mold section is spaced from connection joints 162A and 162B by 100 microns. As a result, the molding compound contacts the exposed portions of the chip 110, metal base 130, routing lines 156A and 156B, adhesive 160 and connection joints 162A and 162B in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 164 contacts and covers chip 110, metal base 130, routing lines 156A and 156B, adhesive 160 and connection joints 162A and 162B and is spaced from etch masks 136A-1, 136A-2 and 136B.

Encapsulant 164 is a solid adherent compressible protective layer that provides environmental protection such as moisture resistance and particle protection for chip 110 as well as mechanical support for routing lines 156A and 156B outside the periphery of chip 110.

Encapsulant 164 extends vertically beyond chip 110, metal base 130, etch masks 136A-1, 136A-2 and 136B, routing lines 156A and 156B, adhesive 160 and connection joints 162A and 162B, and is 100 microns thick beyond connection joints 162A and 162B. Furthermore, metal base 130 is disposed vertically beyond encapsulant 164.

FIGS. 16A, 16B, 16C and 16D are cross-sectional, cross-sectional, top and bottom views, respectively, of pillars 170A-1, 170A-2 and 170B partially formed from metal base 130.

Pillars 170A-1, 170A-2 and 170B are partially formed by applying a first wet chemical etch to metal base 130 using etch masks 136A-1, 136A-2 and 136B to selectively protect metal base 130. Metal base 130 is provided by metal plate 120 and metal layer 128. Metal plate 120 is copper and metal layer 128 is nickel. Etch masks 136A-1, 136A-2 and 136B contact metal plate 120 at surface 134 and are nickel.

A first back-side wet chemical etch is applied to surface 134 of metal base 130 and etch masks 136A-1, 136A-2 and 136B. For instance, the first wet chemical etch can be sprayed on surface 134 and etch masks 136A-1, 136A-2 and 136B, or the structure can be dipped in the first wet chemical etch since encapsulant 164 provides front-side protection.

The first wet chemical etch is a copper etching solution, such as a solution containing alkaline ammonia, that is highly selective of copper with respect to nickel and the molding compound, and therefore, highly selective of metal plate 120 with respect to metal layer 128, etch masks 136A-1, 136A-2 and 136B and encapsulant 164.

The first wet chemical etch etches completely through metal plate 120 and removes most of metal plate 120, thereby effecting a pattern transfer of etch masks 136A-1, 136A-2 and 136B onto metal plate 120 and exposing metal layer 128, but not exposing routing lines 156A and 156B, adhesive 160 or encapsulant 164. However, unetched portions of metal plate 120 defined by etch masks 136A-1, 136A-2 and 136B remain intact and form portions of pillars 170A-1, 170A-2 and 170B, respectively. In addition, no appreciable amount of metal layer 128, etch masks 136A-1, 136A-2 and 136B or encapsulant 164 is removed. Furthermore, metal layer 128 protects the underlying routing lines 156A and 156B from the first wet chemical etch.

The optimal etch time for exposing the structure to the first wet chemical etch in order to etch through metal plate 120 and partially form pillars 170A-1, 170A-2 and 170B with the desired shapes and dimensions without excessively exposing the nickel features to the first wet chemical etch can be established through trial and error.

FIGS. 17A, 17B, 17C and 17D are cross-sectional, cross-sectional, top and bottom views, respectively, of the structure after etch masks 136A-1, 136A-2 and 136B are removed and pillars 170A-1, 170A-2 and 170B are fully formed from metal base 130.

Etch masks 136A-1, 136A-2 and 136B are removed and pillars 170A-1, 170A-2 and 170B are fully formed by applying a second wet chemical etch.

A second back-side wet chemical etch is applied to metal layer 128, etch masks 136A-1, 136A-2 and 136B and pillars 170A-1, 170A-2 and 170B. For instance, the second wet chemical etch can be sprayed on metal layer 128, etch masks 136A-1, 136A-2 and 136B and pillars 170A-1, 170A-2 and 170B, or the structure can be dipped in the second wet chemical etch since encapsulant 164 provides front-side protection.

The second wet chemical etch is a nickel etching solution, such as a dilute mixture of nitric and hydrochloric acid, that is highly selective of nickel with respect to polyimide and the molding compound.

The second wet chemical etch removes etch masks 136A-1, 136A-2 and 136B, thereby exposing surfaces 174A-1, 174A-2 and 174B of pillars 170A-1, 170A-2 and 170B, respectively.

The second wet chemical etch also etches completely through metal layer 128 and removes most of metal layer 128, thereby effecting a pattern transfer of etch masks 136A-1, 136A-2 and 136B onto metal layer 128 and exposing routing lines 156A and 156B, adhesive 160 and encapsulant 164. However, unetched portions of metal layer 128 defined by etch masks 136A-1, 136A-2 and 136B remain intact and form portions of pillars 170A-1, 170A-2 and 170B, respectively. In addition, no appreciable amount of adhesive 160 or encapsulant 164 is removed. Furthermore, metal lines 144A and 144B protect the underlying terminals 154A and 154B from the second wet chemical etch.

Since metal layer 128 and etch masks 136A-1, 136A-2 and 136B are extremely thin relative to the copper of routing lines 156A and 156B and pillars 170A-1, 170A-2 and 170B, and the structure is removed from the nickel etching solution soon after the exposed portions of metal layer 128 are removed and etch masks 136A-1, 136A-2 and 136B are stripped, it is not critical that the nickel etching solution be highly selective of nickel with respect to copper. In fact, the nickel etching solution is also selective of copper. As a result, the nickel etching solution also removes a slight amount of the exposed copper features. However, the nickel etching solution is not applied long enough to appreciably affect the exposed copper features. Therefore, the nickel etching solution has no appreciable affect on routing lines 156A and 156B or pillars 170A-1, 170A-2 and 170B.

The second wet chemical etch may slightly undercut the nickel portion of pillars 170A-1 and 170A-2 and 170B relative to the copper portion of pillars 170A-1 and 170A-2 and 170B. For convenience of explanation, this slight undercut is ignored.

The optimal etch time for exposing the structure to the second wet chemical etch in order to etch through metal layer 128, remove etch masks 136A-1, 136A-2 and 136B and form pillars 170A-1, 170A-2 and 170B with the desired shapes and dimensions without excessively exposing the copper features to the second wet chemical etch can be established through trial and error.

Pillars 170A-1, 170A-2 and 170B are formed by applying a wet chemical etch to metal base 130 using etch masks 136A-1, 136A-2 and 136B to selectively protect metal base 130. Pillars 170A-1, 170A-2 and 170B are unetched portions of metal base 130 defined by etch masks 136A-1, 136A-2 and 136B, respectively, that contact routing lines 156A, 156A and 156B, respectively, and are formed subtractively.

The wet chemical etch is provided by sequentially applying the first and second wet chemical etches using the copper and nickel etching solutions. The wet chemical etch etches completely through metal base 130 and removes most of metal base 130, thereby effecting a pattern transfer of etch masks 136A-1, 136A-2 and 136B onto metal base 130, exposing routing lines 156A and 156B, adhesive 160 and encapsulant 164, and reducing but not eliminating contact area between metal base 130 and routing lines 156A and 156B.

The wet chemical etch laterally undercuts metal base 130 relative to etch masks 136A-1, 136A-2 and 136B, causing pillars 170A-1 and 170A-2 to taper inwardly as they extend vertically from routing line 156A and causing pillar 170B to taper inwardly as it extends vertically from routing line 156B. A suitable taper is between 45 and slightly less than 90 degrees, such as approximately 75 degrees.

The wet chemical etch also electrically isolates routing lines 156A and 156B from one another, and consequently electrically isolates connection joints 162A and 162B from one another and pads 116A and 116B from one another. That is, since pillars 170A-1 and 170A-2 are the only unetched portions of metal base 130 that contact routing line 156A after the etch occurs, and pillar 170B is the only unetched portion of metal base 130 that contacts routing line 156B after the etch occurs, and pillars 170A-1, 170A-2 and 170B are spaced and separated from one another, metal base 130 no longer electrically connects routing lines 156A and 156B.

Encapsulant 164 provides mechanical support for routing lines 156A and 156B and pillars 170A-1, 170A-2 and 170B and reduces mechanical strain on adhesive 160. Encapsulant 164 protects routing lines 156A and 156B and pillars 170A-1, 170A-2 and 170B from mechanical damage by the wet chemical etch and subsequent cleaning steps (such as rinsing in distilled water and air blowing). For instance, encapsulant 164 absorbs physical force of the wet chemical etch and cleaning steps that might otherwise separate routing line 156A from pillars 170A-1 and 170A-2 and separate routing line 156B from pillar 170B. Thus, encapsulant 164 improves structural integrity and allows the wet chemical etch and subsequent cleaning steps to be applied more vigorously, thereby improving manufacturing throughput.

Pillar 170A-1 includes opposing surfaces 172A-1 and 174A-1 and tapered sidewalls 176A-1 therebetween, pillar 170A-2 includes opposing surfaces 172A-2 and 174A-2 and tapered sidewalls 176A-2 therebetween, and pillar 170B includes opposing surfaces 172B and 174B and tapered sidewalls 176B therebetween. Surfaces 172A-1, 172A-2 and 172B of pillars 170A-1, 170A-2 and 170B constitute unetched portions of surface 132 of metal base 130 provided by metal layer 128, and surfaces 174A-1, 174A-2 and 174B of pillars 170A-1, 170A-2 and 170B constitute unetched portions of surface 134 of metal base 130 provided by metal plate 120.

Surfaces 172A-1 and 172A-2 contact and face towards routing line 156A, and surface 172B contacts and faces towards routing line 156B. Surfaces 174A-1 and 174A-2 are spaced from and face away from routing line 156A and are exposed, and surface 174B is spaced from and faces away from routing line 156B and is exposed. Furthermore, surfaces 174A-1 and 174A-2 contacted and faced towards and were covered by etch masks 136A-1 and 136A-2, respectively, before etch masks 136A-1 and 136A-2 were removed, and surface 174B contacted and faced towards and was covered by etch mask 136B before etch mask 136B was removed. Surfaces 172A-1, 172A-2, 172B, 174A-1, 174A-2 and 174B are flat and parallel to one another. Tapered sidewalls 176A-1 are adjacent to surfaces 172A-1 and 174A-1 and slant inwardly towards surface 174A-1, tapered sidewalls 176A-2 are adjacent to surfaces 172A-2 and 174A-2 and slant inwardly towards surface 174A-2, and tapered sidewalls 176B are adjacent to surfaces 172B and 174B and slant inwardly towards surface 174B.

Pillar 170A-1 has a conical shape with a height (between surfaces 172A-1 and 174A-1) of 152 microns and a diameter that decreases as the height increases (towards surface 174A-1 and away from surface 172A-1). Surface 172A-1 has a circular shape with a diameter of 500 microns, and surface 174A-1 has a circular shape with a diameter of 350 microns. Surfaces 172A-1 and 174A-1 are vertically aligned with enlarged circular region 148A-1 and one another. Thus, surface 174A-1 is concentrically disposed within the surface areas of enlarged circular region 148A-1 and surface 172A-

1, and the periphery of surface 174A-1 is laterally offset from the peripheries of enlarged circular region 148A-1 and surface 172A-1.

Pillar 170A-2 has a conical shape with a height (between surfaces 172A-2 and 174A-2) of 152 microns and a diameter that decreases as the height increases (towards surface 174A-2 and away from surface 172A-2). Surface 172A-2 has a circular shape with a diameter of 500 microns, and surface 174A-2 has a circular shape with a diameter of 350 microns. Surfaces 172A-2 and 174A-2 are vertically aligned with enlarged circular region 148A-2 and one another. Thus, surface 174A-2 is concentrically disposed within the surface areas of enlarged circular region 148A-2 and surface 172A-2, and the periphery of surface 174A-2 is laterally offset from the peripheries of enlarged circular region 148A-2 and surface 172A-2.

Pillar 170B has a conical shape with a height (between surfaces 172B and 174B) of 152 microns and a diameter that decreases as the height increases (towards surface 174B and away from surface 172B). Surface 172B has a circular shape with a diameter of 500 microns, and surface 174B has a circular shape with a diameter of 350 microns. Surfaces 172B and 174B are vertically aligned with enlarged circular region 148B and one another. Thus, surface 174B is concentrically disposed within the surface areas of enlarged circular region 148B and surface 172B, and the periphery of surface 174B is laterally offset from the peripheries of enlarged circular region 148B and surface 172B.

Routing line 156A and pillar 170A-1 contact one another, adhere to one another, are metallurgically bonded to one another, are electrically connected to one another and are non-integral with one another. In addition, routing line 156A and pillar 170A-1 are adjacent to one another, routing line 156A extends laterally from pillar 170A-1, and pillar 170A-1 extends vertically from routing line 156A.

Routing line 156A and pillar 170A-2 contact one another, adhere to one another, are metallurgically bonded to one another, are electrically connected to one another and are non-integral with one another. In addition, routing line 156A and pillar 170A-2 are adjacent to one another, routing line 156A extends laterally from pillar 170A-2, and pillar 170A-2 extends vertically from routing line 156A.

Routing line 156B and pillar 170B contact one another, adhere to one another, are metallurgically bonded to one another, are electrically connected to one another and are non-integral with one another. In addition, routing line 156B and pillar 170B are adjacent to one another, routing line 156B extends laterally from pillar 170B, and pillar 170B extends vertically from routing line 156B.

Pillars 170A-1, 170A-2 and 170B are coplanar with one another, laterally spaced from one another and have essentially identical thicknesses. Furthermore, pillars 170A-1, 170A-2 and 170B are disposed vertically beyond chip 110, adhesive 160, connection joints 162A and 162B and encapsulant 164, and pillar 170A-1 is disposed within the periphery of chip 110, however pillars 170A-2 and 170B are disposed outside the periphery of chip 110.

Conductive trace 178A includes routing line 156A and pillars 170A-1 and 170A-2 and is electrically connected to pad 116A by connection joint 162A, and conductive trace 178B includes routing line 156B and pillar 170B and is electrically connected to pad 116B by connection joint 162B. Conductive trace 178A is adapted for providing horizontal and vertical routing between pad 116A and a ground plane pad (using pillar 170A-1) and between pad 116A and a next level assembly (using pillar 170A-2), and conductive trace 178B is adapted for providing horizontal and vertical routing between pad 116B and a next level assembly (using pillar 170B).

At this stage, routing lines 156A and 156B, adhesive 160, encapsulant 164 and pillars 170A-1, 170A-2 and 170B are exposed, and encapsulant 164 provides mechanical support for adhesive 160 and conductive traces 178A and 178B that is particularly useful after most of metal base 130 is removed by the etch.

FIGS. 18A, 18B, 18C and 18D are cross-sectional, cross-sectional, top and bottom views, respectively, of ground plane 180 which includes opposing major surfaces 182 and 184. Ground plane 180 is a copper plate with a thickness of 100 microns.

FIGS. 19A, 19B, 19C and 19D are cross-sectional, cross-sectional, top and bottom views, respectively, of photoresist layers 186 and 187 formed on ground plane 180. Photoresist layers 186 and 187 are deposited using a dry film lamination process in which hot rolls simultaneously press photoresist layers 186 and 187 onto surfaces 182 and 184, respectively. Reticles (not shown) are positioned proximate to photoresist layers 186 and 187. Thereafter, photoresist layers 186 and 187 are simultaneously patterned by selectively applying light through the reticles, applying a developer solution to remove the photoresist portions rendered soluble by the light, and then hard baking, as is conventional. As a result, photoresist layer 186 contains an opening with a diameter of 300 microns that selectively exposes surface 182 of ground plane 180, and photoresist layer 187 contains an opening with a diameter of 300 microns that selectively exposes surface 184 of ground plane 180. Photoresist layers 186 and 187 have a thickness of 25 microns.

FIGS. 20A, 20B, 20C and 20D are cross-sectional, cross-sectional, top and bottom views, respectively, of opening 188 formed in ground plane 180.

Opening 188 is formed by a wet chemical etch that provides a front-side etch through the opening in photoresist layer 186 to the exposed portion of surface 182 and a back-side etch through the opening in photoresist layer 187 to the exposed portion of surface 184. For instance, the wet chemical etch can be sprayed on the front and back sides of the structure, or the structure can be dipped in the wet chemical.

The wet chemical etch is a copper etching solution, such as a solution containing alkaline ammonia, that is highly selective of copper.

The wet chemical front-side and back-side etches are applied simultaneously and etch vertically through ground plane 180. The wet chemical etch also laterally undercuts ground plane 180 relative to photoresist layers 186 and 187, causing opening 188 to have a larger diameter than the openings in photoresist layers 186 and 187.

Opening 188 has a diameter of 600 microns at surfaces 182 and 184 and vertical sidewalls therebetween. Thus, opening 188 has opposing ends at surfaces 182 and 184 that are vertically aligned with one another, a cylindrical shape with a depth (between surfaces 182 and 184) of 100 microns and a constant diameter of 600 microns between surfaces 182 and 184.

The optimal etch time for exposing ground plane 180 to the wet chemical etch in order to form opening 188 with the desired shape and dimensions can be established through trial and error.

FIGS. 21A, 21B, 21C and 21D are cross-sectional, cross-sectional, top and bottom views, respectively, of ground plane 180 after photoresist layers 186 and 187 are stripped. Photoresist layers 186 and 187 are removed using a solvent, such as a mild alkaline solution with a pH of 9, that is highly selective of photoresist with respect to copper. Therefore, no appreciable amount of ground plane 180 is removed.

FIGS. 22A, 22B, 22C and 22D are cross-sectional, cross-sectional, top and bottom views, respectively, of platen 190.

Platen 190 includes trenches 191 at a contact surface. Trenches 191 are arranged as a grid and have a depth of 50 microns and a width of 100 microns.

Platen 190 also includes a copper plate with a thickness of 200 microns and a release sheet with a thickness of 2 microns. A suitable release sheet is a PVF film such as Dupont Tedlar or Teflon. Platen 190 is formed by etching the copper plate to form trenches 191, and then coating the release sheet on the copper plate. The release sheet covers the copper plate and trenches 191 and provides the contact surface for platen 190. For convenience of illustration, the copper plate and the release sheet are shown as a single layer.

FIGS. 23A, 23B, 23C and 23D are cross-sectional, cross-sectional, top and bottom views, respectively, of insulative base 192 formed on routing lines 156A and 156B, adhesive 160, encapsulant 164 and pillars 170A-1, 170A-2 and 170B.

Insulative base 192 may include an organic surface protectant such as HK 2000 which is promptly applied to the structure after etch masks 136A-1, 136A-2 and 136B are removed and pillars 170A-1, 170A-2 and 170B are formed to reduce native oxide formation on the exposed copper surfaces. The use of organic surface protectant layers in insulative bases for semiconductor chip assemblies is well-known in the art.

Thereafter, a liquid resin (A stage) such as Hysol 308 is dispensed over routing lines 156A and 156B, adhesive 160, encapsulant 164 and pillars 170A-1, 170A-2 and 170B. The liquid resin is compliant enough at room temperature to conform to virtually any shape. Therefore, the liquid resin flows over and covers routing lines 156A and 156B, adhesive 160, encapsulant 164 and pillars 170A-1, 170A-2 and 170B.

Thereafter, the structure is placed in an oven and insulative base 192 is heated to a relatively low temperature such as 100° C. As a result, insulative base 192 is partially polymerized (B stage) and forms a gel but is not fully cured. Insulative base 192 continues to cover routing lines 156A and 156B, adhesive 160, encapsulant 164 and pillars 170A-1, 170A-2 and 170B, and routing lines 156A and 156B, adhesive 160 and pillars 170A-1, 170A-2 and 170B are not exposed. Insulative base 192 extends vertically beyond chip 110, routing lines 156A and 156B, adhesive 160, connection joints 162A and 162B, encapsulant 164 and pillars 170A-1, 170A-2 and 170B.

For convenience of illustration, insulative base 192 is shown below chip 110, routing lines 156A and 156B, adhesive 160, connection joints 162A and 162B, encapsulant 164 and pillars 170A-1, 170A-2 and 170B to retain a single orientation throughout the figures for ease of comparison between the figures, although in this step the structure would be inverted so that gravitational force would assist the liquid resin flow.

FIGS. 24A, 24B, 24C and 24D are cross-sectional, cross-sectional, top and bottom views, respectively, of ground plane 180 placed on insulative base 192.

Chip 110 and ground plane 180 are positioned relative to one another so that chip 110 and pillar 170A-1 are disposed within the periphery of ground plane 180, pillars 170A-2 and 170B are disposed outside the periphery of ground plane 180, surface 182 of ground plane 180 faces towards chip 110 and contacts insulative base 192, surface 184 of ground plane 180 faces away from chip 110 and is exposed, and pillar 170A-1 and opening 188 are vertically aligned with one another. Chip 110 and ground plane 180 can be aligned using an automated pattern recognition system.

At this stage, pillar 170A-1 is covered by insulative base 192 which is a gel, and pillar 170A-1 remains spaced and separated from ground plane 180 and outside opening 188. In addition, insulative base 192 has sufficient surface tension to support ground plane 180, and insulative base 192 remains spaced and separated from surface 184 of ground plane 180.

For convenience of illustration, ground plane 180 is shown below chip 110, routing lines 156A and 156B, adhesive 160, connection joints 162A and 162B and encapsulant 164 to retain a single orientation throughout the figures for ease of comparison between the figures, although in this step the structure would be inverted so that ground plane 180 rests on insulative base 192.

FIGS. 25A, 25B, 25C and 25D are cross-sectional, cross-sectional, top and bottom views, respectively, of pillar 170A-1 inserted into opening 188 of ground plane 180.

Ground plane 180 and platen 190 are positioned relative to one another so that the contact surface of platen 190, which includes the release sheet and trenches 191, faces towards surface 184 of ground plane 180.

Platen 190 then moves vertically towards and contacts and applies relatively low pressure to surface 184 of ground plane 180. As a result, ground plane 180 and platen 190 move vertically towards chip 110 while chip 110 remains stationary. At this stage, pillar 170A-1 is covered by insulative base 192 which is a gel.

As ground plane 180 and platen 190 continue to move vertically towards chip 110, insulative base 192 proximate to pillar 170A-1 enters opening 188, and pillar 170A-1 remains spaced and separated from ground plane 180 and outside opening 188. In addition, insulative base 192 is squeezed and becomes thinner between routing line 156A and ground plane 180, and insulative base 192 remains spaced from surface 184 of ground plane 180 and platen 190.

As ground plane 180 and platen 190 continue to move vertically towards chip 110, pillar 170A-1 enters opening 188. Since pillar 170A-1 has a diameter at surface 174A-1 of 350 microns, and opening 188 has a diameter at surface 182 of 600 microns, pillar 170A-1 is readily inserted into opening 188 and alignment tolerances are accounted for. Furthermore, pillar 170A-1 remains spaced and separated from ground plane 180 and platen 190.

As ground plane 180 and platen 190 continue to move vertically towards chip 110, pillar 170A-1 extends further into opening 188. Since pillar 170A-1 has a diameter at surface 172 of 500 microns, a diameter at surface 174A-1 of 350 microns and tapered sidewalls 176A-1 therebetween, and opening 188 has a constant diameter of 600 microns, pillar 170A-1 becomes increasingly tightly fit within opening 188 as pillar 170A-1 approaches surface 184 but remains spaced and separated from ground plane 180 and platen 190. In addition, pillar 170A-1 and insulative base 192 fill opening 188, and insulative base 192 is squeezed through opening 188, is squeezed into trenches 191, contacts surface 184 of ground plane 180 and contacts the contact surface of platen 190 (the release sheet).

As ground plane 180 and platen 190 continue to move vertically towards chip 110, pillar 170A-1 eventually extends through opening 188 and contacts platen 190. As a result, ground plane 180 and platen 190 ceases to move vertically towards chip 110, pillar 170A-1 tunnels no further into opening 188, and the pressure applied to platen 190 is released. Pillar 170A-1 remains spaced and separated from ground plane 180, and surface 174A-1 of pillar 170A-1 is laterally aligned with surface 184 of ground plane 180. Likewise, pillars 170A-2 and 170B contact platen 190 and remain spaced and separated from ground plane 180, and surfaces 174A-2 and 174B of pillars 170A-2 and 170B are laterally aligned with surface 184 of ground plane 180.

Thus, pillar 170A-1 is urged into pressure engagement with platen 190. Moreover, insulative base 192 contacts and covers tapered sidewalls 176A-1 of pillar 170A-1, surface 182 of ground plane 180 and the sidewalls of opening 188, extends through opening 188, contacts portions of surface 174A-1 of pillar 170A-1 and surface 184 of ground plane 180, remains spaced and separated from other portions of surface 174A-1 of pillar 170A-1 and surface 184 of ground plane 180 and remains a gel. As a result, insulative base 192 provides a loose mechanical bond between pillar 170A-1 and ground plane 180.

For convenience of illustration, ground plane 180 and platen 190 are shown below chip 110, routing lines 156A and 156B, adhesive 160, connection joints 162A and 162B and encapsulant 164 to retain a single orientation throughout the figures for ease of comparison between the figures, although in this step the structure would be inverted so that platen 190 can press ground plane 180 downwardly onto the remaining structure while pillar 170A-1 remains stationary.

FIGS. 26A, 26B, 26C and 26D are cross-sectional, cross-sectional, top and bottom views, respectively, of the structure after insulative base 192 is hardened.

The structure is placed in an oven while platen 190 continues to contact the structure and insulative base 192 is fully cured (C stage) and hardened at relatively low temperature in the range of 200 to 250° C. to form a solid adhesive insulative thermosetting polyimide layer that protects routing lines 156A and 156B and enhances the mechanically attachment of ground plane 180. Furthermore, platen 190 holds ground plane 180 in the desired position and prevents ground plane 180 from being pushed away from chip 110 by the surface tension of insulative base 192 while insulative base 192 is a gel.

Thereafter, platen 190 is withdrawn from the structure. The copper plate is lifted off the release sheet, which adheres weakly to the structure, and then the release sheet is peeled-off the structure.

In this manner, insulative base 192 is hardened, thereby transforming a loose unsecured relation between pillar 170A-1 and ground plane 180 into a secure mechanical attachment between pillar 170A-1 and ground plane 180. Insulative base 192 provides a strong, stable structure that holds pillar 170A-1 and ground plane 180 together and ensures a reliable physical connection between pillar 170A-1 and ground plane 180.

Insulative base 192 contacts and covers tapered sidewalls 176A-1 of pillar 170A-1, surface 182 of ground plane 180 and the sidewalls of opening 188, extends through opening 188, contacts portions of surface 174A-1 of pillar 170A-1 and surface 184 of ground plane 180, remains spaced and separated from other portions of surface 174A-1 of pillar 170A-1 and surface 184 of ground plane 180 and is hardened. Insulative base 192 also forms a grid-like pattern on surface 184 of ground plane 180 that resembles the grid-like pattern of trenches 191.

At this stage, chip 110 is proximate to and disposed within the periphery of ground plane 180. Surfaces 112 and 114 of chip 110 are essentially parallel to surfaces 182 and 184 of ground plane 180. Routing lines 156A and 156B are spaced and separated from ground plane 180. Pillar 170A-1 extends into and through opening 188, is laterally aligned with ground plane 180 and remains spaced and separated from and electrically isolated from ground plane 180. Pillars 170A-2 and 170B are disposed outside the periphery of ground plane 180, are laterally aligned with ground plane 180 and remain spaced and separated from and electrically isolated from ground plane 180. Ground plane 180 is spaced and separated from and disposed vertically beyond chip 110, routing lines 156A and 156B, adhesive 160, connection joints 162A and 162B and encapsulant 164. Opening 188 is disposed within the periphery of chip 110. Insulative base 192 contacts routing lines 156A and 156B, adhesive 160, pillars 170A-1, 170A-2 and 170B and ground plane 180, is sandwiched between routing lines 156A and 156B and ground plane 180, extends through opening 188 and extends vertically beyond pillars 170A-1, 170A-2 and 170B and ground plane 180. Furthermore, pillars 170A-1, 170A-2 and 170B, ground plane 180 and insulative base 192 are exposed.

For convenience of illustration, insulative base 192 is shown below chip 110, routing lines 156A and 156B, adhesive 160, connection joints 162A and 162B and encapsulant 164 to retain a single orientation throughout the figures for ease of comparison between the figures, although in this step the structure would be inverted to assist the curing process.

FIGS. 27A, 27B, 27C and 27D are cross-sectional, cross-sectional, top and bottom views, respectively, of the structure after a first portion of insulative base 192 is removed to further expose pillars 170A-1, 170A-2 and 170B and ground plane 180.

The first portion of insulative base 192 is removed by grinding. In particular, a rotating diamond sand wheel and distilled water are applied to the back-side of the structure. Initially, the diamond sand wheel grinds only insulative base 192. As the grinding continues, insulative base 192 becomes thinner as the grinded surface migrates vertically towards chip 110. Eventually the diamond sand wheel contacts pillars 170A-1, 170A-2 and 170B and ground plane 180, and as a result, begins to grind pillars 170A-1, 170A-2 and 170B and ground plane 180 as well. As the grinding continues, pillars 170A-1, 170A-2 and 170B, ground plane 180 and insulative base 192 become thinner as the grinded surfaces migrate vertically towards chip 110. However, the grinding halts soon after it reaches pillars 170A-1, 170A-2 and 170B and ground plane 180, and well before it reaches chip 110, routing lines 156A and 156B, adhesive 160, connection joints 162A and 162B or encapsulant 164. As a result, no appreciable amount of pillars 170A-1, 170A-2 and 170B or ground plane 180 is removed. Thereafter, the structure is rinsed in distilled water to remove contaminants.

At this stage, pillars 170A-1, 170A-2 and 170B, ground plane 180 and insulative base 192 are laterally aligned with one another and exposed.

FIGS. 28A, 28B, 28C and 28D are cross-sectional, cross-sectional, top and bottom views, respectively, of the structure after a second portion of insulative base 192 is removed to further expose pillar 170A-1.

The second portion of insulative base 192 is removed by applying a suitable etch that is highly selective of insulative base 192 with respect to pillar 170A-1 and ground plane 180. In this instance, a selective TEA $CO_2$ laser etch is applied using multiple laser direct writes. The laser is aimed at opening 188 and ablates insulative base 192. The laser has a spot size of 150 microns and opening 188 has a diameter of 600 microns. Therefore, the laser direct writes are offset relative to one another yet overlap so that the laser scans all of opening 188 between pillar 170A-1 and ground plane 180.

The laser strikes pillar 170A-1, ground plane 180 and insulative base 192 within opening 188. The laser drills through and removes the portion of insulative base 192 in opening 188 that extends from surface 184 to midway between surfaces 182 and 184. However, the portion of insulative base 192 in opening 188 that extends from midway between surfaces 182 and 184 to surface 182 remains intact. Likewise, ground plane 180 shields a portion of insulative base 192 from the laser etch, and the portion of insulative base 192 outside the periphery of opening 188 remains intact.

Thus, the laser etch drills 50 microns (100/2) into insulative base 192 in opening 188, thereby exposing sidewalls 176A-1 of pillar 170A-1 and the sidewalls of opening 188 and creating an air gap in opening 188 that begins at surface 184 and extends 50 microns into opening 188 between pillar 170A-1 and ground plane 180. However, the remaining 50 microns of insulative base 192 in opening 188 continues to contact sidewalls 176A-1 of pillar 170A-1 and the sidewalls of opening 188 and prevents the air gap from reaching surface 182 or extending through opening 188.

Thereafter, a brief cleaning step can be applied to remove oxides and debris that may be present on the exposed portions of pillars 170A-1, 170A-2 and 170B and ground plane 180. For instance; a brief oxygen plasma cleaning step can be applied to the structure. Alternatively, a brief wet chemical cleaning step using a solution containing potassium permanganate can be applied to the structure. In either case, the cleaning step cleans the exposed portions of pillars 170A-1, 170A-2 and 170B and ground plane 180 without damaging the structure. The use of oxygen plasmas and chemical solutions to clean copper surfaces in semiconductor chip assemblies is well-known in the art.

FIGS. 29A, 29B, 29C and 29D are cross-sectional, cross-sectional, top and bottom views, respectively, of solder paste 193 deposited into opening 188.

Solder paste 193 is deposited into opening 188 using stencil printing. During the stencil printing process, a stencil (not shown) with a thickness of 100 microns is placed on ground plane 180, a stencil opening with a diameter of 750 microns is vertically aligned with opening 188, and then a squeegee (not shown) pushes solder paste 193 along the surface of the stencil opposite ground plane 180, through the stencil opening and into opening 188. Solder paste 193 is compliant enough at room temperature to conform to virtually any shape. As a result, solder paste 193 contacts pillar 170A-1, ground plane 180 and insulative base 192 inside opening 188, contacts surface 184 of ground plane 180 outside and adjacent to opening 188, fills the remaining space in opening 188 and extends outside opening 188. However, solder paste 193 remains spaced and separated from routing line 156A, adhesive 160 and encapsulant 164 and surface 182 of ground plane 180.

For convenience of illustration, solder paste 193 is shown below chip 110, routing lines 156A and 156B, adhesive 160, connection joints 162A and 162B and encapsulant 164 to retain a single orientation throughout the figures for ease of comparison between the figures, although in this step the structure would be inverted to assist the solder paste printing process.

FIGS. 30A, 30B, 30C and 30D are cross-sectional, cross-sectional, top and bottom views, respectively, of solder joint 194 that electrically connects pillar 170A-1 and ground plane 180, and solder balls 196A-2 and 196B formed on pillars 170A-2 and 170B.

Solder paste 193 continues to contact pillar 170A-1, ground plane 180 and insulative base 192 inside opening 188, contact surface 184 of ground plane 180 outside and adjacent to opening 188, fill the remaining space in opening 188 and extend outside opening 188.

Solder balls 196A-2 and 196B are initially tin-lead balls with spherical shapes. The tin-lead balls are dipped in flux to provide solder balls 196A-2 and 196B with flux surface coatings that surround the tin-lead balls. The structure is inverted so that pillars 170A-2 and 170B face upwardly, and solder balls 196A-2 and 196B are deposited on pillars 170A-2 and 170B, respectively. Solder balls 196A-2 and 196B weakly adhere to pillars 170A-2 and 170B due to the flux surface coatings of solder balls 196A-2 and 196B.

Thereafter, the structure is placed in an oven and heated to a temperature of about 210° C. Solder paste 193 includes finely powdered tin-lead solder particles mixed in a viscous organic resin containing a fluxing agent. The heat causes the flux in solder paste 193 to react with and remove oxides from pillar 170A-1 and ground plane 180 and the solder particles in solder paste 193, renders the solder particles in solder paste 193 molten such that they coalesce, and vaporizes the organic resin in solder paste 193. As a result, solder paste 193 wets pillar 170A-1 and ground plane 180 in opening 188 and contracts from its original size, and solder reflow occurs. Likewise, solder balls 196A-2 and 196B wet pillars 170A-2 and 170B, respectively, and reflow.

Thereafter, the heat is removed, the molten solder particles in solder paste 193 cool and solidify into solder joint 194, and solder balls 196A-2 and 196B cool and solidify.

Solder joint 194 contacts and electrically connects pillar 170A-1 and ground plane 180 in opening 188. Furthermore, solder joint 194 not only extends within the periphery of opening 188, but also extends within and outside opening 188 and contacts ground plane 180 outside opening 188. In this manner, solder joint 194 ensures a reliable electrical connection between pillar 170A-1 and ground plane 180.

Solder joint 194 is also disposed within the periphery of chip 110. However, solder joint 194 is spaced and separated from routing line 156A, adhesive 160 and encapsulant 164 and surface 182 of ground plane 180.

Ground plane 180 contacts and is electrically connected to solder joint 194, which contacts and is electrically connected to pillar 170A-1, which contacts and is electrically connected to routing line 156A, which contacts and is electrically connected to connection joint 162A, which contacts and is electrically connected to pad 116A. As a result, solder joint 194 electrically connects pad 116A and ground plane 180. The electrically conductive path between pad 116A and ground plane 180 not only includes but also requires routing line 156A, connection joint 162A, pillar 170A-1 and solder joint 194. Advantageously, the electrically conductive path is devoid of another ground plane and a printed circuit board.

Solder joint 194 also electrically connects pillar 170A-2 and ground plane 180. Although pillar 170A-2 remains electrically connected to pad 116A, pillar 170A-2 is not in an electrically conductive path between pad 116A and ground plane 180. Furthermore, pad 116B, routing line 156B, connection joint 162B and pillar 170B remain electrically isolated from pad 116A, routing line 156A, connection joint 162A, pillars 170A-1 and 170A-2, ground plane 180 and solder joint 194.

Solder ball 196A-2 contacts and is electrically connected to pillar 170A-2 and extends downwardly beyond pillar 170A-2. Thus, solder ball 196A-2 provides a reflowable electrical connection to pillar 170A-2 that protrudes downwardly from pillar 170A-2 and is exposed.

Solder ball 196B contacts and is electrically connected to pillar 170B and extends downwardly beyond pillar 170B. Thus, solder ball 196B provides a reflowable electrical connection to pillar 170B that protrudes downwardly from pillar 170B and is exposed.

Solder balls 196A-2 and 196B are coplanar with one another, laterally spaced from one another and have essentially identical thicknesses.

At this stage, conductive trace 178A includes routing line 156A, pillars 170A-1 and 170A-2 and solder ball 196A-2, and conductive trace 178B includes routing line 156B, pillar 170B and solder ball 196B.

For convenience of illustration, solder balls 196A-2 and 196B are shown below chip 110, routing lines 156A and 156B, adhesive 160, connection joints 162A and 162B and encapsulant 164 to retain a single orientation throughout the figures for ease of comparison between the figures, although in this step the structure would be inverted to assist the solder ball deposition and reflow process.

FIGS. 31A, 31B, 31C and 31D are cross-sectional, cross-sectional, top and bottom views, respectively, of the structure after encapsulant 164 and insulative base 192 are cut with an excise blade to singulate the assembly from other assemblies.

At this stage, the manufacture of semiconductor chip assembly 198 that includes chip 110, routing lines 156A and 156B, adhesive 160, connection joints 162A and 162B, encapsulant 164, pillars 170A-1, 170A-2 and 170B, ground plane 180, insulative base 192, solder joint 194 and solder balls 196A-2 and 196B can be considered complete.

The semiconductor assembly is a first-level package that contains a solder-attached ground plane.

The semiconductor chip assembly includes other conductive traces embedded in encapsulant 164 and insulative base 192, and only two conductive traces 178A and 178B are shown for convenience of illustration. The other conductive traces resemble conductive trace 178B and each include a respective pillar, routing line and solder ball. The other conductive traces are each electrically connected to a respective pad on chip 110 by a respective connection joint. The other conductive traces each extend beyond an outer edge of chip 110 and provide horizontal fan-out routing and vertical routing for their respective pads. Furthermore, the other conductive traces each include a downwardly protruding solder ball so that the assembly provides a ball grid array (BGA) package.

Chip 110 is designed with the pads electrically isolated from one another. However, the corresponding routing lines are initially electroplated on metal base 130 and electrically connected to one another by metal base 130. Thereafter, once metal base 130 is etched to form the pillars, the routing lines are electrically isolated from one another by adhesive 160, encapsulant 164 and subsequently insulative base 192. Therefore, the pads remain electrically isolated from one another.

Advantageously, there is no plating bus or related circuitry that need be disconnected or severed from the conductive traces after the pillars are formed.

FIGS. 32A, 32B, 32C and 32D are cross-sectional, cross-sectional, top and bottom views, respectively, of a semiconductor chip assembly in accordance with a second embodiment of the present invention. In the second embodiment, the pillars are disposed within the periphery of the ground plane. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 256A corresponds to routing line 156A, etc.

Ground plane 280 is formed with openings 288A-1 (corresponding to opening 188), 288A-2 and 288B. Openings 288A-2 and 288B are formed by a slight adjustment to the wet chemical etching operation previously described for opening 188. In particular, the photoresist layers (corresponding to photoresist layers 186 and 187) are patterned to contain additional openings that enable the wet chemical etch to simultaneously form openings 288A-1, 288A-2 and 288B. Furthermore, ground plane 280 has a larger surface area than ground plane 180.

Thereafter, chip 210 and ground plane 280 are positioned relative to one another so that chip 210 and pillars 270A-1, 270A-2 and 270B are disposed within the periphery of ground plane 280 and pillars 270A-1, 270A-2 and 270B are vertically aligned with openings 288A-1, 288A-2 and 288B, respectively.

Thereafter, ground plane 280 is moved vertically towards chip 210, and pillars 270A-1, 270A-2 and 270B enter openings 288A-1, 288A-2 and 288B, respectively.

Thereafter, insulative base 292 is hardened and then grinded and ablated to further expose pillars 270A-1, 270A-2 and 270B, and then solder joint 294 and solder balls 296A-2 and 296B are formed.

Semiconductor chip assembly 298 includes chip 210, routing lines 256A and 256B, adhesive 260, connection joints 262A and 262B, encapsulant 264, pillars 270A-1, 270A-2 and 270B, ground plane 280, insulative base 292, solder joint 294 and solder balls 296A-2 and 296B.

FIGS. 33A, 33B, 33C and 33D are cross-sectional, cross-sectional, top and bottom views, respectively, of a semiconductor chip assembly in accordance with a third embodiment of the present invention. In the third embodiment, the insulative base is thinned by plasma etching. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 356A corresponds to routing line 156A, etc.

After insulative base 392 is formed, the grinding and laser ablation operations are omitted and instead a blanket plasma etch is applied to the back-side of the structure, thereby reducing the thickness of insulative base 392 and further exposing pillars 370A-1, 370A-2 and 370B and ground plane 380 without reducing the thickness of pillars 370A-1, 370A-2 and 370B and ground plane 380. As a result, insulative base 392 is slightly recessed relative to pillars 370A-1, 370A-2 and 370B and ground plane 380.

Thereafter, a brief cleaning step can be applied to remove oxides and debris that may be present on the exposed portions of pillars 370A-1, 370A-2 and 370B and ground plane 380. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pillars 370A-1, 370A-2 and 370B and ground plane 380 without damaging the structure.

Thereafter, solder joint 394 and solder balls 396A-2 and 396B are formed.

Semiconductor chip assembly 398 includes chip 310, routing lines 356A and 356B, adhesive 360, connection joints 362A and 362B, encapsulant 364, pillars 370A-1, 370A-2 and 370B, ground plane 380, insulative base 392, solder joint 394 and solder balls 396A-2 and 396B.

FIGS. 34A, 34B, 34C and 34D are cross-sectional, cross-sectional, top and bottom views, respectively, of a semiconductor chip assembly in accordance with a fourth embodiment of the present invention. In the fourth embodiment, the solder joint is disposed outside the opening in the ground plane. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 456A corresponds to routing line 156A, etc.

The laser ablation operation is omitted. As a result, pillar 470A-1 and insulative base 492 fill opening 488, and solder joint 494 is disposed outside opening 488 and laterally aligned with surface 484 of ground plane 480.

Semiconductor chip assembly 498 includes chip 410, routing lines 456A and 456B, adhesive 460, connection joints 462A and 462B, encapsulant 464, pillars 470A-1, 470A-2 and 470B, ground plane 480, insulative base 492, solder joint 494 and solder balls 496A-2 and 496B.

FIGS. 35A, 35B, 35C and 35D are cross-sectional, cross-sectional, top and bottom views, respectively, of a semiconductor chip assembly in accordance with a fifth embodiment of the present invention. In the fifth embodiment, the solder joint is disposed within the opening in the ground plane. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 556A corresponds to routing line 556A, etc.

After solder joint 594 is formed, another grinding operation is applied that removes the portion of solder joint 594 outside opening 588. As a result, pillar 570A-1 is exposed, and solder joint 594 is disposed within opening 588 and laterally aligned with surface 584 of ground plane 580.

Thereafter, solder balls 596A-2 and 596B are formed.

Semiconductor chip assembly 598 includes chip 510, routing lines 556A and 556B, adhesive 560, connection joints 562A and 562B, encapsulant 564, pillars 570A-1, 570A-2 and 570B, ground plane 580, insulative base 592, solder joint 594 and solder balls 596A-2 and 596B.

FIGS. 36A, 36B, 36C and 36D are cross-sectional, cross-sectional, top and bottom views, respectively, of a semiconductor chip assembly in accordance with a sixth embodiment of the present invention. In the sixth embodiment, the pillar that is solder-attached to the ground plane contacts the ground plane. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred.

For instance, chip 610 corresponds to chip 110, routing line 656A corresponds to routing line 156A, etc.

Opening 688 has a diameter of 450 microns. Thus, opening 688 has a diameter that is 150 microns smaller than the diameter of opening 188. Opening 688 is formed by a slight adjustment to the wet chemical etching operation previously described for opening 188. In particular, the photoresist layers (corresponding to photoresist layers 186 and 187) are patterned to reduce the diameters of the openings that define opening 688, and therefore the diameter of opening 688 is reduced.

Thereafter, ground plane 680 is moved vertically towards chip 610 until pillar 670A-1 contacts ground plane 680 at the corner between surface 682 and opening 688.

Thereafter, insulative base 692 is hardened and then grinded and ablated to further expose pillars 670A-1, 670A-2 and 670B, and then solder joint 694 and solder balls 696A-2 and 696B are formed.

The electrically conductive path between pad 616A and ground plane 680 requires routing line 656A, connection joint 662A and pillar 670A-1 and includes solder joint 694.

Semiconductor chip assembly 698 includes chip 610, routing lines 656A and 656B, adhesive 660, connection joints 662A and 662B, encapsulant 664, pillars 670A-1, 670A-2 and 670B, ground plane 680, insulative base 692, solder joint 694 and solder balls 696A-2 and 696B.

FIGS. 37A, 37B, 37C and 37D are cross-sectional, cross-sectional, top and bottom views, respectively, of a semiconductor chip assembly in accordance with a seventh embodiment of the present invention. In the seventh embodiment, the conductive trace that is solder-attached to the ground plane contains a single pillar and is adapted to be indirectly connected to external circuitry. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 756A corresponds to routing line 156A, etc.

The pillar (corresponding to pillar 170A-2) is omitted. Furthermore, the elongated region (corresponding to elongated region 146A) is shortened and the enlarged circular region (corresponding to enlarged circular region 148A-2) is omitted. This is accomplished by a slight adjustment to the electroplating operations previously described for etch masks 136A-1, 136A-2 and 136B and metal lines 144A and 144B. In particular, the photoresist layer (corresponding to photoresist layer 126) is patterned to omit the opening for the etch mask (corresponding to etch mask 136A-2), and therefore the etch mask (corresponding to etch mask 136A-2) is omitted. As a result, the pillar (corresponding to pillar 170A-2) is omitted, and likewise, the solder ball (corresponding to solder ball 196A-2) is omitted. In addition, the photoresist layer (corresponding to photoresist layer 140) is patterned to reshape the opening for the metal line (corresponding to metal line 144A), and therefore the metal line (corresponding to metal line 144A) is shortened and the enlarged circular region (corresponding to enlarged circular region 148A-2) is omitted.

Although conductive trace 778A is not adapted to be directly connected to external circuitry, conductive trace 778A can still be indirectly connected to external circuitry. For instance, the assembly can include another conductive trace (similar to conductive trace 778B) that is electrically connected to another ground pad (similar to pad 716A) of chip 710 by another connection joint (similar to connection joint 762B). Alternatively, the assembly can include another conductive trace (similar to conductive trace 178A) that is solder-attached to ground plane 780 and electrically connected to another ground pad (similar to pad 716A) of another chip (similar to chip 710) by another connection joint (similar to connection joint 762A).

Semiconductor chip assembly 798 includes chip 710, routing lines 756A and 756B, adhesive 760, connection joints 762A and 762B, encapsulant 764, pillars 770A-1 and 770B, ground plane 780, insulative base 792, solder joint 794 and solder ball 796B.

FIGS. 38A, 38B, 38C and 38D are cross-sectional, cross-sectional, top and bottom views, respectively, of a semiconductor chip assembly in accordance with an eighth embodiment of the present invention. In the eighth embodiment, the conductive trace that is solder-attached to the ground plane contains a single pillar and is adapted to be directly connected to external circuitry. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 856A corresponds to routing line 156A, etc.

The pillar (corresponding to pillar 170A-2) is omitted. Furthermore, the elongated region (corresponding to elongated region 146A) is shortened, and the enlarged circular region (corresponding to enlarged circular region 148A-2), the metal coating (corresponding to metal coating 194A-2) and the solder ball (corresponding to solder ball 196A-2) are also omitted. This is accomplished in the manner previously described for the seventh embodiment.

Solder joint 894 is disposed within opening 888. This is accomplished in the manner previously described for the fifth embodiment.

Thereafter, solder balls 896A-1 and 896B are formed on solder joint 894 and pillar 870B, respectively.

Semiconductor chip assembly 898 includes chip 810, routing lines 856A and 856B, adhesive 860, connection joints 862A and 862B, encapsulant 864, pillars 870A-1 and 870B, ground plane 880, insulative base 892, solder joint 894 and solder balls 896A-1 and 896B.

FIGS. 39A, 39B, 39C and 39D are cross-sectional, cross-sectional, top and bottom views, respectively, of a semiconductor chip assembly in accordance with a ninth embodiment of the present invention. In the ninth embodiment, a metal coating is formed on the pillar that is solder-attached to the ground plane, the solder joint and the ground plane. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 956A corresponds to routing line 156A, etc.

Solder joint 994 is disposed within opening 988. This is accomplished in the manner previously described for the fifth embodiment.

Thereafter, metal coating 995A-1 is formed on pillar 970A-1, ground plane 980 and solder joint 994, metal coating 995A-2 is formed on pillar 970A-2 and metal coating 995B is formed on pillar 970B.

Initially, the structure is dipped in an activator solution such as dilute palladium chloride of approximately 0.1 grams of palladium chloride and 5 cubic centimeters of hydrochloric acid per liter of water to render pillars 970A-2 and 970B, ground plane 980 and solder joint 994 catalytic to electroless nickel, then the structure is rinsed in distilled water to remove the palladium from encapsulant 964 and insulative base 992.

Thereafter, the structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

The exposed copper and solder features include palladium and therefore are catalytic to electroless nickel. Furthermore, encapsulant 964 and insulative base 992 are not catalytic to electroless nickel and therefore a plating mask is not necessary. As a result, the nickel deposits on the palladium-bearing copper and solder surfaces. The nickel electroless plating operation continues until the nickel surface layers are about 4 microns thick. Thereafter, the structure is removed from the electroless nickel plating solution and rinsed in distilled water.

Thereafter, the assembly is removed from the electroless nickel plating solution and briefly submerged in an electroless gold plating solution such as is MacDermid PLA-NAR™ at 70° C. The exposed nickel surface layers are catalytic to electroless gold. Furthermore, encapsulant 964 and insulative base 992 are not catalytic to electroless gold and therefore a plating mask is not necessary. As a result, the gold deposits on the nickel surface layers. The gold electroless plating operation continues until the gold surface layers are about 0.5 microns thick. Thereafter, the structure is removed from the electroless gold plating solution and rinsed in distilled water.

In this manner, metal coatings 995A-1, 995A-2 and 995B are simultaneously formed during a single electroless plating operation. Metal coating 995A-1 contacts and covers and is electrically connected to and is disposed vertically beyond pillar 970A-1, ground plane 980 and solder joint 994 and covers and is disposed vertically beyond opening 988, metal coating 995A-2 contacts and is electrically connected to and is disposed vertically beyond pillar 970A-2, and metal coating 995B contacts and is electrically connected to and is disposed vertically beyond pillar 970B.

Metal coatings 995A-1, 995A-2 and 995B are composed of a buried nickel layer that is 4 microns thick and a gold surface layer that is 0.5 microns thick. In metal coating 995A-1, the nickel and gold layers provide corrosion protection for ground plane 980 and a protective seal for solder joint 994. In metal coating 995A-2, the buried nickel layer provides the primary mechanical and electrical connection to pillar 970A-2, and the gold surface layer provides a wettable surface to facilitate solder reflow. In metal coating 995B, the buried nickel layer provides the primary mechanical and electrical connection to pillar 970B, and the gold surface layer provides a wettable surface to facilitate solder reflow. For convenience of illustration, the nickel and gold layers are shown as a single layer.

Thereafter, solder balls 996A-2 and 996B are formed on metal coatings 995A-2 and 995B, respectively.

Semiconductor chip assembly 998 includes chip 910, routing lines 956A and 956B, adhesive 960, connection joints 962A and 962B, encapsulant 964, pillars 970A-1, 970A-2 and 970B, ground plane 980, insulative base 992, solder joint 994, metal coatings 995A-1, 995A-2 and 995B and solder balls 996A-2 and 996B.

FIGS. 40A, 40B, 40C and 40D are cross-sectional, cross-sectional, top and bottom views, respectively, of a semiconductor chip assembly in accordance with a tenth embodiment of the present invention. In the tenth embodiment, the solder balls are omitted. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chip 1010 corresponds to chip 110, routing line 1056A corresponds to routing line 156A, etc.

Solder joint 1094 is disposed within opening 1088. This is accomplished in the manner previously described for the fifth embodiment. Thereafter, metal coatings 1095A-1, 1095A-2 and 1095B are formed on pillars 1070A-1, 1070A-2 and 1070B, ground plane 1080 and solder joint 1094. This is accomplished in the manner previously described for the ninth embodiment. Furthermore, the solder balls (corresponding to solder balls 196A-2 and 196B) are omitted. As a result, metal coatings 1095A-2 and 1095B are exposed and the assembly provides a land grid array (LGA) package.

Semiconductor chip assembly 1098 includes chip 1010, routing lines 1056A and 1056B, adhesive 1060, connection joints 1062A and 1062B, encapsulant 1064, pillars 1070A-1, 1070A-2 and 1070B, ground plane 1080, insulative base 1092, solder joint 1094 and metal coatings 1095A-1, 1095A-2 and 1095B.

FIGS. 41A, 41B, 41C and 41D are cross-sectional, cross-sectional, top and bottom views, respectively, of a semiconductor chip assembly in accordance with an eleventh embodiment of the present invention. In the eleventh embodiment, the solder joint and the solder balls are formed from solder paste. For purposes of brevity, any description in the first embodiment is incorporated herein insofar as the same is applicable, and the same description need not be repeated. Likewise, elements of the eleventh embodiment similar to those in the first embodiment have corresponding reference numerals indexed at eleven-hundred rather than one-hundred. For instance, chip 1110 corresponds to chip 110, routing line 1156A corresponds to routing line 156A, etc.

A first solder paste (corresponding to solder paste 193) is deposited on pillar 1170A-1 and ground plane 1180, a second solder paste is deposited on pillar 1170A-2, and a third solder paste is deposited on pillar 1170B. The first, second and third solder pastes are deposited by a slight adjustment to the solder paste deposition operation previously described for solder paste 193. In particular, the stencil contains additional openings that are vertically aligned with pillars 1170A-2 and 1170B, and the squeegee (not shown) pushes the solder paste along the surface of the stencil opposite ground plane 1180, and pushes the first, second and third solder pastes through the stencil openings and onto pillars 1170A-1, 1170A-2 and 1170B, respectively.

Thereafter, the first, second and third solder pastes are simultaneously heated and reflowed to form solder joint 1194, solder ball 1196A-2 and solder ball 1196B, respectively.

Semiconductor chip assembly 1198 includes chip 1110, routing lines 1156A and 1156B, adhesive 1160, connection joints 1162A and 1162B, encapsulant 1164, pillars 1170A-1, 1170A-2 and 1170B, ground plane 1180, insulative base 1192, solder joint 1194 and solder balls 1196A-2 and 1196B.

FIGS. 42A, 42B, 42C and 42D are cross-sectional, cross-sectional, top and bottom views, respectively, of a semiconductor chip assembly in accordance with a twelfth embodiment of the present invention. In the twelfth embodiment, the chip is flip-chip bonded. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, routing line 1256A corresponds to routing line 156A, etc.

Connection joints 1262A and 1262B are initially solder bumps deposited on pads 1216A and 1216B, respectively. The solder bumps have hemispherical shapes and a diameter of 100 microns.

Routing lines 1256A and 1256B are configured to provide vertical alignment between pads 1216A and 1216B and terminals 1254A and 1254B, respectively. Thus, the elongated region (corresponding to elongated region 146B) is lengthened and terminals 1254A and 1254B are laterally shifted. This is accomplished by a slight adjustment to the electroplating operations previously described for metal lines 144A and 144B and terminals 154A and 154B. In particular, the photoresist layer (corresponding to photoresist layer 140) is patterned to reshape the opening for the metal line (corresponding to metal line 144B), and therefore the metal line (corresponding to metal line 144B) is lengthened. In addition, the photoresist layer (corresponding to photoresist layer 150) is patterned to laterally shift the openings for terminals 1254A and 1254B, and therefore terminals 1254A and 1254B are laterally shifted relative to routing lines 1256A and 1256B, respectively.

Chip 1210 is inverted and positioned such that connection joint 1262A contacts and is sandwiched between pad 1216A and terminal 1254A, and connection joint 1262B contacts and is sandwiched between pad 1216B and terminal 1254B. Thereafter, heat is applied to reflow connection joints 1262A and 1262B, the heat is removed and connection joints 1262A and 1262B cool and solidify into hardened solder joints that mechanically attach and electrically connect pads 1216A and 1216B to routing lines 1256A and 1256B, respectively. Furthermore, connection joints 1262A and 1262B exhibit localized wetting and do not collapse, and chip 1210 remains spaced and separated from routing lines 1256A and 1256B.

Thereafter, adhesive 1260 is dispensed into and underfills the open gap between chip 1210 and the metal base (corresponding to metal base 130) and between chip 1210 and routing lines 1256A and 1256B, and then adhesive 1260 is hardened. As a result, adhesive 1260 contacts and is sandwiched between chip 1210 and the metal base (corresponding to metal base 130) and between chip 1210 and routing lines 1256A and 1256B, contacts connection joints 1262A and 1262B and is spaced and separated from pads 1216A and 1216B. Thus, adhesive 1260 is significantly thicker than adhesive 160. A suitable underfill adhesive is Namics U8443.

Thereafter, encapsulant 1264 is formed, pillars 1270A-1, 1270A-2 and 1270B are formed, insulative base 1292 is deposited on the structure, ground plane 1280 is placed on the structure, insulative base 1292 is hardened and then grinded and ablated to further expose pillars 1270A-1, 1270A-2 and 1270B, and then solder joint 1294 and solder balls 1296A-2 and 1296B are formed.

Semiconductor chip assembly 1298 includes chip 1210, routing lines 1256A and 1256B, adhesive 1260, connection joints 1262A and 1262B, encapsulant 1264, pillars 1270A-1, 1270A-2 and 1270B, ground plane 1280, insulative base 1292, solder joint 1294 and solder balls 1296A-2 and 1296B.

FIGS. 43A, 43B, 43C and 43D are cross-sectional, cross-sectional, top and bottom views, respectively, of a semiconductor chip assembly in accordance with a thirteenth embodiment of the present invention. In the thirteenth embodiment, the chip is mechanically attached to the routing lines, then the pillars are formed, and then the connection joints are formed. For purposes of brevity, any description in the first embodiment is incorporated herein insofar as the same is applicable, and the same description need not be repeated. Likewise, elements of the thirteenth embodiment similar to those in the first embodiment have corresponding reference numerals indexed at thirteen-hundred rather than one-hundred. For instance, chip 1310 corresponds to chip 110, routing line 1356A corresponds to routing line 156A, etc.

Pads 1316A and 1316B are treated to accommodate an electroless nickel connection joint by forming a nickel surface layer on the aluminum base. For instance, chip 1310 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI424 at 85° C.

Routing lines 1356A and 1356B are configured to provide vertical alignment with pads 1316A and 1316B, respectively, and the terminals (corresponding to terminals 154A and 154B) are omitted. Thus, the elongated region (corresponding to elongated region 146B) is lengthened, and routing lines 1356A and 1356B consist of the metal lines (corresponding to metal lines 144A and 144B, respectively). Furthermore, the elongated regions (corresponding to elongated regions 146A and 146B) have a width (orthogonal to the elongated length) of 50 microns. This is accomplished by a slight adjustment to the electroplating operations previously described for metal lines 144A and 144B and terminals 154A and 154B. In particular, the photoresist layer (corresponding to photoresist layer 140) is patterned to reshape the openings for the metal lines (corresponding to metal lines 144A and 144B), and therefore the metal lines (corresponding to metal lines 144A and 1144B) have narrower widths and the metal line (corresponding to metal line 144B) is lengthened. In addition, the photoresist layers (corresponding to photoresist layers 150 and 152) and the associated electroplating operation for the terminals (corresponding to terminals 154A and 154B) are omitted.

Adhesive 1360 is deposited on the metal base (corresponding to metal base 130) and routing lines 1356A and 1356B.

Chip 1310 is inverted and positioned such that adhesive 1360 contacts and is sandwiched between pad 1316A and routing line 1356A, and between pad 1316B and routing line 1356B. Furthermore, routing line 1356A partially overlaps pad 1316A, and routing line 1356B partially overlaps pad 1316B.

Thereafter, encapsulant 1364 and pillars 1370A-1, 1370A-2 and 1370B are formed.

Thereafter, through-hole 1361A is formed in adhesive 1360 that exposes pad 1316A and routing line 1356A, and through-hole 1361B is formed in adhesive 1360 that exposes pad 1316B and routing line 1356B.

Through-hole 1361A is formed through adhesive 1360 by applying a suitable etch that is highly selective of adhesive 1360 with respect to pad 1316A and routing line 1356A. In this instance, a selective TEA $CO_2$ laser etch is applied. The laser is directed at and vertically aligned with and centered relative to pad 1316A. The laser has a spot size of 70 microns, and pad 1316A has a length and width of 100 microns. As a result, the laser strikes pad 1316A and portions of routing line 1356A and adhesive 1360 that extend within the periphery of pad 1316A, and ablates adhesive 1360. The laser drills through and removes a portion of adhesive 1360. However, portions of adhesive 1360 that extend across the peripheral edges of pad 1316A are outside the scope of the laser and remain intact. Likewise, routing line 1356A shields a portion of adhesive 1360 from the laser etch, and a portion of adhesive 1360 sandwiched between pad 1316A and routing line 1356A remains intact. The laser etch is anisotropic, and therefore little or none of adhesive 1360 sandwiched between pad 1316A and routing line 1356A is undercut or removed. Through-hole 1361A may slightly undercut adhesive 1360 between pad 1316A and routing line 1356A and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored. However, through-hole 1361A is formed without damaging chip 1310 or routing line 1356A and does not extend into chip 1310.

Through-hole 1361B is formed in the same manner as through-hole 1361A.

Thereafter, a brief cleaning step can be applied to remove oxides and debris that may be present on the exposed portions of pads 1316A and 1316B and routing lines 1356A and 1356B. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pads 1316A and 1316B and routing lines 1356A and 1356B without damaging the structure.

Thereafter, connection joints 1362A and 1362B are formed. Connection joint 1362A is electrolessly plated on the exposed portions of pad 1316A, routing line 1356A and pillars 1370A-1 and 1370A-2, and connection joint 1362B is electrolessly plated on the exposed portions of pad 1316B, routing line 1356B and pillar 1370B.

The structure is submerged in an electroless nickel plating solution such as Enthone Enplate NI-424 at 85° C. Pads 1316A and 1316B include exposed nickel surface layers and therefore are catalytic to electroless nickel. Furthermore, adhesive 1360 and encapsulant 1364 are not catalytic to electroless nickel and therefore a plating mask is not necessary.

Connection joint 1362A plates on pad 1316A and eventually contacts and electrically connects pad 1316A and routing line 1356A in through-hole 1361A. Likewise, connection joint 1362B plates on pad 1316B and eventually contacts and electrically connects pad 1316B and routing line 1356B in through-hole 1361B. The electroless nickel plating operation continues until connection joints 1362A and 1362B are about 10 microns thick. Thereafter, the structure is removed from the electroless nickel plating solution and rinsed in distilled water. In this manner, connection joints 1362A and 1362B are simultaneously formed during a single electroless plating operation.

Thereafter, insulative base 1392 is deposited on the structure, ground plane 1380 is placed on the structure, insulative base 1392 is hardened and then grinded and ablated to further expose pillars 1370A-1, 1370A-2 and 1370B, and then solder joint 1394 and solder balls 1396A-2 and 1396B are formed.

Figure 43A:
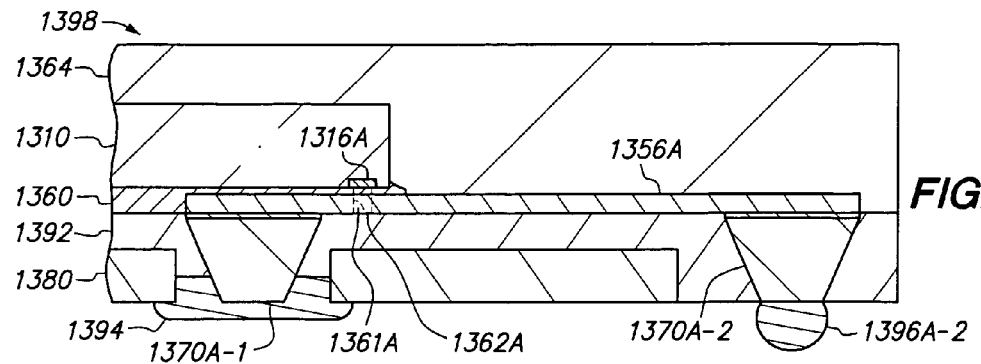
FIGS. 43A, 43B, 43C and 43D are cross-sectional, cross-sectional, top and bottom views, respectively, of a semiconductor chip assembly in accordance with a thirteenth embodiment of the present invention.
Figure 43B:
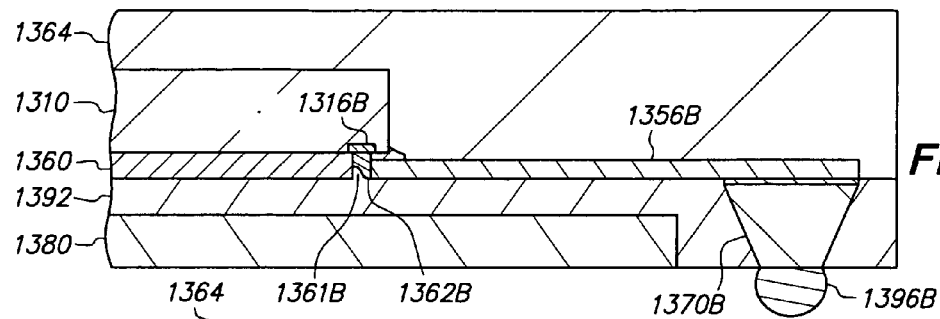
Figure 43C:
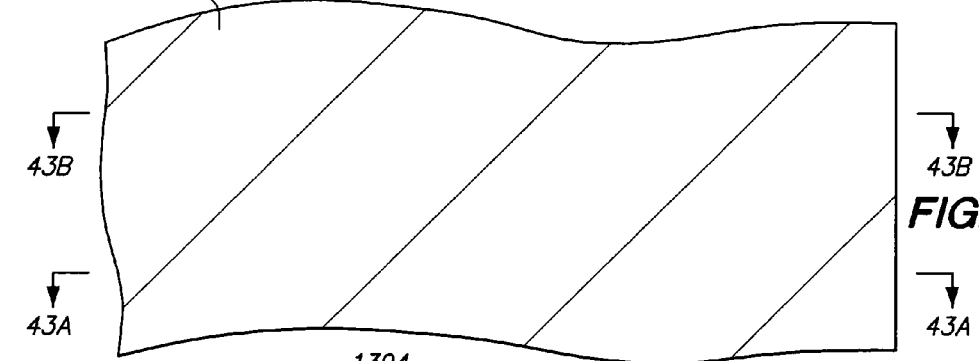
Figure 43D:
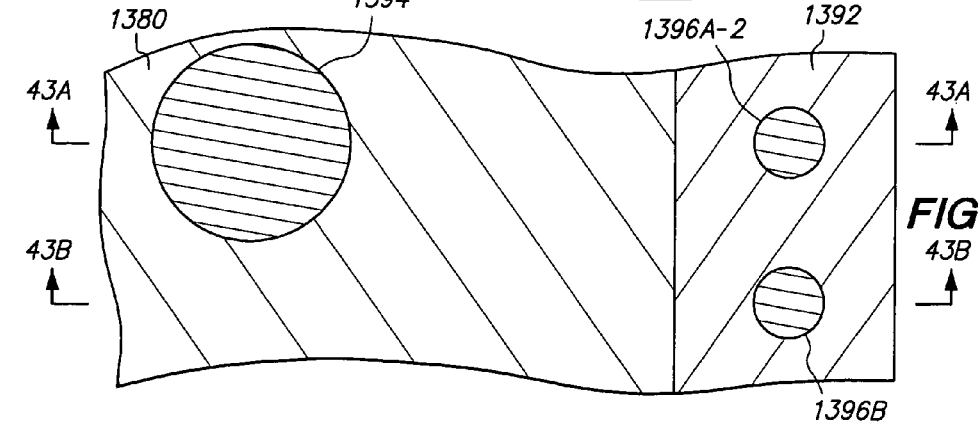
Figure 44A:
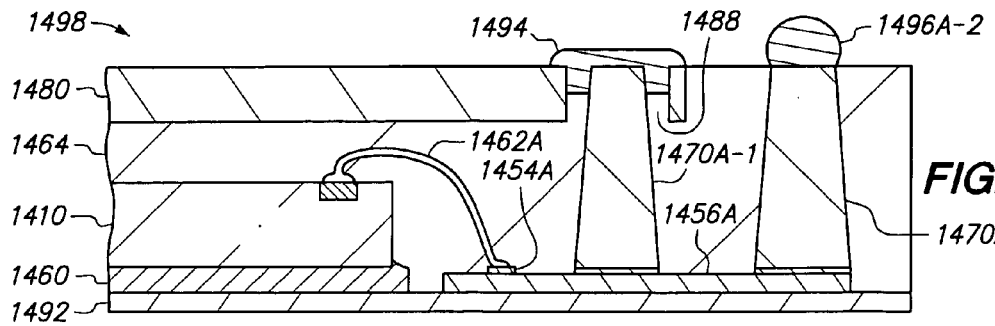
FIGS. 44A, 44B, 44C and 44D are cross-sectional, cross-sectional, top and bottom views, respectively, of a semiconductor chip assembly in accordance with a fourteenth embodiment of the present invention.
Figure 44B:
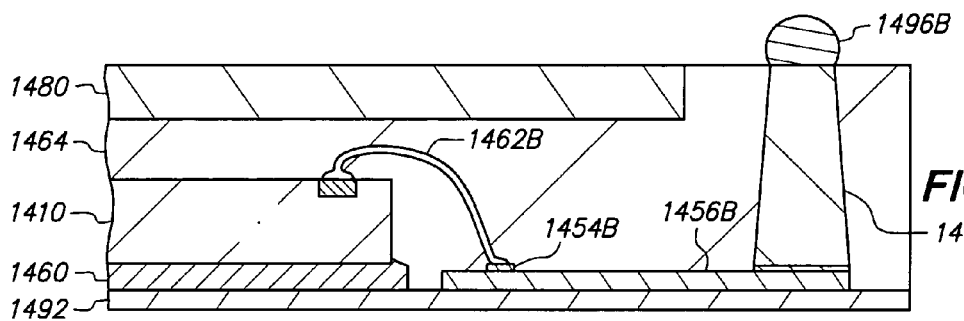
Figure 44C:
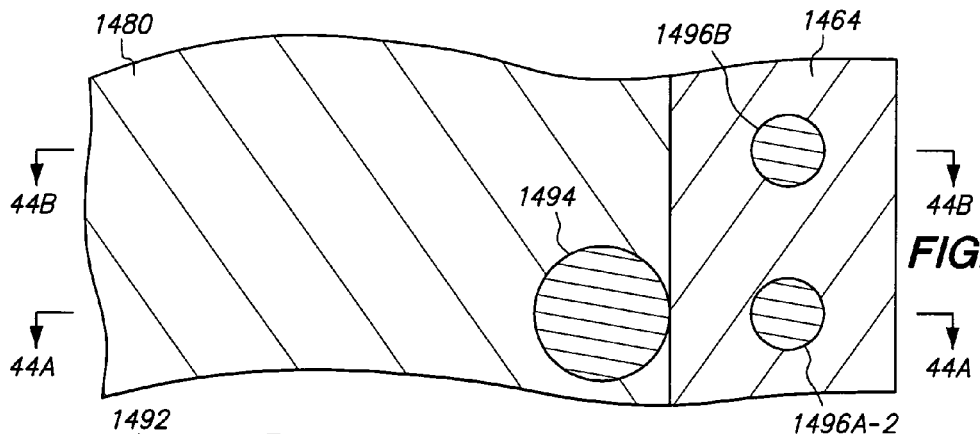
Figure 44D:
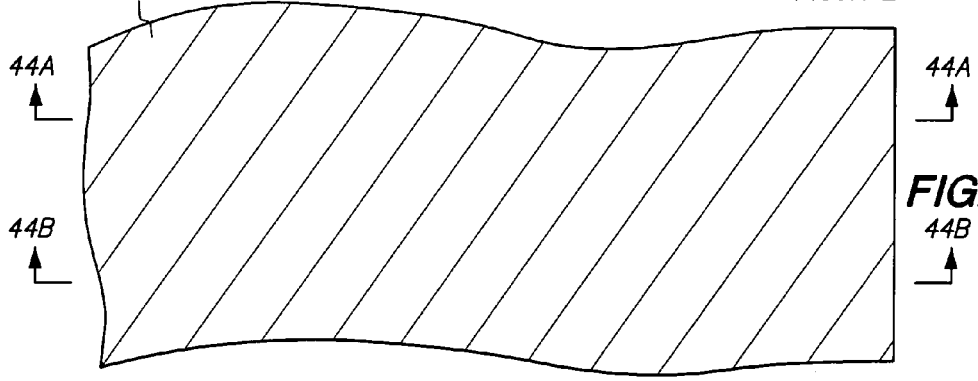

Through-hole 1361A and connection joint 1362A are shown in phantom in FIG. 43A.

Semiconductor chip assembly 1398 includes chip 1310, routing lines 1356A and 1356B, adhesive 1360, connection joints 1362A and 1362B, encapsulant 1364, pillars 1370A-1, 1370A-2 and 1370B, ground plane 1380, insulative base 1392, solder joint 1394 and solder balls 1396A-2 and 1396B.

FIGS. 44A, 44B, 44C and 44D are cross-sectional, cross-sectional, top and bottom views, respectively, of a semiconductor chip assembly in accordance with a fourteenth embodiment of the present invention. In the fourteenth embodiment, the pillars are formed, then the chip is mechanically attached to the pillars and the routing lines, and then the connection joints are formed. For purposes of brevity, any description in the first embodiment is incorporated herein insofar as the same is applicable, and the same description need not be repeated. Likewise, elements of the fourteenth embodiment similar to those in the first embodiment have corresponding reference numerals indexed at fourteen-hundred rather than one-hundred. For instance, chip 1410 corresponds to chip 110, routing line 1456A corresponds to routing line 156A, etc.

The metal plate (corresponding to metal plate 120) has a thickness of 300 microns.

Pillar 1470A-1 is laterally shifted to be disposed outside the periphery of chip 1410. Furthermore, the elongated region (corresponding to elongated region 146A) is shortened. This is accomplished by a slight adjustment to the electroplating operations previously described for etch masks 136A-1, 136A-2 and 136B and metal lines 144A and 144B. In particular, the photoresist layer (corresponding to photoresist layer 126) is patterned to laterally shift the opening for the etch mask (corresponding to etch mask 136A-1), and therefore pillar 1470A-1 is laterally shifted relative to routing line 1456A. In addition, the photoresist layer (corresponding to photoresist layer 140) is patterned to reshape the opening for the metal line (corresponding to metal line 144A), and therefore the metal line (corresponding to metal line 144A) is shortened.

Ground plane 1480 is configured to laterally shift opening 1488 to provide vertical alignment between pillar 1470A-1 and opening 1488. This is accomplished by a slight adjustment to the wet chemical etching operation previously described for opening 188. In particular, the photoresist layers (corresponding to photoresist layers 186 and 187) are patterned to laterally shift the openings that define opening 1488, and therefore opening 1488 is laterally shifted relative to ground plane 1480.

Insulative base 1492 is deposited on routing lines 1456A and 1456B and the metal base (corresponding to metal base 130), and then insulative base 1492 is partially polymerized and forms a gel.

Thereafter, the structure is placed on a support (not shown) similar to metal plate 120 such that insulative base 1492 contacts the support and is sandwiched between the metal base (corresponding to metal base 130) and the support and between routing lines 1456A and 1456B and the support while insulative base 1492 is a gel, and then insulative base 1492 is hardened.

Thereafter, pillars 1470A-1, 1470A-2 and 1470B are formed and the etch masks (corresponding to etch masks 136A-1, 136A-2 and 136B) are removed.

Thereafter, a protective mask is deposited on the support, and then terminals 1454A and 1454B are formed.

Thereafter, adhesive 1460 is deposited on insulative base 1492, then chip 1410 is placed on adhesive 1460, and then adhesive 1460 is hardened. Pillars 1470A-1, 1470A-2 and 1470B are disposed outside the periphery of chip 1410. Furthermore, pillars 1470A-1, 1470A-2 and 1470B are not disposed vertically beyond chip 1410, and instead extend across the thickness of chip 1410.

Thereafter connection joints 1462A and 1462B are formed.

Thereafter, encapsulant 1464 is formed. Encapsulant 1464 is similar to insulative base 192 (rather than encapsulant 164). Accordingly, encapsulant 1464 is deposited on chip 1410, routing lines 1456A and 1456B, adhesive 1460, connection joints 1462A and 1462B, pillars 1470A-1, 1470A-2 and 1470B and insulative base 1492, and then encapsulant 1464 is partially polymerized and forms a gel.

Thereafter, ground plane 1480 is placed on the structure, and then encapsulant 1464 is hardened.

Thereafter, the protective mask is removed and then the support is etched and removed.

Thereafter, encapsulant 1464 is grinded and ablated to further expose pillars 1470A-1, 1470A-2 and 1470B, and then solder joint 1494 and solder balls 1496A-2 and 1496B are formed.

Semiconductor chip assembly 1498 includes chip 1410, routing lines 1456A and 1456B, adhesive 1460, connection joints 1462A and 1462B, encapsulant 1464, pillars 1470A-1, 1470A-2 and 1470B, ground plane 1480, insulative base 1492, solder joint 1494 and solder balls 1496A-2 and 1496B.

FIGS. 45A, 45B, 45C, 45D, 45E and 45F are cross-sectional, cross-sectional, cross-sectional, cross-sectional, top and bottom views, respectively, of a semiconductor chip assembly in accordance with a fifteenth embodiment of the present invention. In the fifteenth embodiment, the assembly is a multi-chip module. For purposes of brevity, any description in the first embodiment is incorporated herein insofar as the same is applicable, and the same description need not be repeated. Likewise, elements of the fifteenth embodiment similar to those in the first embodiment have corresponding reference numerals indexed at fifteen-hundred rather than one-hundred. For instance, chips 1510' and 1510" correspond to chip 110, routing lines 1556A' and 1556A" correspond to routing line 156A, etc.

Chips 1510' and 1510" include ground pads 1516A' and 1516A", respectively, and input/output pads 1516B' and 1516B", respectively.

Ground plane 1580 is formed with openings 1588' and 1588". Openings 1588' and 1588" are formed using a slight adjustment to the wet chemical etching operation previously described for opening 188. In particular, the photoresist layers (corresponding to photoresist layers 186 and 187) are patterned to contain additional openings that enable the wet chemical etch to simultaneously form openings 1588' and 1588". Furthermore, ground plane 1580 has a larger surface area than ground plane 180.

Routing lines 1556A', 1556B', 1556A" and 1556B" and the associated etch masks (corresponding to two sets of etch masks 136A-1, 136A-2 and 136B) are formed on the metal base (corresponding to metal base 130). This is accomplished by a slight adjustment to the electroplating operations previously described for etch masks 136A-1, 136A-2 and 136B, metal lines 144A and 144B and terminals 154A and 154B. In particular, the photoresist layer (corresponding to photoresist layer 126) is patterned to contain additional openings that enable the electroplating operation to simultaneously form the additional etch masks (corresponding to etch masks 136A-1, 136A-2 and 136B), and therefore two sets of etch masks are formed. As a result, additional pillars (corresponding to pillars 170A-1, 170A-2 and 170B) shall also be formed. In addition, the photoresist layer (corresponding to photoresist layer 140) is patterned to contain additional openings that enable the electroplating operation to simultaneously form the additional metal lines (corresponding to metal lines 144A and 144B), and therefore two sets of metal lines are formed. In addition, the photoresist layer (corresponding to photoresist layer 150) is patterned to contain additional openings that enable the electroplating operation to simultaneously form the additional terminals on the additional metal lines (corresponding to metal lines 144A and 144B), and therefore terminals 1554A', 1554B', 1554A" and 1554B" are formed.

Thereafter, adhesives 1560' and 1560" are deposited on the structure, then chips 1510' and 1510" are placed on adhesives 1560' and 1560", respectively, and then adhesives 1560' and 1560" are simultaneously hardened.

Thereafter, connection joints 1562A', 1562B', 1562A" and 1562B" are formed to contact and electrically connect pads 1516A', 1516B', 1516A" and 1516B" and routing lines 1556A', 1556B', 1556A" and 1556B", respectively. As a result, pads 1516A', 1516B', 1516A" and 1516B" are electrically connected to one another by the metal base, and routing lines 1556A', 1556B', 1556A" and 1556B" are electrically connected to one another by the metal base.

Thereafter, encapsulant 1564 is formed and contacts and covers chips 1510' and 1510", routing lines 1556A', 1556B', 1556A" and 1556B", adhesives 1560' and 1560" and connection joints 1562A', 1562B', 1562A" and 1562B".

Thereafter, the metal base is etched to form pillars 1570A-1', 1570A-2', 1570B', 1570A-1", 1570A-2" and 1570B" and remove the etch masks. Pillars 1570A-1' and 1570A-2' contact and are electrically connected to routing line 1556A', pillar 1570B' contacts and is electrically connected to routing line 1556B', pillars 1570A-1" and 1570A-2" contact and are electrically connected to routing line 1556A", and pillar 1570B" contacts and is electrically connected to routing line 1556B". As a result, pads 1516A', 1516B', 1516A" and 1516B" are electrically isolated from one another, and routing lines 1556A', 1556B', 1556A" and 1556B" are electrically isolated from one another.

Thereafter, insulative base 1592 is deposited on and contacts and covers routing lines 1556A', 1556B', 1556A" and 1556B", adhesives 1560' and 1560", encapsulant 1564 and pillars 1570A-1', 1570A-2', 1570B', 1570A-1", 1570A-2" and 1570B" and is a gel.

Thereafter, chips 1510' and 1510" and ground plane 1580 are positioned relative to one another so that chips 1510' and 1510" and pillars 1570A-1' and 1570A-1" are disposed within the periphery of ground plane 1580, pillars 1570A-2', 1570B', 1570A-2" and 1570B" are disposed outside the periphery of ground plane 1580, and pillars 1570A-1' and 1570A-1" are vertically aligned with openings 1588' and 1588", respectively.

Thereafter, ground plane 1580 is moved vertically towards chips 1510' and 1510", and pillars 1570A-1' and 1570A-1" enter openings 1588' and 1588", respectively. Pillars 1570A-1' and 1570A-1" are simultaneously inserted into openings 1588' and 1588", respectively, and pillars 1570A-2', 1570B', 1570A-2" and 1570B" remain outside the periphery of ground plane 1580.

Thereafter, insulative base 1592 is hardened and then grinded and ablated to further expose pillars 1570A-1', 1570A-2', 1570B', 1570A-1", 1570A-2" and 1570B".

Thereafter, solder joints 1594' and 1594" and solder balls 1596A-2', 1596B', 1596A-2" and 1596B" are formed. Solder joint 1594' contacts and electrically connects pillar 1570A-1' and ground plane 1580, and solder joint 1594" contacts and electrically connects pillar 1570A-1" and ground plane 1580. As a result, pillars 1570A-1' and 1570A-1" are electrically connected to ground plane 1580 and one another, and consequently pads 1516A' and 1516A" are also electrically connected to ground plane 1580 and one another, and pillars 1570A-2' and 1570A-2" are electrically connected to ground plane 1580 and one another. However, pillars 1570B' and 1570B" remain spaced and separated from and electrically isolated from ground plane 1580 and one another.

Chips 1510' and 1510" are coplanar with and laterally spaced from one another and have essentially identical thicknesses, routing lines 1556A', 1556B', 1556A" and 1556B" are coplanar with and laterally spaced from one another and have essentially identical thicknesses, and pillars 1570A-1', 1570A-2', 1570B', 1570A-1", 1570A-2" and 1570B" are coplanar with and laterally spaced from one another and have essentially identical thicknesses. Routing lines 1556A', 1556B', 1556A" and 1556B" are also spaced from ground plane 1580 and solder joints 1594' and 1594". Pillar 1570A-1', opening 1588' and solder joint 1594' are disposed within the periphery of chip 1510' and outside the periphery of chip 1510", and pillar 1570A-1", opening 1588" and solder joint 1594" are disposed within the periphery of chip 1510" and outside the periphery of chip 1510'.

The electrically conductive path between pad 1516A' and ground plane 1580 includes routing line 1556A', connection joint 1562A' and pillar 1570A-1' and solder joint 1594' and excludes routing line 1556A", connection joint 1562A", pillar 1570A-1" and solder joint 1594", and the electrically conductive path between pad 1516A" and ground plane 1580 includes routing line 1556A", connection joint 1562A", pillar 1570A-1" and solder joint 1594" and excludes routing line 1556A', connection joint 1562A', pillar 1570A-1' and solder joint 1594'.

Figure 45A:
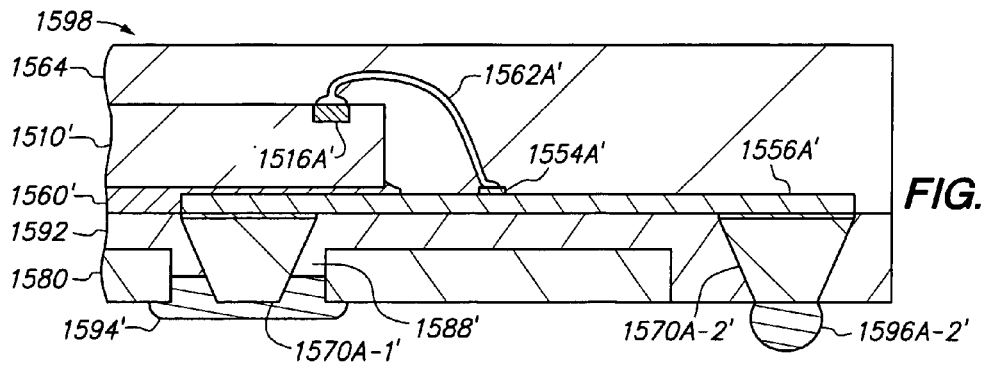
FIGS. 45A, 45B, 45C, 45D, 45E and 45F are cross-sectional, cross-sectional, cross-sectional, cross-sectional, top and bottom views, respectively, of a semiconductor chip assembly in accordance with a fifteenth embodiment of the present invention.
Figure 45B:
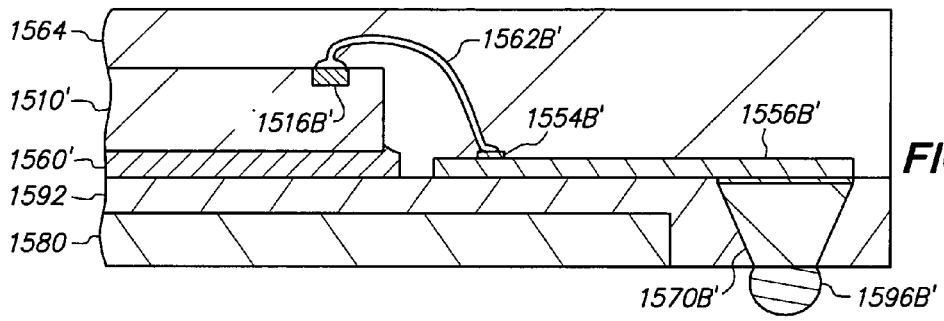
Figure 45C:
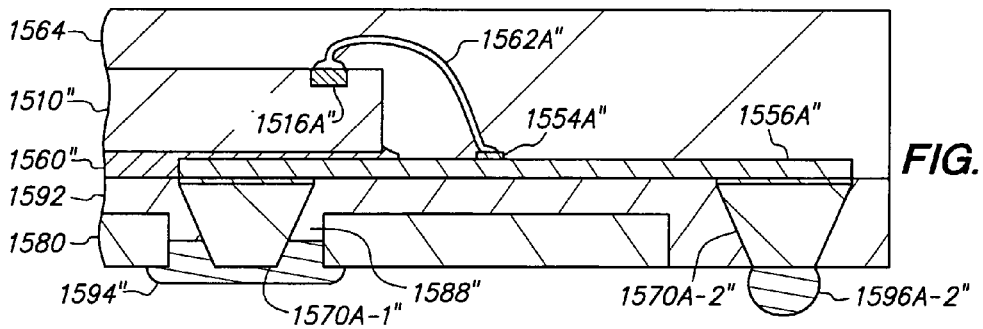
Figure 45D:
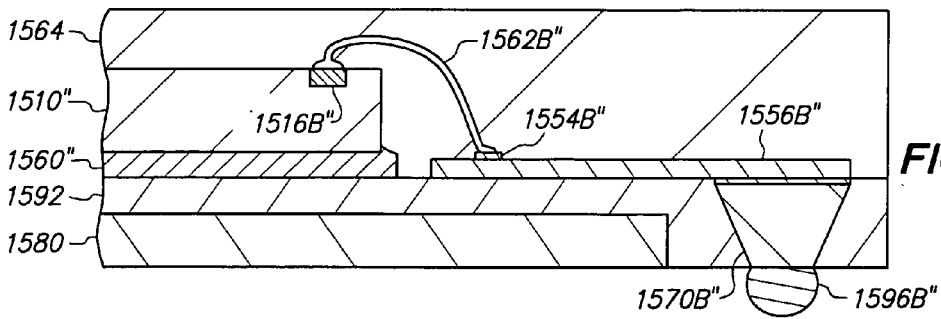
Figure 45E:
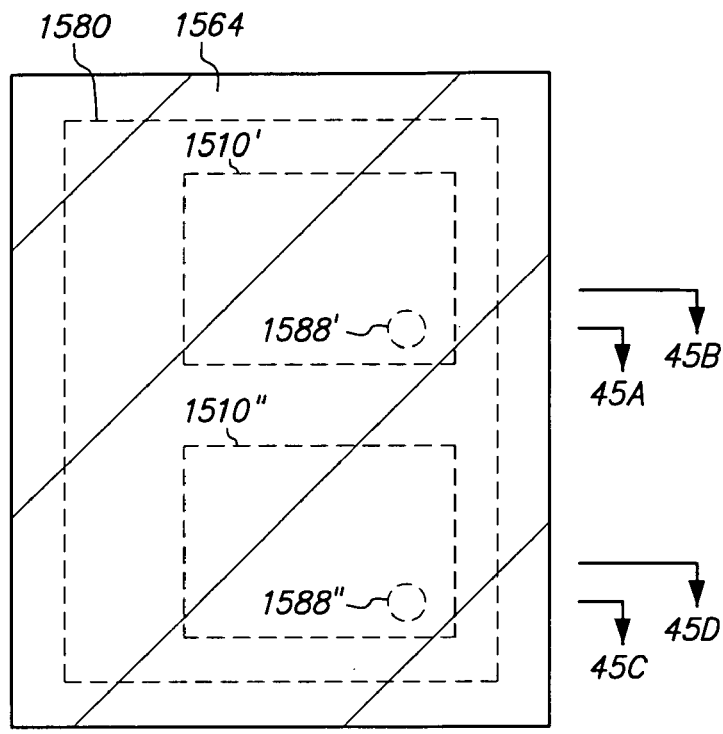
Figure 45F:
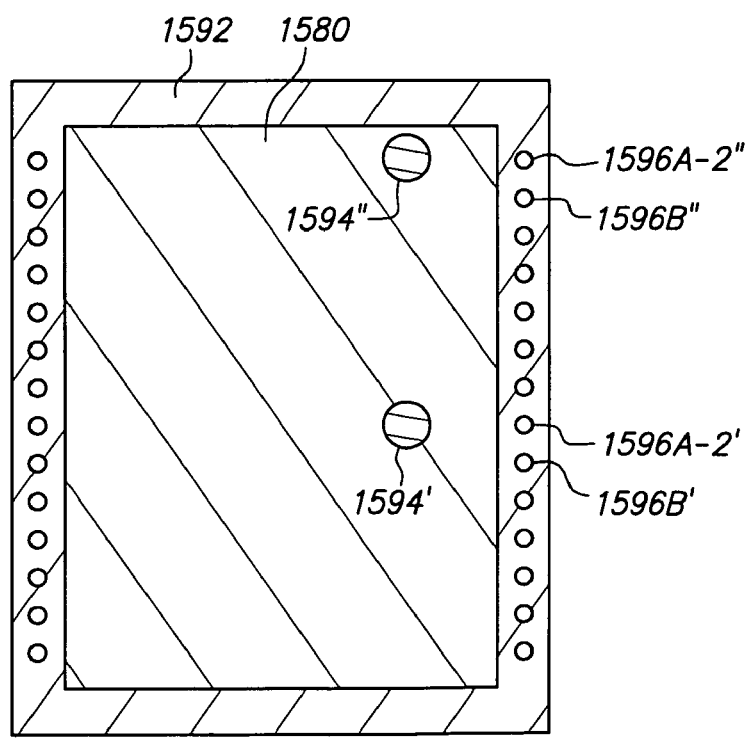
Figure 10A:
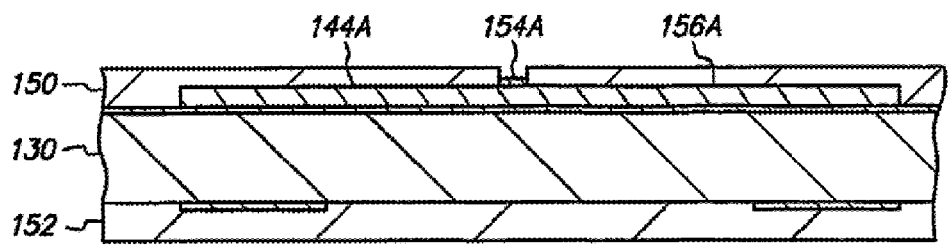
Figure 10B:
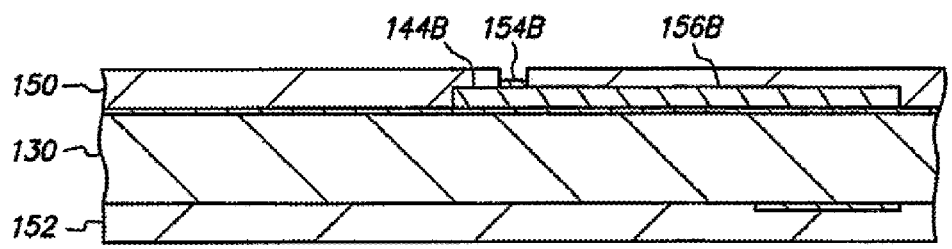
Figure 10C:
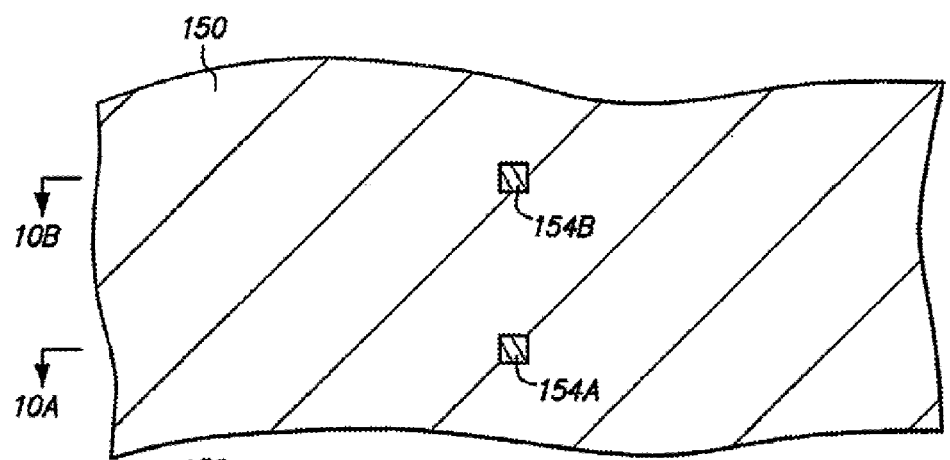
Figure 10D:
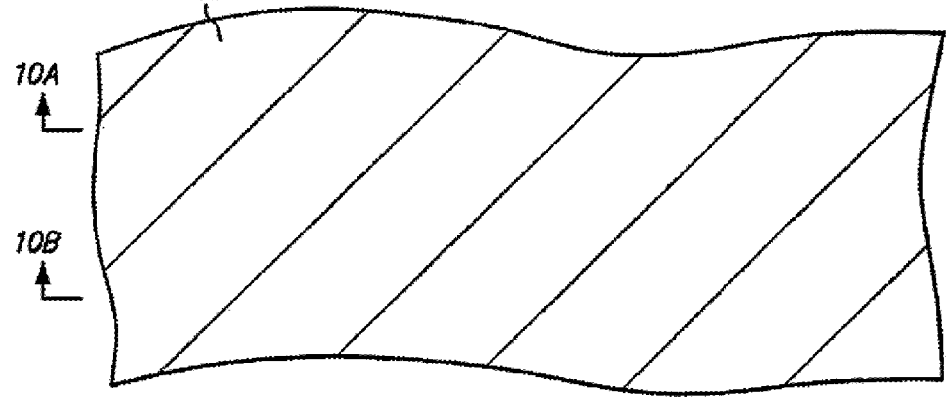

Chips 1510' and 1510", ground plane 1580 and openings 1588' and 1588" are shown in phantom in FIG. 45E.

Semiconductor chip assembly 1598 includes chips 1510' and 1510", routing lines 1556A', 1556B', 1556A" and 1556B", adhesives 1560' and 1560", connection joints 1562A', 1562B', 1562A" and 1562B", encapsulant 1564, pillars 1570A-1', 1570A-2', 1570B', 1570A-1", 1570A-2" and 1570B", ground plane 1580, insulative base 1592, solder joints 1594' and 1594" and solder balls 1596A-2', 1596B', 1596A-2" and 1596B".

The semiconductor chip assemblies described above are merely exemplary. Numerous other embodiments are contemplated. For instance, the solder balls can be omitted. In addition, the embodiments described above can generally be combined with one another. For instance, the ground plane in the second embodiment can be combined with the plasma etch in the third embodiment, the solder joints in the fourth and fifth embodiments can be combined with pillar in the sixth embodiment, the conductive traces in the seventh and eighth embodiments can be combined with the solder paste deposition in the eleventh embodiment, the metal coating in the ninth embodiment can be combined with the land grid array package in the tenth embodiment, the flip-chip in the twelfth embodiment and the connection joint in the thirteenth embodiment can be combined with the pillar in the fourteenth embodiment, and the multi-chip module in the fifteenth embodiment can be combined with any other embodiment. The embodiments described above can be mixed-and-matched with one another and with other embodiments depending on design and reliability considerations.

The metal plate, the metal layer, the metal base and the ground plane can be various metals such as copper, copper alloys, nickel, iron-nickel alloys, aluminum, and so on, and can be a single layer or multiple layers.

The metal base need not necessarily be dedicated solely to pillar formation. For instance, portions of the metal base can be selectively etched to form the pillars, and another portion of the metal base that is disposed within the periphery of the chip and spaced from the pillars can remain intact and provide a heat sink.

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in or fan-out or both.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and form the pillar without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds.

The etch mask can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before, during or after the routing line is deposited on the metal base, can be disposed on a planar top surface of the metal base or a recess in the metal base, and if disposed in a recess need not necessarily fill the recess. Furthermore, the etch mask can remain permanently attached to the pillar or be removed as or after the pillar is formed.

The etch mask is undercut by a wet chemical etch that forms the pillar but can subsequently be confined to the tip of the pillar, for instance by dislodging a portion of the etch mask outside the tip of the pillar by mechanical brushing, sand blasting, air blowing or water rinsing, or by reflowing a solder etch mask when the pillar does not provide a wettable surface. Alternatively, a solder etch mask can be reflowed to conformally coat the entire pillar and contact the insulative base, for instance by depositing flux on the pillar so that the pillar provides a wettable surface before the solder reflow operation.

The pillar can be formed in numerous manners. For instance, the metal base can be etched to form a recess and expose what shall become the tip of the pillar, then the etch mask can be deposited in the recess, then the metal base can be attached to the chip, and then the metal base can be etched to undercut the metal base beneath the etch mask for the first time and form the pillar. Alternatively, the metal base can be etched to form a recess and expose what shall become the tip of the pillar, then the etch mask can be deposited in the recess, then the metal base can be etched to undercut the metal base beneath the etch mask for the first time, then the metal base can be attached to the chip, and then the metal base can be etched again to undercut the metal base beneath the etch mask for the second time and form the pillar. Preferably, etching the metal base forms the pillar from an unetched portion of the metal base also electrically isolates the pillar from other pillars. In either case, etching the metal base to form the pillar does not preclude etching and undercutting the metal base beneath the etch mask at an earlier stage (such as the example described above). Furthermore, etching the metal base to form the pillar can include an overetch such as 20 to 30% in order to assure that the pillar is electrically isolated from other pillars and compensate for non-uniformities and manufacturing tolerances.

The pad can have numerous shapes including a flat rectangular shape and a bumped shape. If desired, the pad can be treated to accommodate the connection joint.

Numerous adhesives can be applied to mechanically attach the chip to the routing line. For instance, the adhesive can be applied as a paste, a laminated layer, or a liquid applied by screen-printing, spin-on, or spray-on. The adhesive can be a single layer that is applied to a base and then contacted to the chip or a single layer that is applied to the chip and then contacted to a base. Similarly, the adhesive can be multiple layers with a first layer applied to a base, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The adhesive can be conductive or non-conductive. Non-conductive adhesives are preferred for low cost, high bonding strength applications, whereas thermally conductive adhesives are preferred when high thermal dissipation and a matched thermal coefficient of expansion are important, and electrically conductive adhesives are preferred when the chip needs to be grounded. Conductive adhesives can initially be an epoxy paste that includes an epoxy resin, a curing agent, an accelerator and a filler, that is subsequently cured or hardened to form a solid adherent layer. For thermally conductive adhesives, the filler can be an inert material such as silica (powdered fused quartz) that improves thermal conductivity, thermal shock resistance and thermal coefficient of expansion matching. For electrically conductive adhesives, the filler can be a metallic material such as silver particles that contact one another to provide an electrically conductive path.

The encapsulant can be deposited using a wide variety of techniques including printing and transfer molding. For instance, the encapsulant can be printed on the chip as an epoxy paste and then cured or hardened to form a solid adherent protective layer. The encapsulant can be any of the adhesives mentioned above. Furthermore, the encapsulant need not necessarily contact the chip. For instance, a glob-top coating can be deposited on the chip after mechanically attaching the chip to the routing line, and then the encapsulant can be formed on the glob-top coating. Moreover, the encapsulant need not necessarily contact the metal base, the routing line or the insulative base. For instance, a solder mask can be deposited on the metal base and the routing line, then the chip can be mechanically attached to the routing line, and then the encapsulant can be formed on the chip and the solder mask.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wis. are suitable.

The insulative base can be deposited in numerous manners, including printing and transfer molding. Furthermore, the insulative base can be deposited on and contact the pillar, the routing line, the adhesive and the encapsulant as a gel without contacting the ground plane, then contact the ground plane before the pillar is inserted into the opening in the ground plane and then be hardened after the pillar is inserted into the opening in the ground plane, or alternatively, the insulative base can be deposited on and contact the pillar, the routing line, the adhesive, the encapsulant and the ground plane as a gel after the pillar is inserted into the opening in the ground plane and then be hardened.

The insulative base can be thinned to increase exposure of the pillar using a wide variety of techniques including grinding (including mechanical polishing and chemical-mechanical polishing), blanket laser ablation and blanket plasma etching. Likewise, the insulative base can have a selected portion removed to increase exposure of the pillar using a wide variety of techniques including selective laser ablation, selective plasma etching and photolithography.

The insulative base can be laterally aligned with the pillar by grinding the insulative base without grinding the pillar or the ground plane, and then grinding the insulative base and the pillar without grinding the ground plane (if the pillar extends through and protrudes from the ground plane before the grinding occurs), or alternatively, by grinding the insulative base without grinding the pillar or the ground plane, then grinding the insulative base and the ground plane without grinding the pillar, and then grinding the insulative base, the pillar and the ground plane (if the pillar extends into but not through and is recessed relative to the ground plane before the grinding occurs).

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

The conductive trace can function as a power, ground or signal trace depending on the purpose of the associated chip pad.

The conductive trace can include a single pillar that is inserted into the opening in the ground plane, or multiple pillars of which a single pillar is inserted into the opening in the ground plane and the other pillars are not inserted into openings in the ground plane, or multiple pillars that are inserted into multiple openings in the ground plane and electrically connected to the ground plane by multiple solder joints. Furthermore, any pillar that is inserted into an opening in the ground plane can be disposed within or outside the periphery of the chip. For instance, the conductive trace can include a single pillar that is inserted into the opening in the ground plane and disposed within or outside the periphery of the chip, or the conductive trace can include multiple pillars that are inserted into multiple openings in the ground plane and electrically connected to the ground plane by multiple solder joints and any combination of these pillars can be disposed within or outside the periphery of the chip.

The conductive trace can include a vertically protruding ball, pillar, columnar post, bumped terminal or contact terminal that extends vertically beyond the routing line. A pillar is particularly well-suited for reducing thermal mismatch related stress in the next level assembly, and a bumped terminal is particularly well-suited for providing vertical compliance in the next level assembly. Further details regarding conductive traces with various pillars, bumped terminals and contact terminals are set forth in U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip," U.S. application Ser. No. 09/997,973 filed Nov. 29, 2001 by Charles W. C. Lin et al. entitled "Method of Connecting a Bumped Conductive Trace to a Semiconductor Chip," U.S. application Ser. No. 10/156,277 filed May 28, 2002 by Charles W. C. Lin entitled "Method of Making a Pillar in a Laminated Structure for a Semiconductor Chip Assembly," U.S. application Ser. No. 10/156,469 filed May 28, 2002 by Charles W. C. Lin et al. entitled "Method of Making a Bumped Terminal in a Laminated Structure for a Semiconductor Chip Assembly," U.S. application Ser. No. 10/165,483 filed Jun. 6, 2002 by Charles W. C. Lin et al. entitled "Method of Making a Contact Terminal with a Plated Metal Peripheral Sidewall Portion for a Semiconductor Chip Assembly," U.S. application Ser. No. 10/188,459 filed Jul. 3, 2002 by Charles W. C. Lin et al. entitled "Method of Connecting a Conductive Trace and an Insulative Base to a Semiconductor Chip using Multiple Etch Steps," U.S. application Ser. No. 10/356,372 filed Feb. 1, 2003 by Charles W. C. Lin et al. entitled "Method of Connecting a Conductive Trace and an Insulative Base to a Semiconductor Chip using Multiple Etch Steps," U.S. application Ser. No. 10/356,800 filed Feb. 1, 2003 by Charles W. C. Lin et al. entitled "Method of Connecting an Additively and Subtractively Formed Conductive Trace and an Insulative Base to a Semiconductor Chip," U.S. application Ser. No. 10/403,736 filed Mar. 31, 2003 by Charles W. C. Lin et al. entitled "Method of Making a Semiconductor Chip Assembly with Simultaneously Formed Interconnect and Connection Joint," and U.S. application Ser. No. 10/714,794 filed Nov. 17, 2003 by Chuen Rong Leu et al. entitled "Semiconductor Chip Assembly with Embedded Metal Pillar" which are incorporated by reference.

After the conductive trace is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material for the solder joint can be deposited on the pillar and the ground plane by plating or printing or placement techniques.

A soldering material for the solder ball can be deposited on the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

The solder joint and the solder balls can be reflowed simultaneously or in sequence. For instance, the solder joint and the solder balls can be a low temperature solder and be reflowed simultaneously. Alternatively, the solder joint can be a high temperature solder, the solder balls can be a low temperature solder, the solder joint can be reflowed at the high temperature, and then the solder balls can be deposited on the structure and reflowed at the low temperature without reflowing the solder joint. A typical low temperature solder is 63% Sn, 37% Pb with a melting point of 183° C., and a typical high temperature solder is 5% Sn, 95% Pb with a melting point of 312° C.

It is understood that, in the context of the present invention, forming a solder joint that electrically connects the pillar and the ground plane means that the solder joint electrically connects the pillar and the ground plane. This is true regardless of whether the pillar contacts and is electrically connected to the ground plane before the solder joint is formed. This is also true regardless of whether the solder paste which is reflowed to form the solder joint electrically connects the pillar and the ground plane. This is also true regardless of whether the conductive trace includes multiple pillars that are inserted into multiple openings in the ground plane and electrically connected to the ground plane by multiple solder joints. This is also true regardless of whether another conductive trace electrically connected to another ground pad includes another pillar and the pillars are electrically connected to the ground plane. This is also true regardless of whether the connection joint that contacts and electrically connects the conductive trace and the pad includes or requires a passive component such as a capacitor or a resistor. This is also true regardless of whether the electrically conductive path between the ground plane and the pad includes or requires a passive component such as a capacitor or a resistor. This is also true regardless of whether the metal coating or another conductor contacts and is electrically connected to the solder joint and the ground plane.

It is also understood that, in the context of the present invention, increasing exposure of the pillar means that more of the pillar is exposed. This is true regardless of whether the pillar was previously exposed. For instance, removing a portion of the insulative base, thereby increasing exposure of the pillar, does not require, unless otherwise stated, that the pillar be exposed before the portion of the insulative base is removed. Instead, this allows the insulative base to cover the pillar (in which case the pillar is unexposed) or cover a portion of the pillar without covering another portion of the pillar (in which case the pillar is exposed) before the portion of the insulative base is removed. In either case, removing the portion of the insulative base exposes more of the pillar.

The "upward" and "downward" vertical directions do not depend on the orientation of the assembly, as will be readily apparent to those skilled in the art. For instance, the pillar tapers inwardly and extends vertically beyond the routing line in the "downward" direction, regardless of whether the assembly is inverted and/or mounted on a printed circuit board. Likewise, the routing line extends "laterally" from the pillar regardless of whether the assembly is inverted, rotated or slated. Thus, the "upward" and "downward" directions are opposite one another and orthogonal to the "lateral" direction. Moreover, the encapsulant and the chip are shown above the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly can be manufactured individually. Alternatively, numerous assemblies can be simultaneously batch manufactured using a single metal base, a single encapsulant and a single insulative base and then separated from one another. For example, the routing lines and etch masks for multiple assemblies can be electroplated on the metal base, then separate spaced adhesives for the respective assemblies can be selectively deposited on the metal base, then the chips can be placed on the corresponding adhesives, then the adhesives can be simultaneously hardened, then the connection joints for the respective assemblies can be formed, then the encapsulant can be deposited on the metal base, the routing lines, the connection joints, the chips and the adhesives, then the metal base can be etched to simultaneously form the pillars, then the insulative base can be deposited on the pillars, the routing lines, the adhesives and the encapsulant as a gel, then separate spaced ground planes can be placed on the respective assemblies, then the insulative base can be hardened, grinded and ablated, then the solder paste can be printed into the openings in the ground planes, then the solder balls can be deposited on the respective assemblies, then the solder joints and solder balls can be simultaneously reflowed on the respective assemblies, and then the encapsulant and the insulative base can be cut, thereby separating the individual assemblies from one another.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

Advantageously, the semiconductor chip assembly of the present invention is reliable and inexpensive. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace after the pillar is formed. The mode of the connection can shift from the initial mechanical coupling to metallurgical coupling to assure sufficient metallurgical bond strength. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. The tapered pillar is particularly well-suited for reducing thermal mismatch related stress in the next level assembly and yields enhanced reliability for the next level assembly that exceeds that of conventional BGA packages. Furthermore, the ground plane can be mechanically and electrically coupled to the pillar conveniently and cost-effectively using the solder joint. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of making a semiconductor chip assembly, comprising:

providing a semiconductor chip that includes a conductive pad;

electrically connecting a conductive trace to the pad; then inserting the conductive trace into an opening in a ground plane; and then forming a solder joint that electrically connects the conductive trace and the ground plane, wherein an electrically conductive path between the ground plane and the pad includes the conductive trace and the solder joint.

2. The method of claim 1, wherein the chip is proximate to the ground plane.

3. The method of claim 1, wherein the chip is within a periphery of the ground plane.

4. The method of claim 1, wherein the chip includes first and second opposing major surfaces, the ground plane includes first and second opposing major surfaces, and the first and second surfaces of the chip are essentially parallel to the first and second surfaces of the ground plane.

5. The method of claim 1, wherein the conductive trace includes a pillar and a routing line, the pillar extends vertically from the routing line and into the opening, and the routing line extends laterally from the pillar and is spaced from the ground plane.

6. The method of claim 1, wherein the opening extends only through the ground plane.

7. The method of claim 1, including providing an encapsulant that contacts and covers the chip, covers the routing line and is spaced from the ground plane.

8. The method of claim 1, including providing an insulative base that contacts the conductive trace and the ground plane and is spaced from the chip.

9. The method of claim 1, wherein the assembly is devoid of a printed circuit board.

10. The method of claim 1, wherein the assembly is a first-level package.

11. A method of making a semiconductor chip assembly, comprising:
providing a semiconductor chip that includes first and second opposing major surfaces, wherein the first surface of the chip includes a conductive pad;
providing a conductive trace that includes a pillar and a routing line, wherein the pillar is adjacent to and extends vertically from the routing line, and the routing line is adjacent to and extends laterally from the pillar;
electrically connecting the routing line to the pad; then
inserting the pillar into an opening in a ground plane that includes first and second opposing major surfaces and the opening therebetween; and then
forming a solder joint that electrically connects the pillar and the ground plane, wherein the first and second surfaces of the chip are essentially parallel to the first and second surfaces of the ground plane, the routing line is spaced from the ground plane, and an electrically conductive path between the ground plane and the pad includes the pillar, the routing line and the solder joint.

12. The method of claim 11, wherein the chip is proximate to and within a periphery of the ground plane.

13. The method of claim 11, wherein the pillar has a conical shape in which its diameter decreases as it extends vertically from the routing line, and the routing line is an essentially flat planar lead.

14. The method of claim 11, wherein the pillar and the routing line contact one another, are metallurgically bonded to one another and are not integral with one another.

15. The method of claim 11, wherein the opening extends only through the ground plane.

16. The method of claim 11, wherein the pillar, the solder joint and the opening are disposed within a periphery of the chip.

17. The method of claim 11, wherein the ground plane is a single-piece metal plate.

18. The method of claim 11, wherein the electrically conductive path requires the pillar, the routing line and the solder joint.

19. The method of claim 11, including providing an encapsulant that contacts and covers the chip and covers the routing line, then depositing an insulative base over the pillar and the routing line, then inserting the pillar and the insulative base into the opening, then hardening the insulative base, then removing a portion of the insulative base, thereby increasing exposure of the pillar, and then forming the solder joint.

20. The method of claim 11, wherein the assembly is a first-level package.

21. A method of making a semiconductor chip assembly, comprising:
providing a semiconductor chip that includes first and second opposing major surfaces, wherein the first surface of the chip includes a conductive pad;
providing a conductive trace that includes a pillar and a routing line, wherein the pillar is adjacent to and extends vertically from the routing line and has a diameter that decreases as it extends vertically from the routing line, the routing line is adjacent to and extends laterally from the pillar and is an essentially flat planar lead, and the pillar and the routing line contact one another, are metallurgically bonded to one another and are not integral with one another;
electrically connecting the routing line to the pad; then
inserting the pillar into an opening in a ground plane that includes first and second opposing major surfaces and the opening therebetween; and then
forming a solder joint that electrically connects the pillar and the ground plane, wherein the first and second surfaces of the chip are essentially parallel to the first and second surfaces of the ground plane, the routing line is spaced from the ground plane, and an electrically conductive path between the ground plane and the pad includes the pillar, the routing line and the solder joint.

22. The method of claim 21, wherein the chip is proximate to and within a periphery of the ground plane.

23. The method of claim 21, wherein the conductive trace is disposed vertically beyond the chip, and the ground plane is disposed vertically beyond the chip, the routing line and the connection joint.

24. The method of claim 21, wherein the pillar has a conical shape in which its diameter decreases as it extends vertically from the routing line, and the routing line is an essentially flat planar lead.

25. The method of claim 21, wherein the opening extends only through the ground plane.

26. The method of claim 21, wherein the pillar, the solder joint and the opening are disposed within a periphery of the chip.

27. The method of claim 21, wherein the ground plane is a single-piece metal plate.

28. The method of claim 21, wherein the electrically conductive path requires the pillar, the routing line and the solder joint.

29. The method of claim 21, including providing an encapsulant that contacts and covers the chip and covers the routing line, then depositing an insulative base over the pillar and the routing line, then inserting the pillar and the insulative base into the opening, then hardening the insulative base, then removing a portion of the insulative base, thereby increasing exposure of the pillar, and then forming the solder joint.

30. The method of claim 21, wherein the assembly is a first-level package.

31. A method of making a semiconductor chip assembly, comprising:
forming a routing line;
mechanically attaching a semiconductor chip to the routing line, wherein the chip includes a conductive pad;
electrically connecting the routing line to the pad;

forming a pillar that contacts the routing line; then inserting the pillar into an opening in a ground plane; and then forming a solder joint that electrically connects the pillar and the ground plane, wherein an electrically conductive path between the ground plane and the pad includes the pillar, the routing line and the solder joint.

32. The method of claim 31, wherein forming the routing line includes selectively depositing the routing line on a metal base, and forming the pillar includes etching the metal base.

33. The method of claim 32, wherein forming the routing line includes:

providing a plating mask on the metal base, wherein the plating mask includes an opening that exposes a portion of the metal base; and then electroplating a metal line on the exposed portion of the metal base through the opening in the plating mask, wherein the routing line includes the metal line.

34. The method of claim 32, wherein etching the metal base removes a first portion of the metal base that contacts the routing line without removing a second portion of the metal base that contacts the routing line, thereby reducing but not eliminating contact area between the metal base and the routing line.

35. The method of claim 32, wherein etching the metal base removes most of the metal base and electrically isolates the routing line from other routing lines that contact the metal base.

36. The method of claim 31, wherein the opening extends only through the ground plane.

37. The method of claim 31, including mechanically attaching the chip to the routing line before forming the pillar.

38. The method of claim 31, including forming an encapsulant that contacts and covers the chip after mechanically attaching the chip to the routing line and before forming the pillar.

39. The method of claim 31, including depositing an insulative base over the pillar and the routing line after mechanically attaching the chip to the routing line, then inserting the pillar and the insulative base into the opening, then hardening the insulative base, then removing a portion of the insulative base, thereby increasing exposure of the pillar, and then forming the solder joint.

40. The method of claim 31, wherein the assembly is a first-level package.

41. A method of making a semiconductor chip assembly, comprising:

providing a metal base;

forming a routing line on the metal base;

mechanically attaching a semiconductor chip to the routing line, wherein the chip includes a conductive pad;

electrically connecting the routing line to the pad;

etching the metal base, wherein an unetched portion of the metal base forms a pillar that contacts the routing line; then inserting the pillar into an opening in a ground plane; and then forming a solder joint that electrically connects the pillar and the ground plane, wherein an electrically conductive path between the ground plane and the pad includes the pillar, the routing line and the solder joint.

42. The method of claim 41, wherein forming the routing line includes selectively depositing the routing line on the metal base.

43. The method of claim 41, wherein etching the metal base removes a first portion of the metal base that contacts the routing line without removing a second portion of the metal base that contacts the routing line, thereby reducing but not eliminating contact area between the metal base and the routing line.

44. The method of claim 41, wherein etching the metal base removes most of the metal base and electrically isolates the routing line from other routing lines that contact the metal base.

45. The method of claim 41, wherein forming the solder joint includes depositing solder paste on the pillar and the ground plane, and then hardening the solder paste into the solder joint.

46. The method of claim 41, wherein the opening extends only through the ground plane.

47. The method of claim 41, including mechanically attaching the chip to the routing line before forming the pillar.

48. The method of claim 41, including forming an encapsulant that contacts and covers the chip after mechanically attaching the chip to the routing line and before forming the pillar.

49. The method of claim 41, including depositing an insulative base over the pillar and the routing line after mechanically attaching the chip to the routing line, then inserting the pillar and the insulative base into the opening, then hardening the insulative base, then removing a portion of the insulative base, thereby increasing exposure of the pillar, and then forming the solder joint.

50. The method of claim 41, wherein the assembly is a first-level package.

51. A method of making a semiconductor chip assembly, comprising:

providing a metal base with first and second opposing surfaces, wherein a routing line is formed on the first surface of the metal base and an etch mask is formed on the second surface of the metal base;

mechanically attaching a semiconductor chip to the routing line, wherein the chip includes a conductive pad;

electrically connecting the routing line to the pad;

etching the metal base, wherein an unetched portion of the metal base defined by the etch mask forms a pillar that contacts the routing line; then inserting the pillar into an opening in a ground plane; and then forming a solder joint that electrically connects the pillar and the ground plane, wherein an electrically conductive path between the ground plane and the pad includes the pillar, the routing line and the solder joint.

52. The method of claim 51, wherein forming the routing line includes selectively depositing the routing line on the metal base.

53. The method of claim 51, wherein forming the metal base, the routing line and the etch mask includes the following steps in the sequence set forth:

providing a metal plate with first and second opposing surfaces;

providing a first plating mask on the second surface of the metal plate, wherein the first plating mask includes an opening that exposes a portion of the second surface of the metal plate;

simultaneously electroplating a metal layer on the first surface of the metal plate and the etch mask on the exposed portion of the second surface of the metal plate through the opening in the first plating mask, wherein the metal base includes the metal layer and the metal plate, the metal base includes first and second opposing major surfaces, the metal layer provides the first surface of the metal base, and the metal plate provides the second surface of the metal base;

removing the first plating mask;

providing a second plating mask on the first surface of metal base and a third plating mask on the second surface of the metal base and the etch mask, wherein the second plating mask includes an opening that exposes a portion of the first surface of the metal base, and the third plating mask covers the etch mask;

electroplating a metal line on the exposed portion of the first surface of the metal base through the opening in the third plating mask, wherein the routing line includes the metal line; and removing the second and third plating masks.

54. The method of claim 51, wherein etching the metal base removes a first portion of the metal base that contacts the routing line without removing a second portion of the metal base that contacts the routing line, thereby reducing but not eliminating contact area between the metal base and the routing line.

55. The method of claim 51, wherein etching the metal base removes most of the metal base and electrically isolates the routing line from other routing lines that contact the metal base.

56. The method of claim 51, wherein forming the solder joint includes depositing solder paste on the pillar and the ground plane, and then hardening the solder paste into the solder joint.

57. The method of claim 51, wherein the opening extends only through the ground plane.

58. The method of claim 51, including forming an encapsulant that contacts and covers the chip after mechanically attaching the chip to the routing line and before forming the pillar.

59. The method of claim 51, including depositing an insulative base over the pillar and the routing line after mechanically attaching the chip to the routing line, then inserting the pillar and the insulative base into the opening, then hardening the insulative base, then removing a portion of the insulative base, thereby increasing exposure of the pillar, and then forming the solder joint.

60. The method of claim 51, wherein the assembly is a first-level package.

61. A method of making a semiconductor chip assembly, comprising:

providing a metal base;

forming a routing line on the metal base;

mechanically attaching a semiconductor chip to the routing line, wherein the chip includes a conductive pad;

electrically connecting the routing line to the pad;

etching the metal base, wherein an unetched portion of the metal base forms a pillar that contacts the routing line; then inserting the pillar into an opening in a ground plane; and then forming a solder joint that electrically connects the pillar and the ground plane, wherein an electrically conductive path between the ground plane and the pad requires the pillar, the routing line and the solder joint.

62. The method of claim 61, wherein forming the routing line includes selectively depositing the routing line on the metal base.

63. The method of claim 61, wherein etching the metal base removes a first portion of the metal base that contacts the routing line without removing a second portion of the metal base that contacts the routing line, thereby reducing but not eliminating contact area between the metal base and the routing line.

64. The method of claim 61, wherein etching the metal base removes most of the metal base and electrically isolates the routing line from other routing lines that contact the metal base.

65. The method of claim 61, wherein forming the solder joint includes depositing solder paste on the pillar and the ground plane, and then hardening the solder paste into the solder joint.

66. The method of claim 61, wherein the opening extends only through the ground plane.

67. The method of claim 61, including mechanically attaching the chip to the routing line before forming the pillar.

68. The method of claim 61, including forming an encapsulant that contacts and covers the chip after mechanically attaching the chip to the routing line and before forming the pillar.

69. The method of claim 61, including depositing an insulative base over the pillar and the routing line after mechanically attaching the chip to the routing line, then inserting the pillar and the insulative base into the opening, then hardening the insulative base, then removing a portion of the insulative base, thereby increasing exposure of the pillar, and then forming the solder joint.

70. The method of claim 61, wherein the assembly is a first-level package.

71. A method of making a semiconductor chip assembly, comprising:

providing a metal base;

forming a routing line on the metal base;

mechanically attaching a semiconductor chip to the routing line, wherein the chip includes a conductive pad;

electrically connecting the routing line to the pad;

etching the metal base, thereby reducing but not eliminating contact area between the metal base and the routing line, exposing the routing line and electrically isolating the routing line from other routing lines that contact the metal base, wherein an unetched portion of the metal base forms a pillar that contacts the routing line; then inserting the pillar into an opening in a ground plane; and then forming a solder joint that electrically connects the pillar and the ground plane, wherein an electrically conductive path between the ground plane and the pad includes, the pillar, the routing line and the solder joint.

72. The method of claim 71, wherein forming the routing line includes selectively depositing the routing line on the metal base.

73. The method of claim 71, wherein forming the routing line includes:

providing a plating mask on the metal base, wherein the plating mask includes an opening that exposes a portion of the metal base;

electroplating a metal line on the exposed portion of the metal base through the opening in the plating mask, wherein the routing line includes the metal line; and then removing the plating mask.

74. The method of claim 71, wherein etching the metal base removes most of the metal base.

75. The method of claim 71, wherein forming the solder joint includes depositing solder paste on the pillar and the ground plane, and then hardening the solder paste into the solder joint.

76. The method of claim 71, wherein the opening extends only through the ground plane.

77. The method of claim 71, including mechanically attaching the chip to the routing line before forming the pillar.

78. The method of claim 71, including forming an encapsulant that contacts and covers the chip after mechanically attaching the chip to the routing line and before forming the pillar.

79. The method of claim 71, including depositing an insulative base over the pillar and the routing line after mechanically attaching the chip to the routing line, then inserting the pillar and the insulative base into the opening, then hardening the insulative base, then removing a portion of the insulative base, thereby increasing exposure of the pillar, and then forming the solder joint.

80. The method of claim 71, wherein the assembly is a first-level package.

81. A method of making a semiconductor chip assembly, comprising:
providing a metal base;
forming a routing line on the metal base;
mechanically attaching a semiconductor chip to the routing line, wherein the chip includes a conductive pad;
electrically connecting the routing line to the pad;
etching the metal base, wherein an unetched portion of the metal base forms a pillar that contacts the routing line; then
inserting the pillar into an opening in a ground plane, wherein the opening extends only through the ground plane; and then
forming a solder joint that electrically connects the pillar and the ground plane, wherein an electrically conductive path between the ground plane and the pad includes the pillar, the routing line and the solder joint.

82. The method of claim 81, wherein forming the routing line includes selectively depositing the routing line on the metal base.

83. The method of claim 81, wherein forming the routing line includes:
providing a plating mask on the metal base, wherein the plating mask includes an opening that exposes a portion of the metal base;
electroplating a metal line on the exposed portion of the metal base through the opening in the plating mask, wherein the routing line includes the metal line; and then
removing the plating mask.

84. The method of claim 81, wherein etching the metal base removes a first portion of the metal base that contacts the routing line without removing a second portion of the metal base that contacts the routing line, thereby reducing but not eliminating contact area between the metal base and the routing line.

85. The method of claim 81, wherein etching the metal base removes most of the metal base and electrically isolates the routing line from other routing lines that contact the metal base.

86. The method of claim 81, wherein forming the solder joint includes depositing solder paste on the pillar and the ground plane, and then hardening the solder paste into the solder joint.

87. The method of claim 81, including mechanically attaching the chip to the routing line before forming the pillar.

88. The method of claim 81, including forming an encapsulant that contacts and covers the chip after mechanically attaching the chip to the routing line and before forming the pillar.

89. The method of claim 81, including depositing an insulative base over the pillar and the routing line after mechanically attaching the chip to the routing line, then inserting the pillar and the insulative base into the opening, then hardening the insulative base, then removing a portion of the insulative base, thereby increasing exposure of the pillar, and then forming the solder joint.

90. The method of claim 81, wherein the assembly is a first-level package.

91. A method of making a semiconductor chip assembly, comprising: providing a metal base;
providing a metal base;
forming a routing line on the metal base;
mechanically attaching a semiconductor chip to the routing line, wherein the chip includes a conductive pad;
electrically connecting the routing line to the pad;
etching the metal base, wherein an unetched portion of the metal base forms a pillar that contacts the routing line; then
depositing an insulative base over the pillar and the routing line; then
inserting the pillar and the insulative base into an opening in a ground plane; then
hardening the insulative base, thereby transforming a loose unsecured relation between the pillar and the ground plane into a secure mechanical attachment between the pillar and the ground plane; and then
forming a solder joint that electrically connects the pillar and the ground plane, wherein an electrically conductive path between the ground plane and the pad includes the pillar, the routing line and the solder joint.

92. The method of claim 91, wherein forming the routing line includes selectively depositing the routing line on the metal base.

93. The method of claim 91, wherein forming the routing line includes:
providing a plating mask on the metal base, wherein the plating mask includes an opening that exposes a portion of the metal base;
electroplating a metal line on the exposed portion of the metal base through the opening in the plating mask, wherein the routing line includes the metal line; and then
removing the plating mask.

94. The method of claim 91, wherein etching the metal base removes a first portion of the metal base that contacts the routing line without removing a second portion of the metal base that contacts the routing line, thereby reducing but not eliminating contact area between the metal base and the routing line.

95. The method of claim 91, wherein etching the metal base removes most of the metal base and electrically isolates the routing line from other routing lines that contact the metal base.

96. The method of claim 91, wherein forming the solder joint includes depositing solder paste on the pillar and the ground plane, and then hardening the solder paste into the solder joint.

97. The method of claim 91, wherein the opening extends only through the ground plane.

98. The method of claim 91, including mechanically attaching the chip to the routing line before forming the pillar.

99. The method of claim 91, including forming an encapsulant that contacts and covers the chip after mechanically attaching the chip to the routing line and before forming the pillar.

100. The method of claim 91, wherein the assembly is a first-level package.

101. A method of making a semiconductor chip assembly, comprising:
providing a metal base;
forming a routing line on the metal base;
mechanically attaching a semiconductor chip to the routing line, wherein the chip includes a conductive pad;
electrically connecting the routing line to the pad;
etching the metal base, wherein an unetched portion of the metal base forms a pillar that contacts the routing line; then
depositing an insulative base over the pillar and the routing line; then
inserting the pillar and the insulative base into an opening in a ground plane; then
hardening the insulative base; then
removing a portion of the insulative base, thereby increasing exposure of the pillar; and then
forming a solder joint that electrically connects the pillar and the ground plane, wherein an electrically conductive path between the ground plane and the pad includes the pillar, the routing line and the solder joint.

102. The method of claim 101, wherein forming the routing line includes selectively depositing the routing line on the metal base.

103. The method of claim 101, wherein forming the routing line includes:
providing a plating mask on the metal base, wherein the plating mask includes an opening that exposes a portion of the metal base;
electroplating a metal line on the exposed portion of the metal base through the opening in the plating mask, wherein the routing line includes the metal line; and then
removing the plating mask.

104. The method of claim 101, wherein etching the metal base removes a first portion of the metal base that contacts the routing line without removing a second portion of the metal base that contacts the routing line, thereby reducing but not eliminating contact area between the metal base and the routing line.

105. The method of claim 101, wherein etching the metal base removes most of the metal base and electrically isolates the routing line from other routing lines that contact the metal base.

106. The method of claim 101, wherein forming the solder joint includes depositing solder paste on the pillar and the ground plane, and then hardening the solder paste into the solder joint.

107. The method of claim 101, wherein the opening extends only through the ground plane.

108. The method of claim 101, including mechanically attaching the chip to the routing line before forming the pillar.

109. The method of claim 101, including forming an encapsulant that contacts and covers the chip after mechanically attaching the chip to the routing line and before forming the pillar.

110. The method of claim 101, wherein the assembly is a first-level package.

111. A method of making a semiconductor chip assembly, comprising:
providing a metal base;
forming a routing line on the metal base;
mechanically attaching a semiconductor chip to the routing line, wherein the chip includes a conductive pad;
electrically connecting the routing line to the pad;
etching the metal base, wherein a first unetched portion of the metal base forms a first pillar that contacts the routing line, and a second unetched portion of the metal base forms a second pillar that contacts the routing line; then
inserting the first pillar into an opening in a ground plane; and then
forming a solder joint that electrically connects the first pillar and the ground plane, wherein an electrically conductive path between the ground plane and the pad includes the first pillar, the routing line and the solder joint, and the second pillar is electrically connected to the pad and is not in an electrically conductive path between the ground plane and the pad.

112. The method of claim 111, wherein forming the routing line includes selectively depositing the routing line on the metal base.

113. The method of claim 111, wherein etching the metal base removes a first portion of the metal base that contacts the routing line without removing second and third portions of the metal base that contact the routing line, thereby reducing but not eliminating contact area between the metal base and the routing line.

114. The method of claim 111, wherein etching the metal base removes most of the metal base and electrically isolates the routing line from other routing lines that contact the metal base.

115. The method of claim 111, wherein forming the solder joint includes depositing solder paste on the first pillar and the ground plane, and then hardening the solder paste into the solder joint.

116. The method of claim 111, wherein the opening extends only through the ground plane.

117. The method of claim 111, including mechanically attaching the chip to the routing line before forming the first and second pillars.

118. The method of claim 111, including forming an encapsulant that contacts and covers the chip after mechanically attaching the chip to the routing line and before forming the first and second pillars.

119. The method of claim 111, including depositing an insulative base over the first and second pillars and the routing line after mechanically attaching the chip to the routing line, then inserting the first pillar and the insulative base into the opening, then hardening the insulative base, then removing a portion of the insulative base, thereby increasing exposure of the first and second pillars, and then forming the solder joint.

120. The method of claim 111, wherein the assembly is a first-level package.

121. A method of making a semiconductor chip assembly, comprising:
providing a metal base;
forming first and second routing lines on the metal base;
mechanically attaching a semiconductor chip to the first and second routing lines, wherein the chip includes first and second conductive pads;

electrically connecting the first routing line to the first pad;

electrically connecting the second routing line to the second pad;

etching the metal base, wherein a first unetched portion of the metal base forms a first pillar that contacts the first routing line, and a second unetched portion of the metal base forms a second pillar that contacts the second routing line; then inserting the first pillar into an opening in a ground plane; and then forming a solder joint that electrically connects the first pillar and the ground plane, wherein an electrically conductive path between the ground plane and the pad includes the first pillar, the first routing line and the solder joint, and the second pillar and the second routing line are electrically connected to the second pad and electrically isolated from the ground plane.

122. The method of claim 121, wherein forming the first and second routing lines includes selectively depositing the first and second routing lines on the metal base.

123. The method of claim 121, wherein etching the metal base removes portions of the metal base that contact the first and second routing lines without removing other portions of the metal base that contact the first and second routing lines, thereby reducing but not eliminating contact area between the metal base and the first and second routing lines.

124. The method of claim 121, wherein etching the metal base removes most of the metal base and electrically isolates the first and second routing lines from one another.

125. The method of claim 121, wherein forming the solder joint includes depositing solder paste on the first pillar and the ground plane, and then hardening the solder paste into the solder joint.

126. The method of claim 121, wherein the opening extends only through the ground plane.

127. The method of claim 121, including mechanically attaching the chip to the first and second routing lines before forming the first and second pillars.

128. The method of claim 121, including forming an encapsulant that contacts and covers the chip after mechanically attaching the chip to the first and second routing lines and before forming the first and second pillars.

129. The method of claim 121, including depositing an insulative base over the first and second pillars and the first and second routing lines after mechanically attaching the chip to the first and second routing lines, then inserting the first pillar and the insulative base into the opening, then hardening the insulative base, then removing a portion of the insulative base, thereby increasing exposure of the first and second pillars, and then forming the solder joint.

130. The method of claim 121, wherein the assembly is a first-level package.

131. A method of making a semiconductor chip assembly, comprising:

providing a metal base;

forming first and second routing lines on the metal base;

mechanically attaching a first semiconductor chip to the first routing line, wherein the first chip includes a first conductive pad;

mechanically attaching a second semiconductor chip to the second routing line, wherein the second chip includes a second conductive pad;

electrically connecting the first routing line to the first pad;

electrically connecting the second routing line to the second pad;

etching the metal base, wherein a first unetched portion of the metal base forms a first pillar that contacts the first routing line, and a second unetched portion of the metal base forms a second pillar that contacts the second routing line; then inserting the first pillar into the first opening in a ground plane and the second pillar into a second opening in the ground plane; and then forming a first solder joint that electrically connects the first pillar and the ground plane and a second solder joint that electrically connects the second pillar and the ground plane, wherein a first electrically conductive path between the ground plane and the first pad includes the first pillar, the first routing line and the first solder joint and excludes the second pillar, the second routing line and the second solder joint, and a second electrically conductive path between the ground plane and the second pad includes the second pillar, the second routing line and the second solder joint and excludes the first pillar, the first routing line and the first solder joint.

132. The method of claim 131, wherein forming the first and second routing lines includes selectively depositing the first and second routing lines on the metal base.

133. The method of claim 131, wherein etching the metal base removes portions of the metal base that contact the first and second routing lines without removing other portions of the metal base that contact the first and second routing lines, thereby reducing but not eliminating contact area between the metal base and the first and second routing lines.

134. The method of claim 131, wherein etching the metal base removes most of the metal base and electrically isolates the first and second routing lines from one another.

135. The method of claim 131, wherein forming the first and second solder joints includes depositing a first solder paste on the first pillar and the ground plane and a second solder paste on the second pillar and the ground plane, and then hardening the first and second solder pastes into the first and second solder joints.

136. The method of claim 131, wherein the first and second openings extend only through the ground plane.

137. The method of claim 131, including mechanically attaching the first and second chips to the first and second routing lines before forming the first and second pillars.

138. The method of claim 131, including forming an encapsulant that contacts and covers the first and second chips after mechanically attaching the first and second chips to the first and second routing lines and before forming the first and second pillars.

139. The method of claim 131, including depositing an insulative base over the first and second pillars and the first and second routing lines after mechanically attaching the first and second chips to the first and second routing lines, then inserting the first pillar and the insulative base into the first opening and the second pillar and the insulative base into the second opening, then hardening the insulative base, then removing a portion of the insulative base, thereby increasing exposure of the first and second pillars, and then forming the first and second solder joints.

140. The method of claim 131, wherein the assembly is a first-level package.

141. A method of making a semiconductor chip assembly, comprising:

providing a metal base with first and second opposing major surfaces; then selectively depositing a routing line on the first surface of the metal base; then mechanically attaching a semiconductor chip to the metal base and the routing line, wherein the chip includes first and second opposing major surfaces, the first surface of the chip includes a conductive pad, the first surface of the metal base faces in a first direction and towards the chip, the second surface of the metal base faces in a second direction and away from the chip, and the first and second directions are opposite vertical directions; then forming an encapsulant that contacts and covers the chip and extends vertically beyond the chip, the metal base and the routing line in the first direction; then etching the metal base, thereby reducing but not eliminating contact area between the metal base and the routing line and exposing the routing line, wherein a first unetched portion of the metal base forms a first pillar that contacts the routing line and extends vertically from the routing line in the second direction, and a second unetched portion of the metal base forms a second pillar that contacts the routing line and extends vertically from the routing line in the second direction; then inserting the first pillar into an opening in a ground plane, wherein the ground plane includes first and second opposing major surfaces and the opening therebetween; and then forming a solder joint that electrically connects the first pillar and the ground plane, wherein the routing line is spaced from the ground plane, an electrically conductive path between the ground plane and the pad includes the first pillar, the routing line and the solder joint, and the second pillar is electrically connected to the pad and is not in an electrically conductive path between the ground plane and the pad.

142. The method of claim 141, wherein forming the routing line includes:
providing a plating mask on the metal base, wherein the plating mask includes an opening that exposes a portion of the metal base;
electroplating a metal line on the exposed portion of the metal base through the opening in the plating mask, wherein the routing line includes the metal line; and then
removing the plating mask.

143. The method of claim 141, wherein mechanically attaching the chip to the metal base and the routing line includes:
depositing an adhesive on the metal base; then
placing the chip on the adhesive; and then
hardening the adhesive.

144. The method of claim 141, wherein etching the metal base removes most of the metal base.

145. The method of claim 141, wherein forming the solder joint includes depositing solder paste on the first pillar and the ground plane, and then hardening the solder paste into the solder joint.

146. The method of claim 141, wherein the chip is proximate to and within a periphery of the ground plane.

147. The method of claim 141, wherein the first pillar is spaced from the ground plane.

148. The method of claim 141, wherein the first and second pillars and the routing line are disposed vertically beyond the chip in the second direction, the first and second pillars are disposed vertically beyond the encapsulant in the second direction, and the solder joint and the ground plane are disposed vertically beyond the chip, the encapsulant and the routing line in the second direction.

149. The method of claim 141, wherein the opening extends only through the ground plane.

150. The method of claim 141, wherein the first pillar, the solder joint and the opening and are disposed within a periphery of the chip.

151. The method of claim 150, wherein the second pillar is disposed outside the periphery of the chip.

152. The method of claim 141, wherein the first and second surfaces of the chip are essentially parallel to the first and second surfaces of the ground plane.

153. The method of claim 141, wherein the electrically conductive path requires the first pillar, the routing line and the solder joint.

154. The method of claim 141, including forming a connection joint that electrically connects the routing line and the pad before forming the first and second pillars.

155. The method of claim 154, wherein the connection joint is a wire bond.

156. The method of claim 141, including:
depositing an insulative base over the first and second pillars and the routing line; then
inserting the first pillar and the insulative base into the opening and contacting the insulative base and the ground plane; then
hardening the insulative base; and then
forming the solder joint.

157. The method of claim 156, including removing a portion of the insulative base, thereby increasing exposure of the first pillar, after hardening the insulative base and before forming the solder joint.

158. The method of claim 157, wherein removing the portion of the insulative base increases exposure of the second pillar.

159. The method of claim 157, wherein removing the portion of the insulative base includes grinding the insulative base.

160. The method of claim 141, wherein the assembly is a first-level package.

161. A method of making a semiconductor chip assembly, comprising:
providing a metal base with first and second opposing major surfaces; then
selectively depositing first and second routing lines on the first surface of the metal base, wherein the first and second routing lines are electrically connected to one another by the metal base; then
mechanically attaching a semiconductor chip to the metal base and the first and second routing lines, wherein the chip includes first and second opposing major surfaces, the first surface of the chip includes first and second conductive pads, the first surface of the metal base faces in a first direction and towards the chip, the second surface of the metal base faces in a second direction and away from the chip, and the first and second directions are opposite vertical directions; then
forming an encapsulant that contacts and covers the chip and extends vertically beyond the chip, the metal base and the first and second routing lines in the first direction; then
etching the metal base, thereby reducing but not eliminating contact area between the metal base and the first routing line, reducing but not eliminating contact area between the metal base and the second routing line, exposing the first and second routing lines and electrically isolating the first and second routing lines from one another, wherein a first unetched portion of the metal base forms a first pillar that contacts the first routing line and extends vertically from the first routing line in the second direction, and a second unetched portion of the metal base forms a second pillar that contacts the second routing line and extends vertically from the second routing line in the second direction; then insetting the first pillar into an opening in a ground plane, wherein the ground plane includes first and second opposing major surfaces and the opening therebetween; and then forming a solder joint that electrically connects the first pillar and the ground plane, wherein the first and second routing lines are spaced from the ground plane, an electrically conductive path between the ground plane and the pad includes the first pillar, the first routing line and the solder joint, and the second pillar and the second routing line are electrically connected to the second pad and electrically isolated from the ground plane.

162. The method of claim 161, wherein forming the first and second routing lines includes:
providing a plating mask on the metal base, wherein the plating mask includes first and second openings that expose first and second portions of the metal base;
electroplating first and second metal lines on the exposed first and second portions of the metal base through the first and second openings in the plating mask, wherein the first and second routing lines include the first and second metal lines; and then
removing the plating mask.

163. The method of claim 161, wherein mechanically attaching the chip to the metal base and the first and second routing lines includes:
depositing an adhesive on the metal base; then
placing the chip on the adhesive; and then
hardening the adhesive.

164. The method of claim 161, wherein etching the metal base removes most of the metal base.

165. The method of claim 161, wherein forming the solder joint includes depositing solder paste on the first pillar and the ground plane, and then hardening the solder paste into the solder joint.

166. The method of claim 161, wherein the chip is proximate to and within a periphery of the ground plane.

167. The method of claim 161, wherein the first pillar is spaced from the ground plane.

168. The method of claim 161, wherein the first and second pillars and the first and second routing lines are disposed vertically beyond the chip in the second direction, the first and second pillars are disposed vertically beyond the encapsulant in the second direction, and the solder joint and the ground plane are disposed vertically beyond the chip, the encapsulant and the first and second routing lines in the second direction.

169. The method of claim 161, wherein the opening extends only through the ground plane.

170. The method of claim 161, wherein the first pillar, the solder joint and the opening are disposed within a periphery of the chip.

171. The method of claim 170, wherein the second pillar is disposed outside the periphery of the chip.

172. The method of claim 161, wherein the first and second surfaces of the chip are essentially parallel to the first and second surfaces of the ground plane.

173. The method of claim 161, wherein the electrically conductive path requires the first pillar, the first routing line and the solder joint.

174. The method of claim 161, including:
forming a first connection joint that electrically connects the first routing line and the first pad before forming the first pillar; and
forming a second connection joint that electrically connects the second routing line and the second pad before forming the second pillar.

175. The method of claim 174, wherein the first and second connection joints are wire bonds.

176. The method of claim 161, including:
depositing an insulative base over the first and second pillars and the first and second routing lines; then
inserting the first pillar and the insulative base into the opening and contacting the insulative base and the ground plane; then
hardening the insulative base; and then
forming the solder joint.

177. The method of claim 176, including removing a portion of the insulative base, thereby increasing exposure of the first pillar, after hardening the insulative base and before forming the solder joint.

178. The method of claim 177, wherein removing the portion of the insulative base increases exposure of the second pillar.

179. The method of claim 177, wherein removing the portion of the insulative base includes grinding the insulative base.

180. The method of claim 161, wherein the assembly is a first-level package.

181. The method of claim 161, wherein forming the first and second solder joints includes depositing a first solder paste on the first pillar and the ground plane and a second solder paste on the second pillar and the ground plane, and then hardening the first and second solder pastes into the first and second solder joints.

182. A method of making a semiconductor chip assembly, comprising:
providing a metal base with first and second opposing major surfaces; then
selectively depositing first and second routing lines on the first surface of the metal base, wherein the first and second routing lines are electrically connected to one another by the metal base; then
mechanically attaching a first semiconductor chip to the metal base and the first routing line, wherein the first chip includes first and second opposing major surfaces, the first surface of the first chip includes a first conductive pad, the first surface of the metal base faces in a first direction and towards the first chip, the second surface of the metal base faces in a second direction and away from the first chip, and the first and second directions are opposite vertical directions;
mechanically attaching a second semiconductor chip to the metal base and the second routing line, wherein the second chip includes first and second opposing major surfaces, the first surface of the second chip includes a second conductive pad, the first surface of the metal base faces towards the second chip, and the second surface of the metal base faces away from the second chip; then
forming an encapsulant that contacts and covers the first and second chips and extends vertically beyond the first and second chips, the metal base and the first and second routing lines in the first direction; then
etching the metal base, thereby reducing but not eliminating contact area between the metal base and the first routing line, reducing but not eliminating contact area between the metal base and the second routing line, exposing the first and second routing lines and electrically isolating the first and second routing lines from one another, wherein a first unetched portion of the metal base forms a first pillar that contacts the first routing line and extends vertically from the first routing line in the second direction, and a second unetched portion of the metal base forms a second pillar that contacts the second routing line and extends vertically from the second routing line in the second direction; then inserting the first pillar into a first opening in a ground plane and the second pillar into a second opening in the ground plane, wherein the ground plane includes first and second opposing major surfaces and the openings therebetween; and then forming a first solder joint that electrically connects the first pillar and the ground plane and a second solder joint that electrically connects the second pillar and the ground plane, wherein the first and second routing lines are spaced from the ground plane, a first electrically conductive path between the ground plane and the first pad includes the first pillar, the first routing line and the first solder joint and excludes the second pillar, the second routing line and the second solder joint, and a second electrically conductive path between the ground plane and the second pad includes the second pillar, the second routing line and the second solder joint and excludes the first pillar, the first routing line and the first solder joint.

183. The method of claim 182, wherein forming the first and second routing lines includes:

providing a plating mask on the metal base, wherein the plating mask includes first and second openings that expose first and second portions of the metal base;

electroplating first and second metal lines on the exposed first and second portions of the metal base through the first and second openings in the plating mask, wherein the first and second routing lines include the first and second metal lines; and then removing the plating mask.

184. The method of claim 182, wherein mechanically attaching the first and second chips to the metal base and the first and second routing lines includes:

depositing first and second adhesives on the metal base; then placing the first chip on the first adhesive and the second chip on the second adhesive; and then hardening the first and second adhesives.

185. The method of claim 182, wherein etching the metal base removes most of the metal base.

186. The method of claim 182, wherein the first and second chips are proximate to and within a periphery of the ground plane.

187. The method of claim 182, wherein the first and second pillars are spaced from the ground plane.

188. The method of claim 182, wherein the first and second pillars and the first and second routing lines are disposed vertically beyond the first and second chips in the second direction, the first and second pillars are disposed vertically beyond the encapsulant in the second direction, and the first and second solder joints and the ground plane are disposed vertically beyond the first and second chips, the encapsulant and the first and second routing lines in the second direction.

189. The method of claim 182, wherein the first and second openings extend only through the ground plane.

190. The method of claim 182, wherein the first pillar, the first solder joint and the first opening are disposed within a periphery of the first chip.

191. The method of claim 190, wherein the second pillar, the second solder joint and the second opening are disposed within a periphery of the second chip.

192. The method of claim 182, wherein the first and second surfaces of the first and second chips are essentially parallel to the first and second surfaces of the ground plane.

193. The method of claim 182, wherein the first electrically conductive path requires the first pillar, the first routing line and the first solder joint, and the second electrically conductive path requires the second pillar, the second routing line and the second solder joint.

194. The method of claim 182, including:

forming a first connection joint that electrically connects the first routing line and the first pad before forming the first pillar; and forming a second connection joint that electrically connects the second routing line and the second pad before forming the second pillar.

195. The method of claim 194, wherein the first and second connection joints are wire bonds.

196. The method of claim 182, including:

depositing an insulative base over the first and second pillars and the first and second routing lines; then inserting the first pillar and the insulative base into the first opening, inserting the second pillar and the insulative base into the second opening and contacting the insulative base and the ground plane; then hardening the insulative base; and then forming the first and second solder joints.

197. The method of claim 196, including removing a portion of the insulative base, thereby increasing exposure of the first and second pillars, after hardening the insulative base and before forming the first and second solder joints.

198. The method of claim 197, wherein removing the portion of the insulative base increases exposure of a third pillar that is electrically connected to a third conductive pad of the first chip and electrically isolated from the ground plane and increases exposure of a fourth pillar that is electrically connected to a fourth conductive pad of the second chip and electrically isolated from the ground plane.

199. The method of claim 197, wherein removing the portion of the insulative base includes grinding the insulative base.

200. The method of claim 182, wherein the assembly is a first-level package.

* * * * *

UNITED STATES PATENT AND TRADEMARK OFFICE
CERTIFICATE OF CORRECTION

PATENT NO. : 7,087,466 B1
APPLICATION NO. : 10/896617
DATED : August 8, 2006
INVENTOR(S) : Charles W.C. Lin It is certified that error appears in the above-identified patent and that said Letters Patent is hereby corrected as shown below:

Column 60
Line 18, delete "providing a metal base;".

Column 68
Line 30, change "161" to -- 182 --.

Column 70
Lines 39-40, "forming the first and second solder joints" is a subparagraph.

Replace dreawing sheet 10 with the attached drawing sheet.

Signed and Sealed this

Twenty-first Day of November, 2006

JON W. DUDAS
*Director of the United States Patent and Trademark Office*